(12) United States Patent
Han et al.

(10) Patent No.: US 10,905,037 B2
(45) Date of Patent: Jan. 26, 2021

(54) ELECTRONIC DEVICE HAVING INTERFERENCE SHIELDING STRUCTURE

(71) Applicant: Samsung Electronics Co., Ltd., Suwon-si (KR)

(72) Inventors: Eunbong Han, Suwon-si (KR); Hyeonhyang Kim, Suwon-si (KR); Ohyun Beak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 16/222,232

(22) Filed: Dec. 17, 2018

(65) Prior Publication Data
US 2019/0191597 A1 Jun. 20, 2019

(30) Foreign Application Priority Data
Dec. 15, 2017 (KR) .................... 10-2017-0173038

(51) Int. Cl.
*H01Q 1/52* (2006.01)
*H01Q 1/22* (2006.01)
(Continued)

(52) U.S. Cl.
CPC ......... *H05K 9/0024* (2013.01); *H01L 23/552* (2013.01); *H01L 23/66* (2013.01); *H01Q 1/2283* (2013.01); *H01Q 1/526* (2013.01); *H01Q 3/08* (2013.01); *H01Q 21/0087* (2013.01); *H01Q 21/0093* (2013.01); *H01Q 21/065* (2013.01); *H05K 1/0218* (2013.01); *H05K 1/111* (2013.01);
(Continued)

(58) Field of Classification Search
CPC .... H01Q 1/2283; H01Q 1/526; H01Q 21/065; H01Q 21/0087; H01Q 3/08; H05K 9/0024; H05K 1/111; H05K 1/181; H05K 1/0218
See application file for complete search history.

(56) References Cited

U.S. PATENT DOCUMENTS 5,566,052 A * 10/1996 Hughes ................. H01L 23/367
174/354
6,154,176 A 11/2000 Fathy et al.
(Continued)

FOREIGN PATENT DOCUMENTS

CN 106410407 A 2/2017
JP 2002-135043 A 5/2002
(Continued)

OTHER PUBLICATIONS

International Search Report and Written Opinion dated Apr. 12, 2019, issued in an International application No. PCT/KR2018/016044.
(Continued)

*Primary Examiner* — Hoang V Nguyen
(74) *Attorney, Agent, or Firm* — Jefferson IP Law, LLP

(57) ABSTRACT

An electronic device including an electromagnetic shielding structure is provided. The electronic device includes a printed circuit board, an antenna module, and an electromagnetic wave shielding structure. The antenna module includes a radio frequency integrated circuit mounted on the printed circuit board, and an array antenna coupled to an upper portion of the radio frequency integrated circuit. The electromagnetic wave shielding structure surrounds a side portion of the antenna module.

20 Claims, 41 Drawing Sheets

(51) Int. Cl.
  *H05K 9/00* (2006.01)
  *H05K 1/02* (2006.01)
  *H05K 1/11* (2006.01)
  *H01Q 21/06* (2006.01)
  *H01L 23/66* (2006.01)
  *H01L 23/552* (2006.01)
  *H05K 1/18* (2006.01)
  *H01Q 3/08* (2006.01)
  *H01Q 21/00* (2006.01)
  *H05K 3/34* (2006.01)

(52) U.S. Cl.
  CPC ...... *H05K 1/181* (2013.01); *H01L 2223/6677* (2013.01); *H05K 3/341* (2013.01); *H05K 2201/10098* (2013.01); *H05K 2201/10378* (2013.01); *H05K 2201/10734* (2013.01); *H05K 2203/0126* (2013.01)

(56) References Cited

U.S. PATENT DOCUMENTS

| | | | |
|---|---|---|---|
| 7,907,417 | B2 | 3/2011 | Jandzio et al. |
| 9,179,538 | B2 | 11/2015 | Foster et al. |
| 9,472,859 | B2 | 10/2016 | Dang et al. |
| 9,583,825 | B2 | 2/2017 | Jung |
| 2008/0037238 | A1 | 2/2008 | Kimata et al. |
| 2009/0009399 | A1 | 1/2009 | Gaucher et al. |
| 2009/0200647 | A1* | 8/2009 | Mondal ............ H01L 23/5225 257/659 |
| 2012/0025356 | A1 | 2/2012 | Liao et al. |
| 2012/0280860 | A1* | 11/2012 | Kamgaing .......... H01Q 9/0414 342/368 |
| 2013/0015563 | A1 | 1/2013 | Lee et al. |
| 2013/0078915 | A1 | 3/2013 | Zhao et al. |
| 2016/0308287 | A1 | 10/2016 | Kamgaing et al. |
| 2017/0040266 | A1* | 2/2017 | Lin .................... H01L 23/5383 |

FOREIGN PATENT DOCUMENTS

| | | |
|---|---|---|
| JP | 2002-353842 A | 12/2002 |
| KR | 10-2013-0105151 A | 9/2013 |
| KR | 10-2015-0017179 A | 2/2015 |
| KR | 10-2015-0106201 B1 | 9/2015 |
| KR | 10-1581225 B1 | 12/2015 |

OTHER PUBLICATIONS

Extended European Search Report dated Oct. 1, 2020, issued in European Patent Application No. 18889761.5-1205.

* cited by examiner

FIG. 38A
FIG. 38B
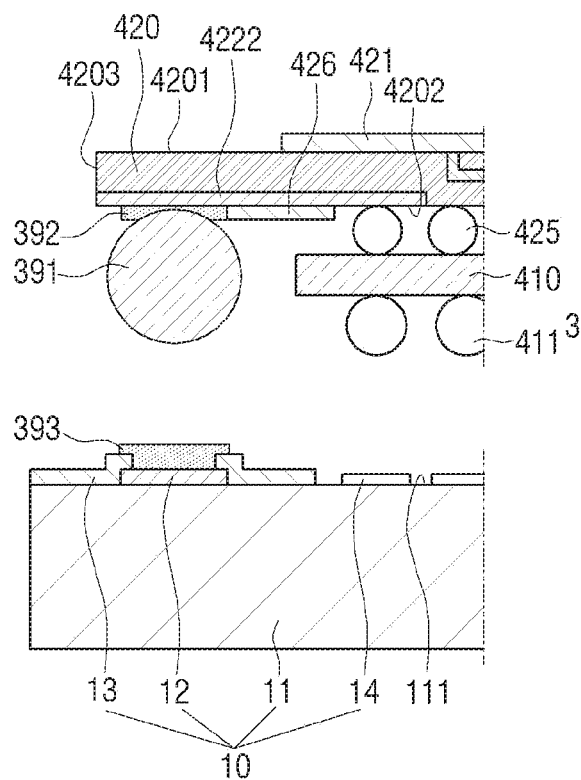
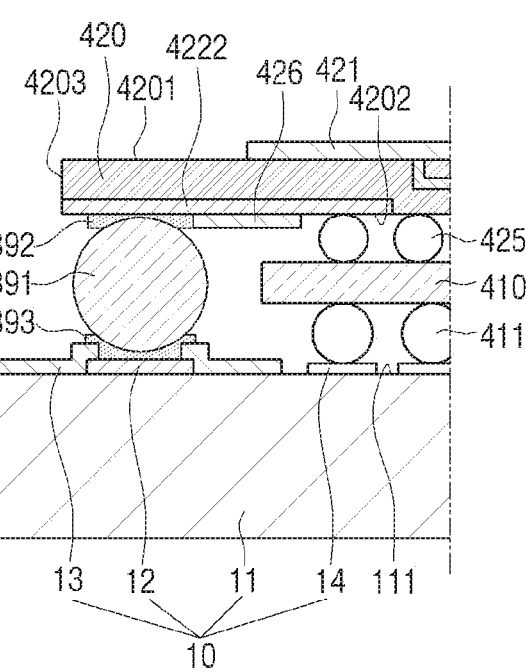

ELECTRONIC DEVICE HAVING INTERFERENCE SHIELDING STRUCTURE

CROSS-REFERENCE TO RELATED APPLICATION(S)

This application is based on and claims priority under 35 U.S.C. § 119 of a Korean patent application number 10-2017-0173038, filed on Dec. 15, 2017, in the Korean Intellectual Property Office, the disclosure of which is incorporated by reference herein in its entirety.

BACKGROUND

1. Field

The disclosure relates to an electronic device including electromagnetic interference shielding structure.

2. Description of Related Art

Recently, a demand for a portable electronic device such as a smartphone has been rapidly increasing in the electronic product market, and slimming and miniaturizing of electronic components mounted on portable devices have been in demand in a continuous manner. In order to realize the slimming and miniaturizing of the electronic components, a semiconductor packaging technique for integrating a plurality of individual circuit elements into one package, as well as a technique of reducing a size of an individual component have been required. To be specific, a semiconductor package involved in a high frequency signal is required to have various electromagnetic interference shielding structures for preventing electromagnetic wave interference and excellently embodying electromagnetic wave susceptibility characteristics as well as realizing miniaturization.

Recently, ultra-high speed data transmission technology utilizing ultra-high frequency bandwidth signals has been developed. When such an ultra-high frequency signal is applied to an antenna included in a portable electronic device, in order to shield the permittivity loss of an ultra-high frequency signal and noises generated in the inside and the outside of the portable electronic device, a more detailed electromagnetic shielding structure for the antenna is required.

To do this, the electromagnetic waves shielding structure includes a structure which covers not only antennas but also each element using a shield can in press-processed metal material.

However, in the structure of shielding the antenna through the shield can, a radiator of an antenna is exposed without being covered by the shield can for transmitting and receiving signals. In this case, there is a limitation that noise cannot but be generated due to a gap between the antenna and the shield can.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including electromagnetic waves shielding structure having improved shielding function for an antenna module and elements.

Another aspect of the disclosure is to provide an electronic device which includes a printed circuit board, an antenna module including a radio frequency integrated circuit mounted on the printed circuit board and an array antenna coupled to an upper portion of the radio frequency integrated circuit, and an electromagnetic wave shielding structure surrounding a side portion of the antenna module.

Additional aspects will be set forth in part in the description which follows and, in part, will be apparent from the description, or may be learned by practice of the presented embodiments.

The electromagnetic wave shielding structure may be attached to the printed circuit board to surround a space between the array antenna and the printed circuit board, and cover an edge portion of the array antenna.

The array antenna includes an antenna substrate coupled to an upper portion of the radio frequency integrated circuit, a plurality of radiators disposed on an upper surface of the antenna substrate, and a first ground pattern disposed on the upper surface of the antenna substrate along a circumference of the antenna substrate, wherein an upper end of the electromagnetic wave shielding structure may cover the first ground pattern.

In accordance with another aspect of the disclosure, a printed circuit board is provided. The printed circuit board may include a ground pad disposed on a side of the printed circuit board, and the radio frequency integrated circuit is mounted on the side of the printed circuit board, and a lower end of the electromagnetic wave shielding structure may be attached to the ground pad.

The first ground pattern includes a closed loop shape in which the plurality of radiators is disposed therein, wherein the ground pad includes a closed loop shape in which the radio frequency integrated circuit is disposed therein, and wherein an upper end and a lower end of the electromagnetic wave shielding structure include shapes respectively corresponding to a shape of the first ground pattern and a shape of the ground pad.

In accordance with another aspect of the disclosure, an antenna array is provided. The array antenna includes a second ground pattern disposed at a lower surface of the antenna portion along a circumference of the antenna substrate, wherein the antenna substrate may include at least one of a plurality of via holes connecting the first ground pattern and the second ground pattern or a plating part which is disposed at a side of the antenna substrate, and wherein the antenna substrate connects the first ground pattern and the second ground pattern.

In accordance with another aspect of the disclosure, an electromagnetic wave shielding structure is provided. The electromagnetic wave shielding structure includes a shield frame surrounding the side of the antenna substrate, an adhesive portion coupled to the ground pad for grounding and to which a lower end of the shield frame is attached, and a connection part connecting an upper end of the shield frame and the first ground pattern.

The connection part may include a conductive material having a predetermined viscosity to cover the first ground pattern.

The shield frame may be remotely disposed from the side of the antenna substrate, and the connection part may connect the shield frame and the plating part.

The adhesive portion may include a conductive material having a predetermined viscosity or viscosity of solder cream.

The shield frame may include a conductive metal.

The connection part may include a conductive tape which connects the shield frame and the first ground pattern.

The electromagnetic wave shielding structure may include a shielding dam dispensed on the ground pad, the shielding dam surrounds the side of the antenna substrate, and a connection part which connects an upper end of the shielding dam and the first ground pattern, wherein the shielding dam and the connection part may be made of a conductive material having a predetermined viscosity.

The electromagnetic wave shielding structure may include a shielding dam dispensed on the ground pad, the shielding dam surrounds the side of the antenna substrate, and wherein the electromagnetic wave shielding structure cover the first ground pattern.

The electromagnetic wave shielding structure may include an insulating dam dispensed on the ground pad, the insulating dam surrounds the side of the antenna substrate, an insulating member filled inside the insulating dam, and a shielding film composed of a conductive material that covers an outside of the insulating dam, the shielding dam connects the first ground pattern with the ground pad.

The electromagnetic wave shielding structure may include an insulating member filled between the printed circuit board and the antenna substrate, and a shielding film composed of a conductive material that covers an outside of the insulating member and connects the first ground pattern with the ground pad, wherein the insulating member may be injection-molded.

The electromagnetic wave shielding structure may include a conductive film which surrounds a side of the antenna substrate, wherein an upper end of the conductive film is bent and attached to the first ground pattern, and wherein a lower end of the conductive film is bent and attached to the ground pad.

The electromagnetic wave shielding structure may include a shielding dam which connects the array antenna and the printed circuit board to surround the radio frequency integrated circuit.

In accordance with another aspect of the disclosure, an array antenna is provided. The array antenna may include an antenna substrate coupled to an upper portion of the radio frequency integrated circuit, a plurality of radiators disposed on an upper surface of the antenna substrate, and a ground pattern disposed on a lower surface of the antenna substrate along an edge portion of the antenna substrate, wherein the printed circuit board may include a ground pad disposed on a side of the printed circuit board, wherein the radio frequency integrated circuit is mounted on the side of the printed circuit board, and wherein the shielding dam may include a plurality of shielding balls that connect the ground pattern with the ground pad.

In accordance with another aspect of the disclosure, an electronic device is provided. An electronic device includes a printed circuit board, an antenna module including a radio frequency integrated circuit mounted on the printed circuit board and an array antenna which is coupled to the radio frequency integrated circuit, and an electromagnetic wave shielding structure attached to the printed circuit board, the electromagnetic wave shielding structure surrounds an edge portion of the array antenna, wherein the array antenna may include an antenna substrate coupled to an upper portion of the radio frequency integrated circuit, a plurality of radiators disposed on an upper surface of the antenna substrate, and a first ground pattern and a second ground pattern which are disposed on each of an upper surface and a lower surface of the antenna substrate along a circumference of the antenna substrate, wherein the antenna substrate may include at least one of a plurality of via holes that connect the first ground pattern and the second ground pattern or a plating part disposed on a side of the antenna substrate, and the plating part connects the first ground pattern with the second ground pattern.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 38A and 38B are sectional views illustrating a manufacturing process of the electromagnetic wave shielding structure of FIG. 37 according to an embodiment of the disclosure.

Throughout the drawings, it should be noted that like reference numbers are used to depict the same or similar elements, features, and structures.

DETAILED DESCRIPTION

Figure 1:
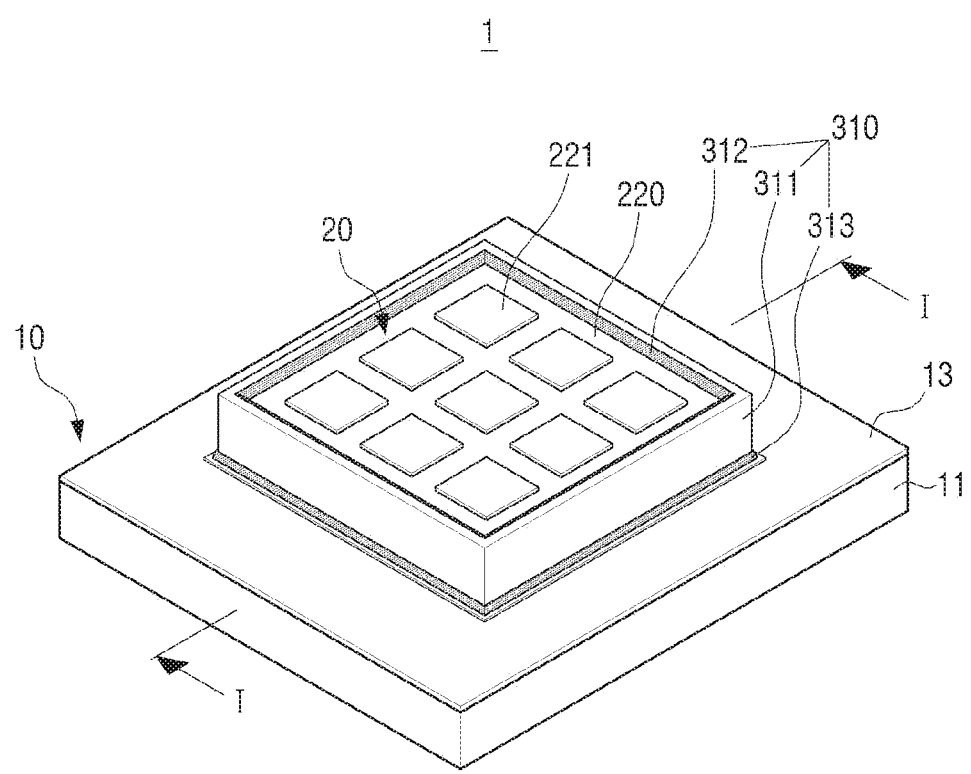
FIG. 1 is a perspective view illustrating an electromagnetic wave shielding structure of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It will be understood that when an element is referred to as being "on" or "connected to" another element, it can be directly connected to the other element or intervening elements may also be present. In contrast, when an element is referred to as being "directly on" or "directly connected to" another element, no intervening elements are present. Meanwhile, other expressions describing relationships between components such as "~between" and "directly adjacent to~" may be construed similarly.

The terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, without departing from the scope of the disclosure, the first component may be referred to as a second component, and similarly, the second component may also be referred to as a first component.

Singular forms in the disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms (including technical and scientific terms) used herein have the same meaning as commonly understood by one of ordinary skill in the art to which this disclosure belongs.

An electromagnetic interference shielding structure according to embodiments of the disclosure could be applied various electronic devices such as a display device, a wearable device, etc. It is described that the electromagnetic interference shielding structure according to embodiment of the disclosure shields an antenna module, but is not limited thereto and it can be formed to shield various types of plurality of elements or a single circuit element only.

Hereinafter, an electromagnetic interference shielding structure according to an embodiment of the disclosure will be described in detail with reference to drawings.

FIG. 1 is a perspective view illustrating an electromagnetic wave shielding structure 310 of an electronic device 1 according to an embodiment of the disclosure.

Figure 2:
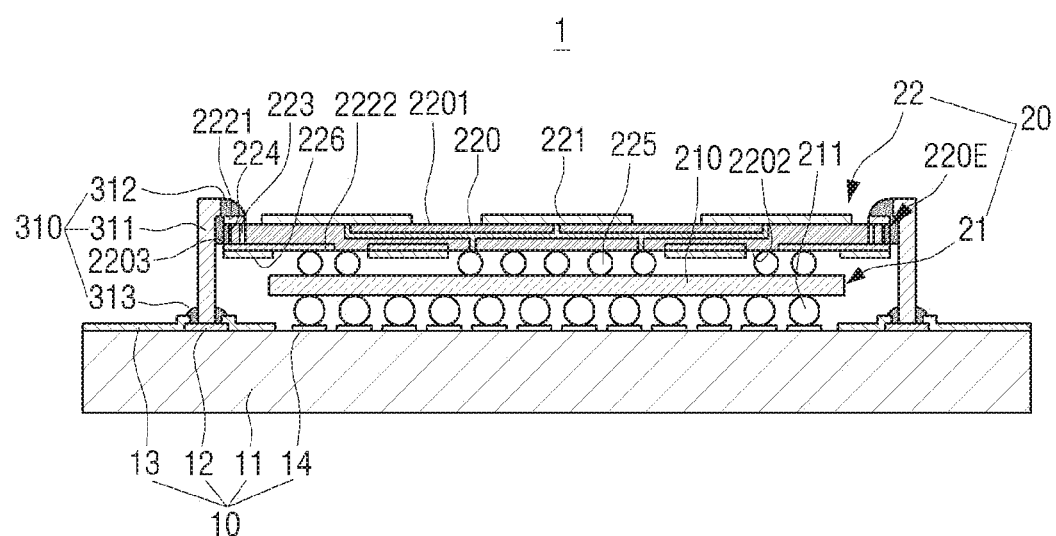
FIG. 2 is a sectional view of an electronic device which is cut along I-I line as illustrated in FIG. 1 according to an embodiment of the disclosure.

FIG. 2 is a sectional view of an electronic device 1 which is cut along I-I line as illustrated in FIG. 1 according to an embodiment of the disclosure.

With reference to FIGS. 1 and 2, the electronic apparatus 1 includes a printed circuit board 10, an antenna module 20 mounted on the printed circuit board 10, and an electromagnetic wave shielding structure 310 surrounding a side portion of the antenna module 20.

For convenience of description, the electronic device 1 shown in the drawing shows only a part of the printed circuit board 10 disposed inside the electronic device 1 and to which the antenna module 20 is coupled.

As described above, the electronic device may be various electronic devices such as a smartphone.

In one side of the printed circuit board 10, the antenna module 20 is mounted, and as illustrated in FIGS. 1 and 2, the antenna module 20 may be mounted on an upper surface of the printed circuit board 10.

The description of the upper and lower parts of the components to be described below is a relative concept defined by reference to the drawings. It is understood that the meaning of the upper and lower parts can be switched according to the arrangement of the printed circuit board 10, the antenna module 20 and the electromagnetic wave shielding structure 310.

The antenna module 20 includes a radio frequency integrated circuit (RFIC) 21 and array antenna 22.

The radio frequency integrated circuit 21 is mounted on the upper surface of the printed circuit board 10 and the array antenna 22 is coupled to the upper portion of the radio frequency integrated circuit 21.

The radio frequency integrated circuit 21 can be soldered on an upper surface of the printed circuit board 10 and coupled to the printed circuit board 10.

Through the above, the radio frequency integrated circuit 21 and the printed circuit board 10 can be electrically connected to each other. The radio frequency integrated circuit 21 can be supplied with power through the printed circuit board 10, controlled through a controller (Not shown) connected to the printed circuit board 10, and can exchange signals with the printed circuit board 10.

The radio frequency integrated circuit 21 can process and control signals transmitted and received from the array antenna 22 coupled to an upper surface of the radio frequency integrated circuit 21.

For example, the radio frequency integrated circuit 21 may convert a radio frequency signal received through the array antenna 22 into a baseband signal, and may convert a baseband signal to a radio frequency signal to transmit a signal through the array antenna 22.

The radio frequency integrated circuit 21 includes a radio frequency integrated circuit board 210 and the radio frequency integrated circuit board 210 is coupled to the printed circuit board 10 through a plurality of solder balls 211.

To this end, a plurality of solder balls 211 may be coupled to a lower surface of the radio frequency integrated circuit board 210. On an upper surface of the printed circuit board 10, a plurality of first solder creams 14 corresponding to the plurality of solder balls 211 coupled to the lower surface of the radio frequency integrated circuit board 210 can be applied.

A plurality of solder balls 211 and a plurality of first solder creams 14 can be coupled through reflow.

That is, by soldering a plurality of solder balls 211 coupled to the lower part of the antenna module 20 and a plurality of first solder creams 14 disposed on the upper surface of the printed circuit board 10, the antenna module 20 may be coupled to the printed circuit board 10.

The radio frequency integrated circuit 21 including the radio frequency integrated circuit board 210 may include various components. However, since the radio frequency integrated circuit 21 is the same as or similar to the conventional technology, a detailed description thereof will be omitted.

On an upper surface of the radio frequency integrated circuit 21, an array antenna 22 is disposed.

The array antenna 22 includes an antenna substrate 220 and a plurality of radiators 221.

The plurality of radiators 221 are disposed on an upper surface 2201 of the antenna substrate 220 and the plurality of radiators 221 are arranged on the upper surface 2201 of the antenna substrate 220.

Referring to FIG. 1, as an example, nine radiators 221 can be arranged in three rows and three columns on the upper surface 2201 of the antenna substrate 220.

The array antenna 22 can transmit and receive signals to and from the upper side through the plurality of radiators 221 disposed on the upper surface 2201 of the antenna substrate 220. The array antenna 22 can adjust the angle of the signal radiated from the plurality of radiators 221 through the phase difference among the adjacent radiators 221.

Through this, the array antenna 22 can ensure the directivity of signals to be transmitted and received, and can stably transmit and receive large amounts of data.

The antenna module 20 according to an embodiment of the disclosure is preferably configured such that the distance between the array antenna 22 and the radio frequency integrated circuit 21 is minimized.

Specifically, the antenna substrate 220 and the radio frequency integrated circuit board 210 are disposed to face each other with a minimum distance.

Referring to FIG. 2, the antenna substrate 220 and the radio frequency integrated circuit board 210 may be in a form of a rectangular plate, and the width of the radio frequency integrated circuit board 210 may be smaller than the width of the antenna substrate 220.

The antenna substrate 220 is coupled to an upper surface of the radio frequency integrated circuit 21 and the antenna substrate 220 is coupled to the radio frequency integrated circuit board 210 on the upper surface of the radio frequency circuit board 210 to face the radio frequency integrated circuit board 210.

As illustrated in FIG. 2, the antenna substrate 220 can be coupled to the radio frequency integrated circuit board 210 through a plurality of bumps 225.

To be specific, a plurality of bumps 225 may be coupled to the lower surface of the antenna substrate 220. As a plurality of bumps 225 may be coupled to the upper surface of the radio frequency integrated circuit board 210, the antenna substrate 220 can be coupled to the radio frequency integrated circuit board 210.

Through this, the distance between the antenna substrate 220 and the radio frequency integrated circuit board 210 can be minimized.

The plurality of bumps 225 can be configured as a metal bump or a solder ball.

The antenna substrate 220 and the radio frequency integrated circuit board 210 may be electrically connected to each other through the plurality of bumps 225. The array antenna 22 may be fed from the radio frequency integrated circuit 21.

The transmission and reception termination circuit inside the antenna substrate 220 connected to the plurality of radiators 221 is configured to be close to a feeding point, thereby minimizing the signal line loss.

As described above, by arranging the array antenna 22 in which the plurality of radiators 221 are arranged on the upper side and the radio frequency integrated circuit 21 to face each other with a minimum distance, the antenna module 20 can transceive the ultra-high radio frequency without loss, and through this, a massive multiple-input multiple-output (MIMO) technique can be applied to the antenna module 20.

In addition, the antenna module 20 can transceive signal of 5 GHZ or ultra-high frequency signal of 20 GHz or higher through the aforementioned array antenna 22 without loss.

Figure 3:
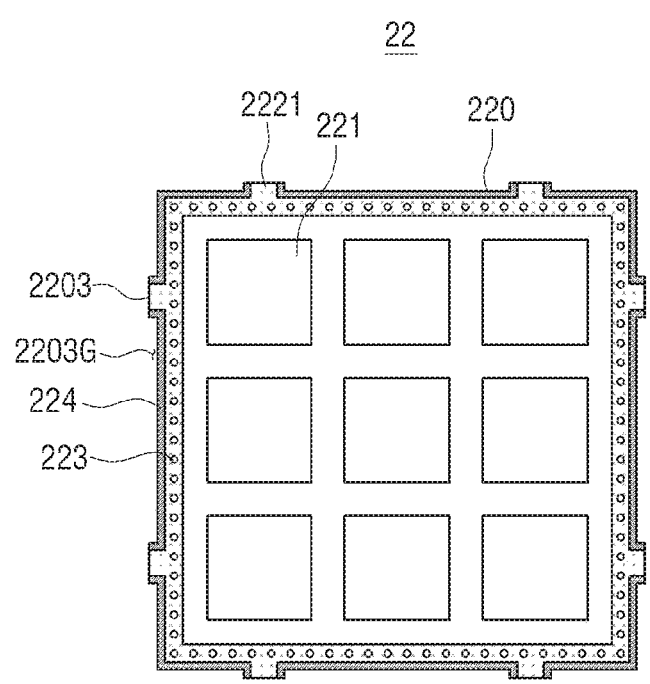
FIG. 3 is a ground plan of an array antenna as illustrated in FIG. 2 according to an embodiment of the disclosure.

FIG. 3 is a ground plan of an array antenna as illustrated in FIG. 2 according to an embodiment of the disclosure.

FIGS. 4A, 4B, 4C, and 4D illustrate sectional views of a manufacturing process of the electromagnetic wave shielding structure 310 as illustrated in FIG. 2 according to various embodiments of the disclosure.

As described above, in the electronic device 1 according to the embodiment of the disclosure, the array antenna 22 having a plurality of radiators 221 on the upper side of the radio frequency integrated circuit 21 is arranged closely. Therefore, in order to prevent the noise introduced from the outside to the radio frequency integrated circuit 21 and the electromagnetic wave radiated from the radio frequency integrated circuit 21 from interfering with the array antenna 22 and surrounding elements, an electromagnetic wave shielding structure for the radio frequency integrated circuit 21 is required.

Referring to FIGS. 1 to 4D, a structure of the antenna module 20 to shield electromagnetic wave and an electromagnetic wave shielding structure 310 will be described.

The array antenna 22 includes a first ground pattern 2221 disposed on the upper surface 2201 of the antenna substrate 220 along the circumference of the antenna substrate 220 and a second ground pattern 2222 disposed on a lower surface (or lower side) 2202 of the antenna substrate 220 along the circumference of the antenna substrate 220.

As illustrated in FIGS. 2 and 3, the first ground pattern 2221 may be formed in a closed loop which covers the upper surface 2201 of the antenna substrate 220 along an edge portion 220E of the antenna substrate 220. In addition, the first ground pattern 2221 may be disposed along the outermost surface of the upper surface 2201 of the antenna substrate 220 and may have a rectangular ring shape corresponding to the shape of the antenna substrate 220. Accordingly, the plurality of radiators 221 are disposed inside the first ground pattern 2221.

That the first and second ground patterns 2221 and 2222 are arranged along the circumference of the antenna substrate 220 can be meant that a shape of the first and second ground patterns 2221 and 2222 corresponds to a shape of the outermost portion of the antenna substrate 220 and can be interpreted to correspond to the shape of the edge portion 220E of the antenna substrate 220.

The first ground pattern 2221 may be made of a conductive metal and can be configured through patterning on the upper surface 2201 of the antenna substrate 220. For example, the first ground pattern 2221 may be composed of a copper foil.

In addition, the second ground pattern 2222 may also be a shape of a closed loop covering the lower surface 2202 of the antenna substrate 220 along the edge portion 220E of the antenna substrate 220.

In addition, the second ground pattern 2222 may be disposed along the outermost side of the lower surface 2202 of the antenna substrate 220 and may have a rectangular ring shape corresponding to the shape of the antenna substrate 220. Accordingly, a plurality of bumps 225 may be disposed inside the second ground pattern 2222.

The second ground pattern 2222, also, may be made of a conductive metal and can be configured through patterning on the lower surface 2202 of the antenna substrate 220. For example, the second ground pattern 2222 may be composed of a copper foil.

It is sufficient that the first and second ground patterns 2221 and 2222 are in a shape to cover the upper surface 2201 and the lower surface 2202 of the antenna substrate 220 along the edge portion 220E of the antenna substrate 220, and various shapes can be added to inside the rectangular ring shape. In addition to the above, shapes of the first and second ground patterns 2221 and 2222 are changeable to various shapes.

In addition, at a lower surface of the second ground pattern 2222, a mask 226 can be disposed, and at the lower surface 2202 of the antenna substrate 220, a plurality of masks 226 can be disposed.

The mask 226 prevents foreign substances from adhering to the antenna substrate 220 and, for example, prevents the solder from deviating from a predetermined position in the process of soldering the elements to the antenna substrate 220.

The antenna substrate 220 includes a plurality of via holes 223 which connect the first ground pattern 2221 and the second ground pattern 2222.

The plurality of via holes 223 are holes that pass through the antenna substrate 220, and can be formed to pass through the upper surface 2201 and the lower surface 2202 of the antenna substrate 220.

To be specific, as illustrated in FIGS. 2 and 3, the plurality of via holes 223 may be formed on the first ground pattern 2221 along the circumference of the antenna substrate 220, pass through the antenna substrate 220, and the first ground pattern 2221 and the second ground pattern 2222 may be connected to each other through the via holes 223.

The plurality of via holes 223 can be disposed along the circumference of the antenna substrate 220, and disposed along the edge portion 220E of the antenna substrate 220.

In addition, inner circumference of the plurality of via holes 223 is plated with a conductive material and the first ground pattern 2221 and the second ground pattern 2222 can be electrically connected.

Through this, a grounding space of the antenna substrate 220 can increase.

The antenna substrate 220 includes a plating part 224 which is disposed on the side surface 2203 of the antenna substrate 220 and connects the first ground pattern 2221 and the second ground pattern 2222.

The plating part 224 is disposed along the side surface 2203 of the antenna substrate 220 to connect the first ground pattern 2221 and the second ground pattern 2222.

The plating part 224 may be formed on the side surface 2203 of the antenna substrate 220 along the edge 220E of the antenna substrate 220 and may be of conductive metal which is plated on the side surface 2203 of the antenna substrate 220.

As illustrated in FIGS. 2 and 3, the plating part 224 may electrically connect the first ground pattern 2221 and the second ground pattern 2222 by wrapping over the side surface 2203 of the antenna substrate 220 along the circumference of the antenna substrate 220.

Through this, a grounding space of the antenna substrate 220 can increase.

At least a part of the side surface 2203 of the antenna substrate 220 may be concave toward the center of the antenna substrate 220, and as illustrated in FIG. 3, a plurality of concave grooves 2203G may be formed on the side surface 2203 of the antenna substrate 220.

The plating part 224 may be formed on the side surface 2203 of the antenna substrate 220 along the concave groove 2203G of the antenna substrate 220 and may be configured in a shape corresponding to the shape of the concave groove 2203G of the antenna substrate 220.

The plating part 224 can be in contact with the electromagnetic wave shielding structure 310 described later. A connection part 312 of the electromagnetic wave shielding structure 310 is filled between the concave groove 2303G of the antenna substrate 220 and a shield frame (or shield can) 311 of the electromagnetic wave shielding structure 310 to be described later, and the plating part 224 and the electromagnetic wave shielding structure 310 may be electrically connected to each other. The plating part 224 and the electromagnetic wave shielding structure 310 may be securely shielded by the connection part 312.

The electromagnetic wave shielding structure 310 is coupled to the printed circuit board 10 and wraps over the side of the antenna module 20.

In addition, the electromagnetic wave shielding structure 310 is attached to the printed circuit board 10 so as to wrap over the space between the array antenna 22 and the printed circuit board 10 and covers the edge portion of the array antenna 22.

Through the electromagnetic wave shielding structure 310, the radio frequency integrated circuit 21 which is disposed between the array antenna 22 and the printed circuit board 10 can be shielded.

The electromagnetic wave shielding structure 310 may be in a form of a wall which is disposed at an upper surface of the printed circuit board 10 and surrounds a side portion of the antenna module 20.

The electromagnetic wave shielding structure 310 has a structure for covering the edge portion 220E of the antenna substrate 220 along the circumference of the antenna substrate 220. The plurality of radiators 221 disposed on the upper surface 2201 of the antenna substrate 220 can be exposed to outside without being shielded and can transceive electromagnetic waves.

The electromagnetic wave shielding structure 310 may be configured such that the upper end of the electromagnetic wave shielding structure 310 covers the first ground pattern 2221 and the lower end of the electromagnetic wave shielding structure 310 is attached to the printed circuit board 10.

Through this, the electromagnetic wave shielding structure 310 can shield the gap between the array antenna 22 and the printed circuit board 10 from the outside, and the radio frequency integrated circuit 21 which is disposed between the array antenna 22 and the printed circuit board 10 can be shielded.

To be specific, as illustrated in FIG. 2, the electromagnetic wave shielding structure 310 includes a shield frame 311 that surrounds a side surface 2203 of the antenna substrate 220, a connection part 312 which connects an upper end of the shield frame 311 and the first ground pattern 2221 and an adhesive portion 313 to which a lower portion of the shield frame 311 is coupled.

The printed circuit board 10 includes a main body 11 of the printed circuit board, a ground pad 12 disposed on the upper surface in which the radio frequency integrated circuit is mounted, a mask 13 which is disposed on the upper surface 111 of the main body 11 and covers the boundary of the ground pad 12, and a plurality of first solder creams 14 corresponding to the plurality of solder balls 211 coupled to a lower portion of the radio frequency integrated circuit board 210.

The ground pad 12 disposed on the upper surface of the main body of the printed circuit board is exposed on the printed circuit board 10 and can be electrically connected to a ground layer (not shown) formed inside the printed circuit board 10 integrally.

The ground pad 12 may be patterned on the main body 11 of the printed circuit board 10 in a shape corresponding to the outermost shape of the antenna module 20 and may be made of a conductive metal.

In addition, the ground pad 12 may be in the form of a closed loop in which the antenna module 20 is disposed inside. For example, the ground pad 12 may be a quadrangular ring shape.

The ground pad 12 may have a quadrangular ring shape corresponding to the outermost shape of the antenna substrate 220 and may have a closed loop shape corresponding to the shape of the first ground pattern 2221.

Inside the ground pad 12, the plurality of first solder creams 14 are disposed.

The plurality of first solder creams 14 disposed inside the ground pad 12 may be coupled to a plurality of solder balls 211 coupled to a lower surface of the radio frequency integrated circuit board 210, through which the antenna module 20 can be mounted on the printed circuit board 10.

The plurality of first solder creams 14 may be formed by being applied to the upper surface of the main body 11 of the printed circuit board body before the antenna module 20 is attached to the printed circuit board 10.

In addition, the mask 13 covering the side surface of the ground pad 12 is disposed on the upper surface of the printed circuit board 10. The upper surface of the printed circuit board 10 may be the same as the upper surface 111 of the main body 11 of the printed circuit board.

The mask 13 is disposed along the boundary of the ground pad 12 and may protrude upward from the upper surface of the ground pad 12 at the boundary of the ground pad 12.

As a result, the adhesive portion 313 of the electromagnetic wave shielding structure 310 described to be later can be easily coupled to the upper surface of the ground pad 12, and it can be prevented that the adhesive portion 313 having fluidity departs from the ground pad 12 and spread to the periphery.

It is desirable that the mask 13 is composed of insulating material.

The electromagnetic wave shielding structure 310 described above can be attached to the ground pad 12 and cover the first ground pattern 2221 to shield the side surface of the antenna module 20.

The upper end of the electromagnetic wave shielding structure 310 has a shape corresponding to the shape of the first ground pattern 2221 and the lower end of the electromagnetic wave shielding structure 310 can be configured in a form corresponding to the shape of the ground pad 12.

That is, the electromagnetic wave shielding structure 310 may be in a wall structure of a closed loop shape corresponding to the first ground pattern 2221 and the ground pad 12.

Specifically, the adhesive portion 313 of the electromagnetic wave shielding structure 310 may be formed along the ground pad 12 of the printed circuit board 10 on which the antenna module 20 is mounted, and may be formed on the upper surface of the ground pad 12.

Therefore, when the ground pad 12 is in a closed loop shape, the adhesive portion 313 can be formed in a closed loop also.

Through this, the adhesive portion 313 can be coupled to the ground pad 12 and grounded.

However, the adhesive portion 313 may not be the same as the shape of the ground pad 12, and can be formed to correspond to a part of the ground pad 12.

The adhesive portion 313 can be made of electroconductive material having a predetermined viscosity.

The adhesive portion 313 can be formed by applying conductive material having predetermined viscosity on the ground pad 12, and the conductive material having predetermined viscosity can be a conductive adhesive.

The conductive material constituting the adhesive portion 313 may have fluidity, and it is desirable that the adhesive portion 313 may be formed of a conductive material which can be hardened at room temperature or can be hardened at a heating temperature to such an extent that the heat conductive material does not melt.

In addition, the conductive material constituting the adhesive portion 313 can have predetermined elasticity after being hardened.

The electroconductive material may include an electroconductive filler and a binder resin.

As an electroconductive filler, metal such as Ag, Cu, Ni, Al, or Sn may be used, conductive carbon such as carbon black, carbon nanotube (CNT), graphite or the like may be used, metal coated materials such as Ag/Cu, Ag/Glass fiber, Ni/Graphite, or the like may be used, or conductive polymer materials such as polypyrrole, polyaniline, or the like may be used. The electroconductive filler may be formed of any one of a flake type, a sphere type, a rod type, and a dendrite type, or the combination thereof.

As the binder resin, a silicone resin, an epoxy resin, a urethane resin, an alkyd resin, or the like may be used. The material constituting the adhesive portion 313 may further contain additives (a thickener, an antioxidant, a polymer surfactant, etc.) for improving other performance and a solvent (water, alcohol, etc.).

In case of the conductive material constituting the adhesive portion 313, if fluidity is too great, the material can move to a position which deviates from the ground pad 12 and thus, it is desirable that viscosity of the material constituting the adhesive portion 313 is in a range of around 1,000 cps to 100,000 cps.

In addition, the conductive material dispensed on the ground pad 12 can be applied to the ground pad 12 without deviating the ground pad 12 by the mas 13 of the printed circuit board 10.

The shield frame 311 can be composed of conductive metal which is attached to the adhesive portion 313 and wraps over the side surface (or side portion) 2203 of the antenna substrate 220. For example, the shield frame 311 can be made of stainless steel.

The shield frame 311 may be a rectangular frame shape which is disposed on an upper surface of the printed circuit board 10 and wraps over the side of the antenna module 20, and may be a shape of a wall which is extended upward from the printed circuit board 10 to wrap over the side of the antenna module 20.

The lower portion of the shield frame 311 may be a closed loop shape corresponding to the shape of the ground pad 12, and it is desirable to be a closed loop shape corresponding to the shape of the adhesive portion 313.

The shield frame 311 can be coupled on the printed circuit board 10 as the lower portion of the shield frame 311 is attached to the adhesive portion 313.

The lower portion of the shield frame 311 is seated on the adhesive portion 313 before the adhesive portion 313 applied on the ground pad 12 is hardened, and the lower portion can lead in the adhesive portion 313.

Through this, the lower portion of the shield frame 311 can be buried in the adhesive portion 313. As the adhesive portion 313 in which the lower portion of the shield frame 311 is buried is hardened, the shield frame 311 can be stably fixed to the adhesive portion 313.

The shield frame 311 can be grounded by being attached to the adhesive portion 313.

Further, since the shield frame 311 is attached and fixed to the adhesive portion 313 made of a conductive material having a predetermined viscosity, during rework, the adhesive portion 313 can be easily detached from the printed circuit board 10 using a tool in a shape of a paddle without adding hot air. Through this, the shield frame 311 can be easily separated from the print circuit board along with the adhesive portion 313. As described above, the electromagnetic wave shielding structure 310 according to an embodiment of the disclosure eliminates the step of applying the hot air when separating the shield frame 311 from the printed circuit board 10 in the rework process. Thus, it is possible to solve the problems that the solder of the antenna module 20 and other components mounted on the printed circuit board 10 are melted and separated from the printed circuit board 10 or a preset position is changed.

In addition, the electromagnetic wave shielding structure 310 includes a connection part 312 which connects an upper portion of the shield frame 311 and the first ground pattern 2221.

The connection part 312 can be made of conductive material having predetermined viscosity which can shield electromagnetic wave.

The connection part 312 can be made of a material which is the same as a material constituting the aforementioned adhesive portion 313, and the conductive material may include a conductive filler and a binder resin.

The connection part 312 may be formed by applying a conductive material having a predetermined viscosity onto the first ground pattern 2221. The conductive material having a predetermined viscosity may be formed of a conductive adhesive agent.

The conductive material constituting the connection part 312 can be applied between the first ground pattern 2221 and the upper portion of the shield frame 311.

The connection part 312 is formed along the first ground pattern 2221 and can cover an upper surface of the first ground pattern 2221.

The connection part 312 can connect the first ground pattern 2221 and the shield frame 311, and through this, the space between the shield frame 311 and the edge portion 220E of the antenna substrate 220 can be shielded.

In addition, the shield frame 331 and a side surface 2203 of the antenna substrate 220 can be disposed to be apart from each other.

The connection part 312 can fill a space between the antenna substrate 220 and the shield frame 311.

The connection part 312 can electrically connect the first ground pattern 2221 and the shield frame 311 and can shield the gap between the antenna substrate 220 and the shield frame 311.

Specifically, the conductive material applied along the first ground pattern 2221 has fluidity to fill the gap between the antenna substrate 220 and the shield frame 311.

The connection part 312 may connect the shield frame 311 and the plating part 224.

As illustrated in FIG. 2, the connection part 312 covering the first ground pattern 2221 is inserted between the side surface 2203 of the antenna substrate 220 and the shield frame 311, thereby filling the gap between the side surface 2203 of the shield frame 311 and the shield frame 311.

The connection part 312 which fills the gap between the side portion 2203 of the antenna substrate 220 and the shield frame 311 can connect the shield frame 311 and the plating part 224.

Therefore, through the connection part 312, the shield frame 311 and the plating part 224 can be electrically connected.

The connection part 312 can securely connect the shield frame 311 and the plating part 224 by filling the concave groove 2203G of the antenna substrate 220 so that the gap between the shield frame 311 and the antenna substrate 220 can be more stably shielded.

The connection part 312 can not only electrically connect the shield frame 311 and the first ground pattern 2221 but also electrically connect the shield frame 311 and the plating part 224 so that a wider ground surface area can be secured. In addition, as described above, the first ground pattern 2221 and the second ground pattern 2222 are electrically connected through the plurality of via holes 223 and thus, a wider grounding area for shielding the radio frequency integrated circuit 21 can be secured.

The electromagnetic wave shielding structure 310 can effectively shield the gap between the antenna substrate 220 and the printed circuit board 10 and can more effectively shield the radio frequency integrated circuit 21 which is disposed between the antenna substrate 220 and the printed circuit board 10 more effectively.

Hereinafter, referring to FIGS. 4A through 4D, the processor of making the electromagnetic wave shielding structure 310 according to various embodiments will be described sequentially.

Figure 4A:
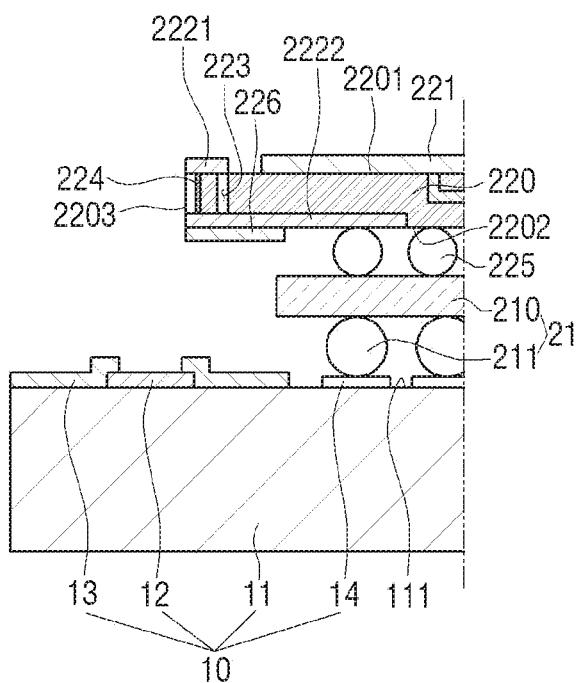
FIGS. 4A, 4B, 4C, and 4D are sectional views of a manufacturing process of the electromagnetic wave shielding structure as illustrated in FIG. 2 according to various embodiments of the disclosure.

Referring to FIG. 4A, the antenna module 20 is coupled to the printed circuit board 10.

The printed circuit board 10 and the antenna module 20 can be coupled as the plurality of solder balls 211 disposed at a lower portion of the radio frequency integrated circuit 21 and the plurality of first solder creams 14 of the printed circuit board 10 are soldered.

As a specific example, while the ground pad 12 is patterned ahead on the upper surface 111 of the main body 11 of the printed circuit board, after the first solder cream 14 is applied on the upper surface 111 of the main body 11 of the printed circuit board so that the plurality of first solder creams 14 are disposed inside the ground pad 12, the antenna module 20 is seated in the printed circuit board 10 so that the plurality of solder balls 211 are in contact with the plurality of first solder creams 14. Thereafter, the antenna module 20 is coupled to the printed circuit board 10 by soldering the plurality of solder balls 211 and the plurality of first solder creams 14 through reflow.

Figure 4B:
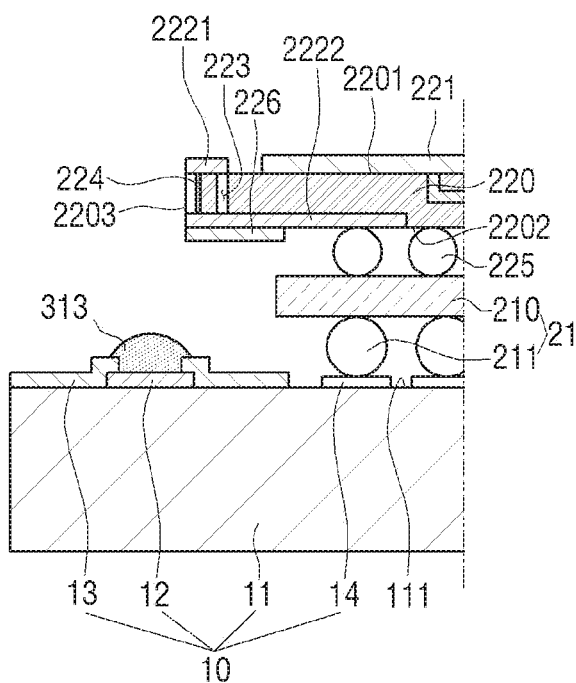

Referring to FIG. 4B, by dispensing conductive material with predetermined viscosity along the ground pad 12, the adhesive portion 313 is formed.

The conductive material constituting the adhesive portion 313 can be dispensed to the upper surface of the ground pad 12 through the nozzle 1216 (see FIG. 7) which moves following a predetermined path.

Figure 4C:
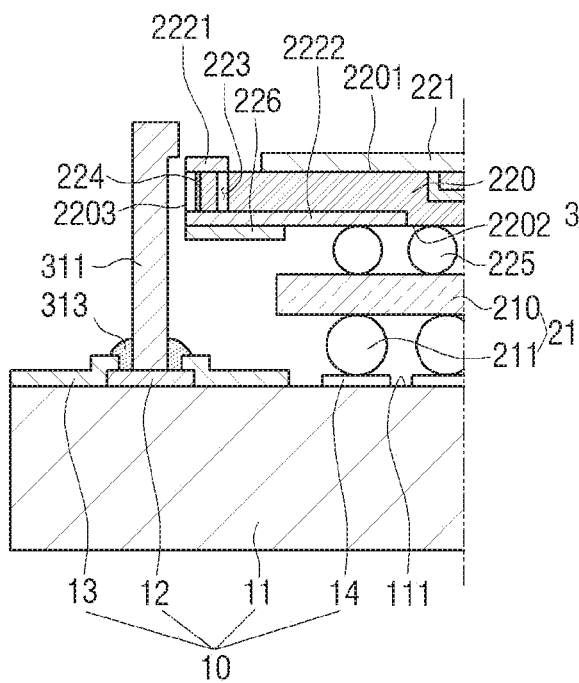

Referring to FIG. 4C, the shield frame 311 is attached to the printed circuit board 10.

The shield frame 311 can be attached to the adhesive portion 313, as the lower portion of the shield frame 311 is attached in the adhesive portion 313.

The shield frame 311 can be attached to the adhesive portion 313 through a separate robot arm.

Figure 4D:
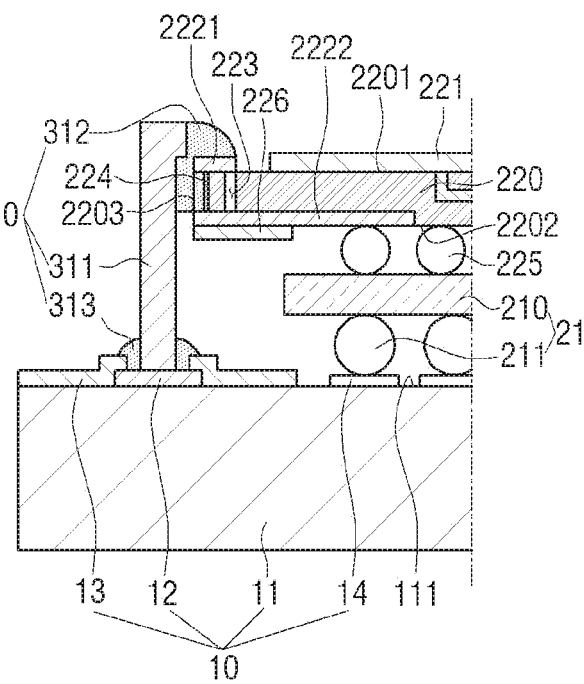

Referring to FIG. 4D, by dispensing conductive material having predetermined viscosity on the first ground pattern 2221, the connection part 312 is formed.

The conductive material which constitutes the connection part 312 also can be dispensed on an upper surface of the first ground pattern 2221 through a nozzle 1216 which moves according to the predetermined path.

The nozzle 1216 may be composed of a plurality of nozzles and the nozzle forming the adhesive portion 313 and the nozzle forming the connection part 312 may be the same nozzle or may be composed of different nozzles.

The gap between the shield frame 311 and the antenna substrate 220 can be shielded by connecting the upper end portion of the shield frame 311 and the first ground pattern 2221 through the connection part 312, and the radio frequency integrated circuit 21 disposed between the antenna substrate 220 and the printed circuit board 10 can be shielded.

Figure 5:
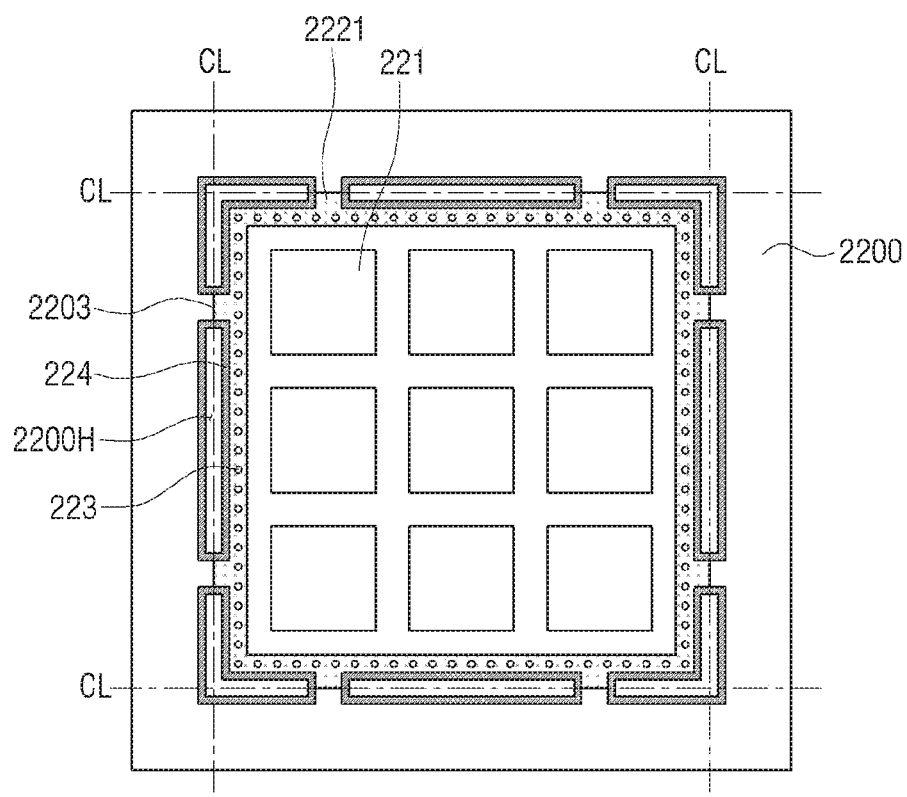
FIG. 5 is a ground plan illustrating a state before the array antenna of FIG. 3 is cut from the substrate member according to an embodiment of the disclosure.

FIG. 5 is a ground plan illustrating a state before the array antenna 22 of FIG. 3 is cut from the substrate member 2200 according to an embodiment of the disclosure.

Referring to FIG. 5, a method of forming the plating part 224 of the antenna substrate 220 will be described.

The array antenna 22 according to an embodiment can be made by cutting a substrate member which forms the antenna substrate 220 according to a predetermined shape of the antenna substrate 220.

Specifically, a through hole 2200H corresponding to the concave groove 2203G of the antenna substrate 220 is formed in the substrate member (220), and the inner surface of the through hole 2200H is plated with a conductive metal. Then, the antenna substrate 220 including the plating part 224 can be manufactured by cutting the substrate member 2200 along the cutting line CL into a shape of a predetermined antenna substrate 220.

The cutting line CL may be a virtual line passing through the center of the through hole 2200H. By cutting the substrate member (220) along the cutting line disposed up, down, left, and right sides, the antenna substrate 220 in a predetermined rectangular shape can be manufactured.

Before cutting the substrate member 2200 in which the plating part 224, the plurality of radiators 221 and first and second ground patterns 2221, 2222 are coupled to the substrate member 2200, and a plurality of via holes 223 are formed on the substrate member 2200. Thereafter, the substrate member 2200 can be cut in a shape of the antenna substrate 220 along the predetermined cutting line (CL).

After cutting the substrate member 220 on which the plating part 224 is formed along the cutting line CL to the antenna substrate 220, disposing the plurality of radiators 221 on the upper surface of the antenna substrate 220, forming the first and second ground patterns 2221 and 2222 on each of an upper surface and a lower surface of the antenna substrate 220, and forming the plurality of via holes 223, the array antenna 22 can be made.

In addition to the above, a process of making the array antenna 22 can be changed in various orders.

Figure 6A:
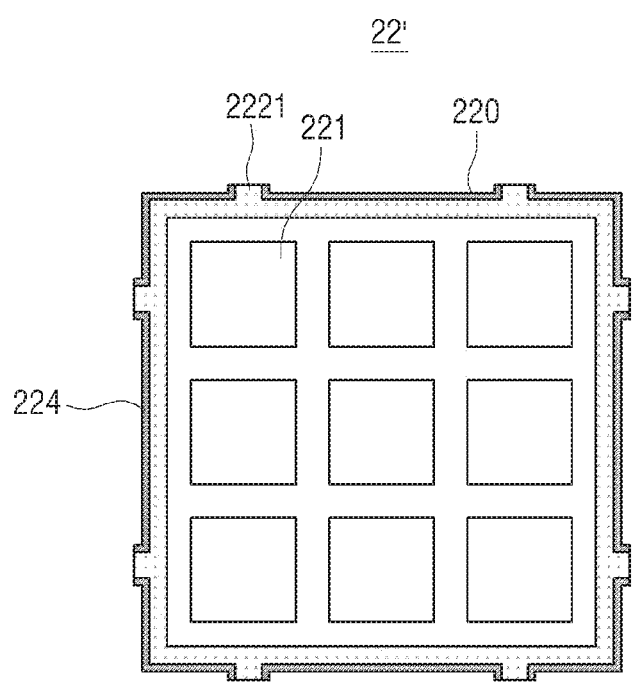
FIG. 6A is a ground plan illustrating an example which shows a transformation of the array antenna of FIG. 3 according to an embodiment of the disclosure.

FIG. 6A is a ground plan illustrating an example which shows a transformation of the array antenna of FIG. 3 according to an embodiment of the disclosure.

An array antenna 22' illustrated in FIG. 6A has mostly the same configurations as the array antenna 22 illustrated in FIG. 3, but it is different in that the plurality of via holes 223 are not included.

The array antenna 22' includes the antenna substrate 220 and a plurality of radiators 221 disposed on the upper surface of the antenna substrate 220. The array antenna 22' includes the first and second ground patterns 2221 and 2222 disposed on each of the upper surface and the lower surface of the antenna substrate 220 along the periphery of the antenna substrate 220.

The antenna substrate 220 includes the plating part 224 disposed on a side surface 2203 of the antenna substrate 220 and connecting the first ground pattern 2221 and the second ground pattern 2222.

The plating part 224 electrically connects the first ground pattern 2221 and the second ground pattern 2222 and may increase a grounding space for shielding the side portion of the antenna module 20.

Figure 6B:
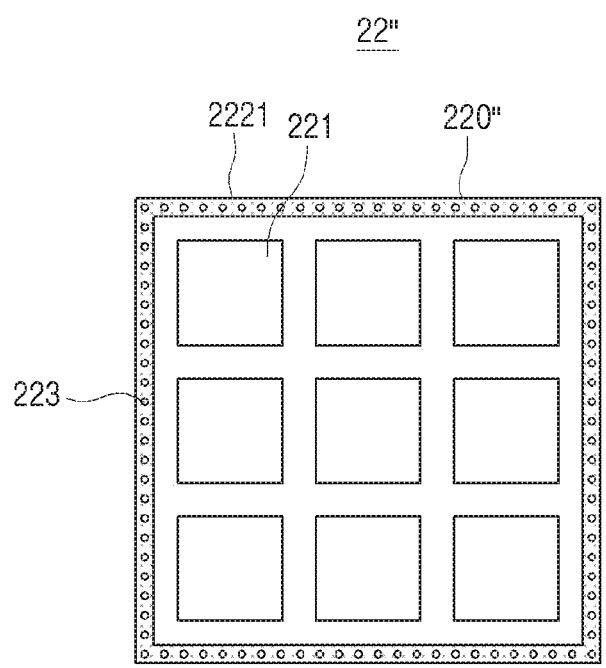
FIG. 6B is a ground plan illustrating another example which shows a transformation of the array antenna of FIG. 3 according to an embodiment of the disclosure.

FIG. 6B is a ground plan illustrating another example which shows a transformation of the array antenna of FIG. 3 according to an embodiment of the disclosure.

The array antenna 22" illustrated in FIG. 6B has mostly the same configurations as the array antenna 22 illustrated in FIG. 3, but is different in that the plating part 224 is not included.

Since the array antenna 22" shown in FIG. 6B does not include the plating part 224, the antenna substrate 220" does not include the concave groove 2203G (see FIG. 3) which may be formed on the side.

Accordingly, the side of the antenna substrate 220" may be in a flat shape without a separate step.

The array antenna 22" includes an antenna substrate 220" and the plurality of radiators 221 disposed on an upper surface of the antenna substrate 220". The array antenna 22" includes the first and second ground patterns 2221 and 2222 disposed on the upper and lower surfaces of the antenna substrate 220" along the circumference of the antenna substrate 220".

In addition, the antenna substrate 220" includes the plurality of via holes 223 which pass through the antenna substrate 220" and connect the first ground pattern 2221 and the second ground pattern 2222.

The first ground pattern 2221 and the second ground pattern 2222 may be electrically connected through the plurality of via holes 223. Through this, it is possible to increase the grounding area for the shielding of the radio frequency integrated circuit 21 disposed between the antenna substrate 220" and the printed circuit board 10.

As described above, the array antennas 22, 22', 22" may include the plurality of via holes 223 and the plating part 224 as shown in FIG. 3, or as shown in FIGS. 6A and 6B, may include at least one of the plurality of via holes 223 or the plating part 224 and secure the grounding area of the electromagnetic wave shielding structure 310.

Figure 7:
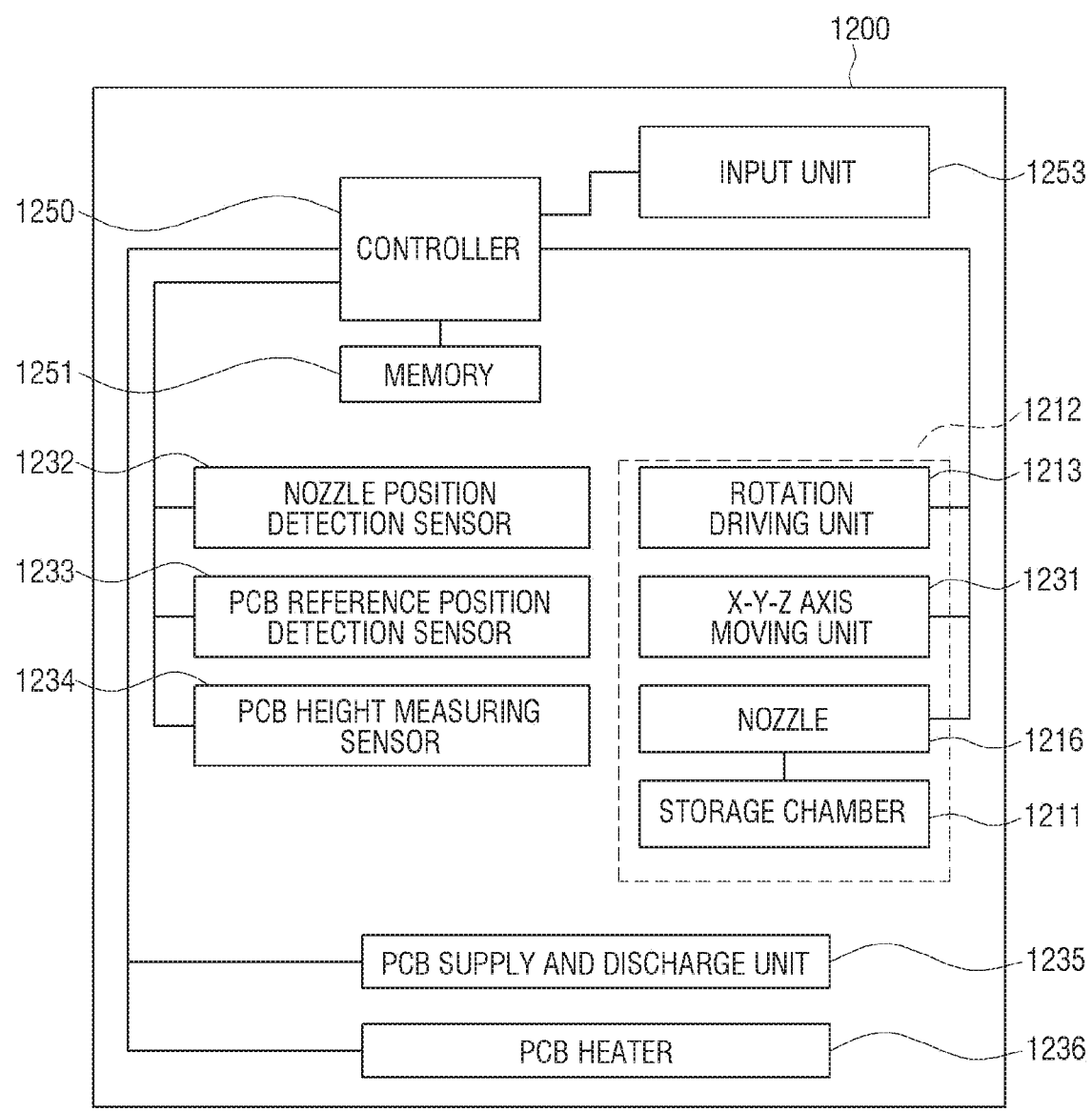
FIG. 7 is a block diagram illustrating a material dispensing apparatus to form an adhesive portion of FIG. 2 according to an embodiment of the disclosure.

FIG. 7 is a block diagram illustrating a material dispensing apparatus 1200 to form an adhesive portion 313 of FIG. 2 according to an embodiment of the disclosure.

Figure 8:
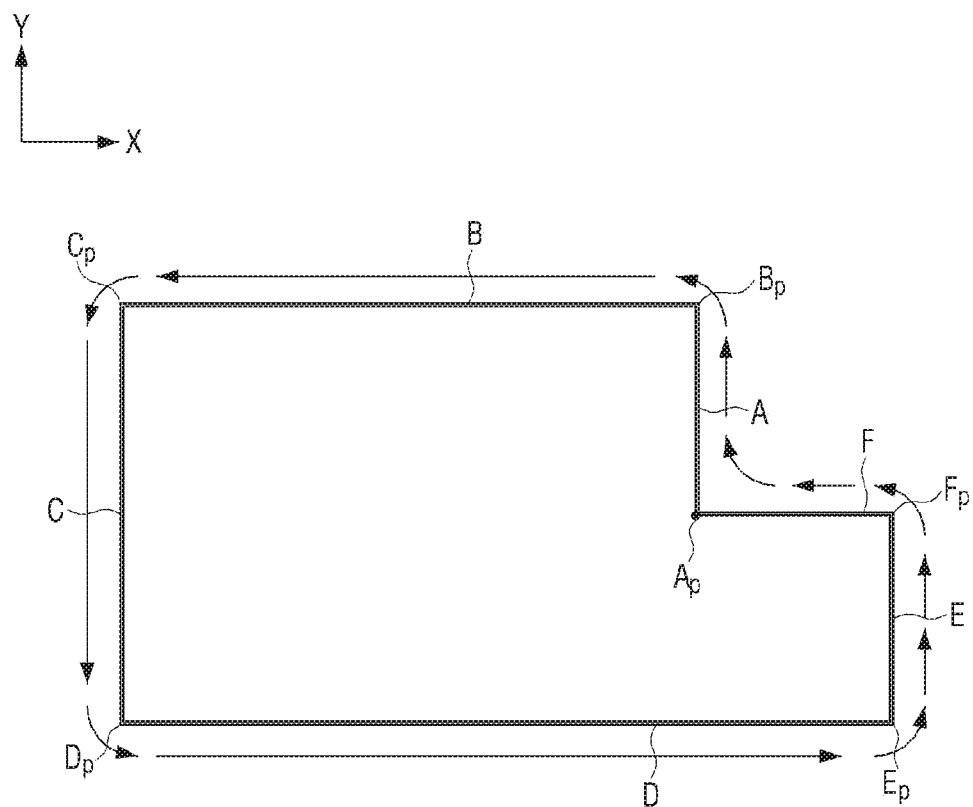
FIG. 8 is a view illustrating an example of a process of moving a nozzle of the material dispensing apparatus according to an embodiment of the disclosure.

FIG. 8 is a view illustrating an example of a process of moving a nozzle 1216 of the material dispensing apparatus 1200 according to an embodiment of the disclosure.

Figure 9:
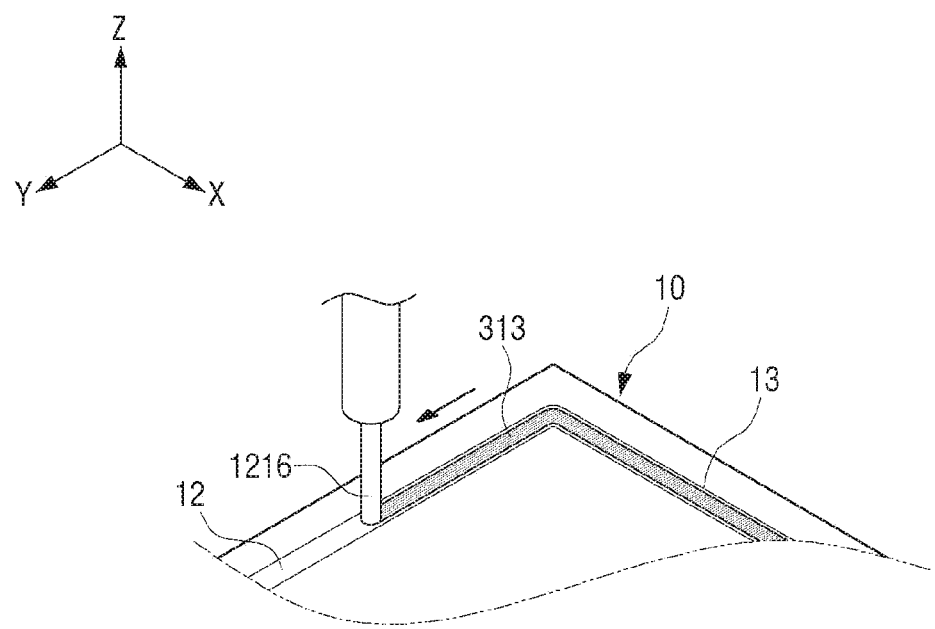
FIG. 9 is a view illustrating forming the adhesive portion on the printed circuit board as the nozzle moves along a predetermined path according to an embodiment of the disclosure.

FIG. 9 is a view illustrating forming the adhesive portion 313 on the printed circuit board 10 as the nozzle 1216 moves along a predetermined path according to an embodiment of the disclosure.

Figure 10A:
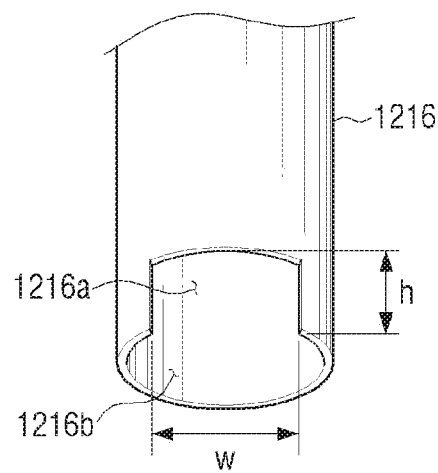
FIG. 10A is an enlarged perspective view illustrating an end portion of the nozzle of FIG. 9 according to an embodiment of the disclosure.

FIG. 10A is an enlarged perspective view illustrating an end portion of the nozzle 1216 of FIG. 9 according to an embodiment of the disclosure.

Hereinafter, with reference to FIG. 7 to FIG. 10A, a material dispensing apparatus 1200 for forming the adhesive portion 313 of the electromagnetic wave shielding structure 310 according to an embodiment of the disclosure and a method thereof will be described.

Referring to FIG. 7, the material dispensing apparatus 1200 may include a dispenser 1212 for dispensing a predetermined amount of material. The dispenser 1212 may include a storage chamber 1211 for storing a material and a nozzle 1216 for dispensing the material supplied from the storage chamber 1211.

The dispenser 1212 includes an X-Y-Z axis moving unit 1231 for moving the nozzle 1216 in the X-axis, Y-axis, and Z-axis directions, and a rotation driving unit 1213 capable of rotating the nozzle 1216 in a clockwise and counterclockwise directions, or stopping the rotation.

The nozzle 1216 can dispense a conductive material having a predetermined viscosity for forming the adhesive portion 313 as described above. The storage chamber 1211 may store the conductive material constituting the adhesive portion 313, and the nozzle 1216 which is connected to the storage chamber 1211 receives the conductive material from the storage chamber 1211.

The dispenser 1212 may include a single nozzle or a plurality of nozzles. In the case where the dispenser 1212 includes a plurality of nozzles, a plurality of storage chambers for storing materials dispensed from the plurality of nozzles may also be formed, and a plurality of storage chambers may store a plurality of different materials, and dispense different materials using the plurality of nozzles.

The X-Y-Z axis moving unit 1231 may include a plurality of step motors (not shown) for moving the nozzle(s) 1216 in the X axis, the Y axis, and the Z axis. These step motors are connected to a nozzle mount (not shown) in which the nozzle 1216 is mounted to transmit the driving force to the nozzle 1216. The rotation driving unit 1213 may include a motor (not shown) for providing rotational power and an encoder (not shown) for sensing the number of rotations of the motor and controlling the rotational angle of the nozzle 1216. The X-Y-Z axis moving unit 1231 and the rotation driving unit 1213 are electrically connected to the controller 1250 and are controlled by the controller 1250.

When a dispensing outlet of the nozzle 1216 is cleansed or the nozzle 1216 is replaced to a new one, the material dispensing apparatus 1200 may have cases in which an end portion of the nozzle through which a material is dispensed is not correctly placed at a pre-set setting position. Accordingly, the material dispensing apparatus 1200 includes a nozzle position detection sensor 1232 to place the nozzle 1216 in a setting position.

The nozzle position detection sensor 1232 may have a vision camera and is disposed below the nozzle 1216 with a predetermined interval. The calibration of the nozzle 1216 is performed by reading the end position of the nozzle 1216 through the image photographed by the nozzle position detection sensor 1232 and comparing the end position of the nozzle 1216 with the nozzle origin value prestored in the memory 1251, and it is possible to move the nozzle 1216 by the Y value so that the end of each nozzle coincides with the nozzle origin. In this case, the movement of the nozzle 1216 is performed by moving the nozzle mount (not shown) in accordance with the driving of the X-Y-Z axis moving unit 1231.

When the printed circuit board 10 is loaded into the position for forming the adhesive portion 313, the material dispensing apparatus 1200 may detect a position of the printed circuit board 10 in an X-Y plane state in which the printed circuit board 10 is placed and set a starting point (Ap) of the nozzle 1216 for dispensing a conductive material. As such, in order to detect a position after loading the printed circuit board 10, the material dispensing apparatus 1200 may include a PCB reference position detection sensor 1233 and a PCB height measuring sensor 1234.

The PCB reference position detection sensor 1233 is a sensor for determining the correct loading position of the PCB, and a vision camera can be used. The PCB reference position detection sensor 1233 detects whether the printed circuit board 10 loaded in the work space is in a preset position or there is a difference from a preset position, to form a shield structure. For example, when the printed circuit board 10 is loaded into the work position, a controller 1250 may move the PCB reference position sensor 1233 to the coordinates of the first reference mark. After photographing the first reference mark of the current printed circuit board 10, the first reference mark photographed at present is compared with the shape of a first reference mark set in advance, and it is determined whether the PCB reference position detection sensor 1233 is in a right position.

If it is determined that the PCB reference position detection sensor 1233 is in the right position, the controller 1250 calculates the position difference between the coordinates of the current first reference mark and the coordinates of the first reference mark set in advance. Subsequently, the controller 1250 calculates the position difference between the coordinates of the current second reference mark and the coordinates of the second reference mark set in advance, similarly to the method of calculating the coordinates of the first reference mark.

The material dispensing apparatus 1200 is provided with a PCB supply and dispensing unit 1235 for loading the printed circuit board 10 to a working position to form the adhesive portion 313 on the printed circuit board 10 and unloading the adhesive portion 313 after forming the adhesive portion 313.

The material dispensing apparatus 1200 may include a PCB heating heater 1236 to raise temperature of the printed circuit board 10 to predetermined temperature, in order to shorten drying time of the formed adhesive portion 313.

The material dispensing apparatus 1200 may include an input unit 1253 through which a user can directly input a moving path of the nozzle 1216. The input unit 1253 may be formed of a touch screen allowing a touch input or may be a conventional keypad. A user can input the movement path of the nozzle 1216 through the input unit 1253, respectively. The movement path of each nozzle input by the input unit 1253 once is stored in the memory 1251. Subsequently, the user can modify the nozzle movement path data stored in the memory 1251 through the input unit 1253.

Herein below, a process of inputting a nozzle movement path of the nozzle 1216 through the input unit 1253 will be described.

First, through the PCB reference position detection sensor 1233 (for example, it may be a vision camera, hereinafter "vision camera"), at least two reference marks displayed on the printed circuit board 10 that is loaded to the working position are photographed, and the distance between two reference marks are measured, and then, the reference images and the distance value between two reference marks are stored in the memory 1251. When the printed circuit board 10 is rectangular, two reference marks may be displayed at the upper left and lower right of the printed circuit board 10. In this case, the distance between the two reference marks may represent a straight line length in the diagonal direction of the printed circuit board.

Specifically, when the printed circuit board 10 is loaded into the working position, the user moves the vision camera to a position (for example, the reference is the center of the first reference mark or a part of the first reference mark) at which the first reference mark is positioned through front, back, left, and right movement buttons provided in the input unit 1253, and then presses a storage button provided in the input unit 1253, the controller 1250 calculates a distance from the preset origin (0, 0, 0) to the first reference mark, calculates coordinates (X1, Y1, Z1) of the first reference mark, and stores the same in the memory 1251. The photographing position of the vision camera moving with the nozzle 1216 is offset from the center of the nozzle 1216 by a predetermined distance. Therefore, the coordinates (X1, Y1, Z1) of the first reference mark are calculated by the controller 1250 up to the offset value. Further, when the user presses the photographing button, the image of the first reference mark is stored in the memory 1251.

Subsequently, when the user moves the vision camera to a position (for example, the reference is the center of the second reference mark or a part of the second reference mark) at which the second reference mark is positioned through front, back, left, and right movement buttons provided in the input unit 1253, and then presses a storage button provided in the input unit 1253, the controller 1250 calculates a distance from the preset origin (0, 0, 0) to the second reference mark, calculates coordinates (X2, Y2, Z2) of the second reference mark, and stores the same in the memory 1251. The photographing position of the vision camera moving with the nozzle 1216 is offset from the center of the nozzle 1216 by a predetermined distance. Therefore, the coordinates (X2, Y2, Z2) of the second reference mark are calculated by the controller 1250 up to the offset value in the same manner as the process of calculating the coordinates (X1, Y1, Z1) of the aforementioned first reference mark.

The controller 1250 calculates intervals between the two positions using the detected positions of the first and second reference marks and stores the same in the memory 1251.

Then, the user moves the vision camera along the path of the adhesive portion 313 to be formed on the printed circuit board 10 using front, back, left, and right buttons (not shown) of the input unit 1253, confirms a real-time image which is photographed by the vision camera with naked eye, and inputs a plurality of coordinates positioned on the movement path of the nozzle 1216. When the vision camera is located at a certain point on the moving path of the nozzle 1216, the coordinate is inputted by pressing a coordinate input button provided on the input unit 1253. The input coordinate is stored in the memory 1251.

Referring to FIG. 8, the plurality of coordinates are coordinates (Ap) at the point that the nozzle 1216 starts dispensing of a material, coordinates (the coordinates can be disposed to be adjacent to the starting point (Ap) when the adhesive portion 313 forms a closed curve) at the point that the nozzle 1216 finishes dispensing, and the coordinates (Bp, Cp, Dp, Ep, and Fp) that the nozzle 1216 should change a direction while moving.

In order to program the movement path of the nozzle 1216, the input unit 1253 may include various command buttons such as a movement button for moving the nozzle 1216 at the designated coordinates, a line button to give a command that the nozzle 1216 dispenses a material and moves, and a rotation button for shifting a moving direction of the nozzle 1216. The user may generate a movement path of the nozzle 1216 by matching the command buttons, the coordinates, and a rotation angle.

When the movement path of the nozzle 1216 is programmed by the user as described above, the controller 1250 dispenses the conductive material having the viscosity while moving the nozzle 1216 along the nozzle moving path and forms the adhesive portion 313 automatically the printed circuit board 10.

The data on the movement path of the nozzle 1216 input through the input unit 1253 may be stored in the memory 1251. The controller 1250 operates the X-Y-Z axis moving unit 1231 and the rotation driving unit 1213 according to the moving path data of the nozzle 1216 stored in the memory 1251 to move the nozzle 1216 along the previously inputted path. The nozzle path data includes the distance by which the nozzle 1216 moves linearly along the upper surface of the printed circuit board 10, and the direction and angle of rotation of the nozzle 1216.

In the above-described embodiment, it is described that the user directly inputs the movement path of the nozzle 1216 through the input unit 1253. However, the disclosure is not limited to thereto, and the nozzle movement path may be stored in advance in the memory 1251. In this case, a plurality of movement paths for the nozzle(s) 1216 can be stored in advance so as to correspond to patterns of the adhesive portion 313 that are formed variously according to products.

The adhesive portion 313 can be formed, as the nozzle moves along the shape of the ground pad 12 and dispenses the conductive material onto the ground pad 12. Thus, the shape of the ground pad 12 can be photographed using the vision camera, and a movement path of the nozzle 1216 can be generated based on the image of the photographed ground pad 12.

Further, calibration information, nozzle reference position information, PCB reference position information, PCB reference height information, and the like can be previously stored in the memory 1251, in addition to the movement path of the nozzle input through the input unit 1253.

Referring to FIG. 10A, the nozzle 1216 may have a side dispense outlet 1216a formed on the lower side and a bottom dispense outlet 1216b may be formed on the bottom of the nozzle. Therefore, when the nozzle 1216 moves along the Y axis direction, the material dispensed from the nozzle 1216 is simultaneously dispensed from the side dispense outlet 1216a and the bottom dispense outlet 1216b and is formed on the printed circuit board 10.

The nozzle 1216 dispenses a conductive material through the side dispense outlet 1216a and the bottom dispense outlet 1216b while moving in a direction opposite to the moving direction of the nozzle 1216 in a state in which the side dispense outlet 1216a is disposed.

The side dispense outlet 1216a may have a rectangular shape having a width w and a height h. The width and the thickness (height) of the adhesive portion 313 can be determined according to the width w and the height h of the side dispense outlet 1216a.

The bottom dispense outlet 1216b is set to be spaced apart from the upper surface of the printed circuit board 10 so as not to interfere with the upper surface of the printed circuit board 10 when moving along the preset nozzle movement path.

The nozzle 1216 moves along the movement path of the nozzle stored in the memory 1251 and forms the adhesive portion 313. A detailed description thereof will be made with reference to FIG. 8.

Referring to FIG. 8, the nozzle 1216 is set to a coordinate corresponding to the starting point Ap. Here, the controller 1250 rotates the nozzle 1216 at a predetermined angle by operating the rotation driving unit 1213 such that the side dispense outlet 1216a of the nozzle 1216 faces the direction opposite to the direction in which the nozzle 1216 moves.

As described above, the nozzle 1216 set at the coordinate corresponding to the starting point Ap moves linearly by the section A in the +Y axis direction by the X-Y-Z axis moving unit 1231. Then, the nozzle 1216 moves along a section where the path is bent (a section including a point Bp connecting the section A and the section B). In this case, the nozzle 1216 moves along the nozzle path by the X-Y-Z-axis moving unit 1231 and at the same time, is rotated by the rotation driving unit 1213 so that the side dispense outlet 1216a is continuously moved in the direction opposite to the moving direction of the nozzle 1216.

The nozzle 1216 moves linearly by a section B in the −X-axis direction by the X-Y-Z axis moving unit 1231 after passing the section where the path is bent. In this manner, if the nozzle 1216 linearly moves and rotates in a sequential manner in the B, C, D, E, and F sections by the rotation driving unit 1213 and the X-Y-Z axis movement unit 1231, and then returns to the starting point (Ap), path movement of the nozzle 1216 is completed.

The movement path of the nozzle 1216 shown in FIG. 8 is an example for describing functions of the X-Y-Z axis moving unit 1231 and the rotation driving unit 1213. The shape of the ground pad 12 may be variously changed, and the movement path of the nozzle 1216 may be also variously changed corresponding to the shape of the ground pad 12.

For example, the moving route of the nozzle 1216 forming the adhesive portion 313 can be a rectangular ring shape corresponding to the shape of the ground pad 12.

In addition, through the material dispensing apparatus 1200 described through FIGS. 7 to 10A, the connection part 312 which connects the upper end portion of the shield frame 311 and the first ground pattern 2221 can be formed.

The nozzle 1216 moves along the first ground pattern 2221, dispenses a conductive material constituting the connection part 312 on the first ground pattern 2221, and through this, the connection part 312 can be formed.

As described above, the dispenser 1212 can include a plurality of nozzles and a storage chamber. The material dispensing apparatus 1200 may include a nozzle forming the adhesive portion 313 and a nozzle forming the connection part 312 respectively. Since the adhesive portion 313 and the connection part 312 may be made of the same material, the connection part 312 may be formed after the adhesive portion 313 is formed as a single nozzle.

Figure 10B:
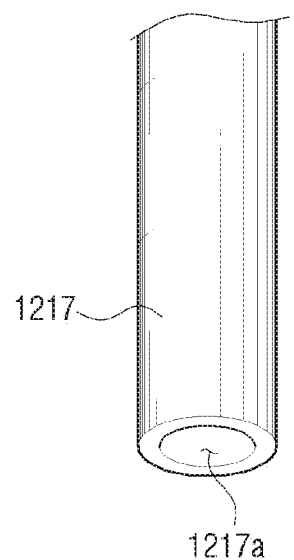
FIG. 10B is an enlarged perspective view illustrating an example of transforming the nozzle of FIG. 10A according to an embodiment of the disclosure.

FIG. 10B is an enlarged perspective view illustrating an example of transforming the nozzle of FIG. 10A according to an embodiment of the disclosure.

Referring to FIG. 10B, the nozzle 1217 may be configured to include only the bottom surface dispense outlet 1217*a*, which is open to the lower side of the nozzle 1217.

The material dispensing apparatus 1200 can dispense a material in various shapes through nozzle(s) 1217 having various structures, and through this, may form an electromagnetic wave shielding structure having various structures.

Figure 11:
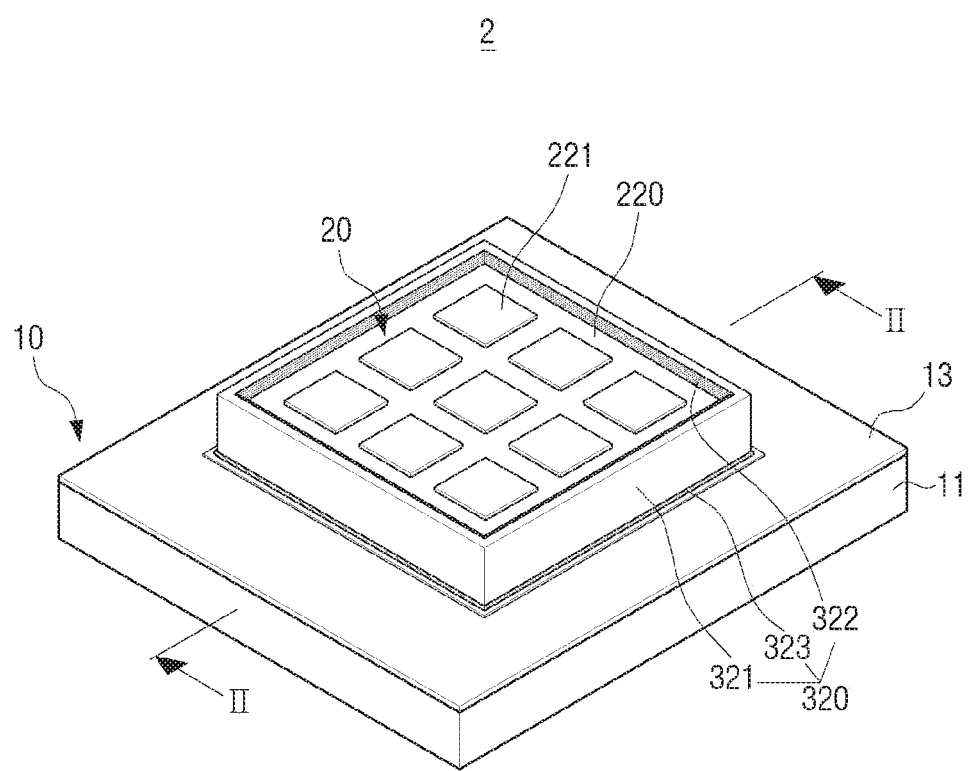
FIG. 11 is a perspective view illustrating the electromagnetic wave shielding structure of the electronic device according to an embodiment of the disclosure.

FIG. 11 is a perspective view illustrating the electromagnetic wave shielding structure 320 of the electronic device 2 according to an embodiment of the disclosure.

Figure 12:
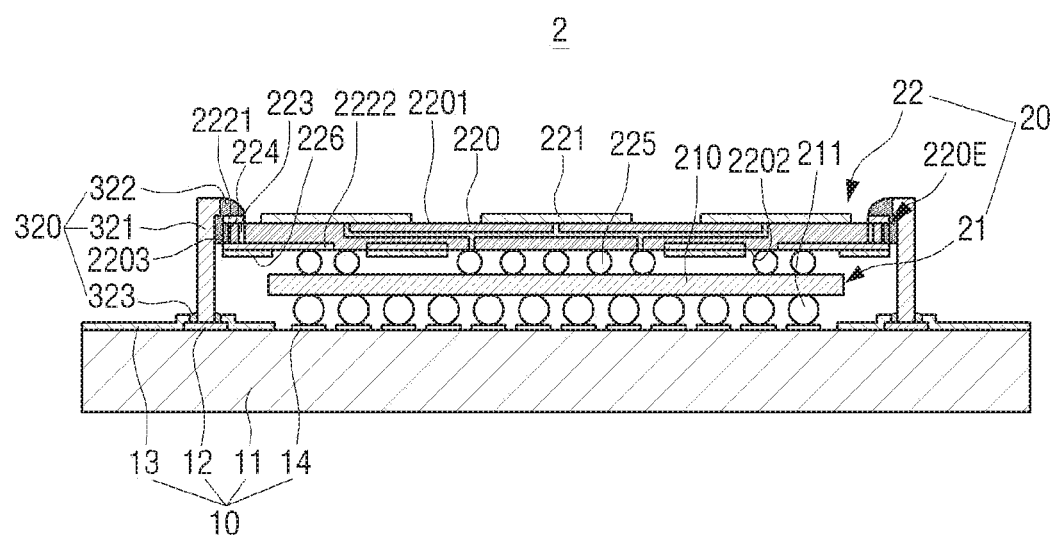
FIG. 12 is a sectional view of an electronic device which is cut along II-II line as illustrated in FIG. 11 according to an embodiment of the disclosure.

FIG. 12 is a sectional view of an electronic device 2 which is cut along II-II line as illustrated in FIG. 11 according to an embodiment of the disclosure.

FIGS. 13A, 13B, 13C, and 13D are sectional views illustrating a manufacturing process of the electromagnetic wave shielding structure 320 of FIG. 12 according to various embodiments of the disclosure.

Herein below, with reference to FIGS. 11-13D, the electromagnetic wave shielding structure 320 according to another embodiment will be described.

An electronic device 2 according to another embodiment of the disclosure is substantially the same in configuration as the electronic device 1 according to the embodiment of the disclosure shown in FIGS. 1 to 4D, so that redundant description will be omitted. Hereinafter, the electromagnetic wave shielding structure 320 which differs from the electronic device 1 according to an embodiment of the disclosure will be mainly described.

Specifically, the electronic device 2 includes the printed circuit board 10, the antenna module 20 mounted on the printed circuit board 10, and the electromagnetic wave shielding structure 320 surrounding the side surfaces of the antenna module 20.

The printed circuit board 10 and the antenna module 20 illustrated in FIGS. 11 to 13D can be the same configurations as the printed circuit board 10 and the antenna module 20 illustrated in FIGS. 1 through 4D.

The electromagnetic wave shielding structure 320 includes a shield frame 321 surrounding the side surface 2203 of the antenna substrate 220, a connection part 322 connecting the upper end portion of the shield frame 321 and the first ground pattern 2221, and an adhesive portion 323 to which the lower end of the shield frame 321 is coupled.

The adhesive portion 323 of the electromagnetic wave shielding structure 320 may be formed along the ground pad 12 of the printed circuit board 10 on which the antenna module 20 is mounted, and formed on the upper surface of the ground pad 12.

The adhesive portion 323 can be made of solder cream.

The solder cream constituting the adhesive portion 323 may be referred to as a second solder cream (323). Therefore, the adhesive portion 323 and the second solder cream 323 may be interpreted to refer to the same configuration, and for convenience of description, the adhesive portion 323 and the second solder cream 323 may be used interchangeably.

The adhesive portion 323 can be formed as the second solder cream 323 is applied on the ground pad 12 along the ground pad 12.

The adhesive portion 323 may be formed together with the first solder cream 14 by applying the second solder cream 323 on the ground pad 12 in a process of applying the first solder cream 14 to the upper surface of the printed circuit board 10.

The second solder cream 323 dispensed on the ground pad 12 can be applied on the upper surface of the ground pad 12 by the mask 13 of the printed circuit board 10 without deviating from the ground pad 12.

The second solder cream 323 can be dispensed through the nozzle 1216 of the material dispensing apparatus 1200.

The shield frame 321 may be made of a conductive metal that is attached to the adhesive portion 323 and surrounds the side surface 2203 of the antenna substrate 220.

The shield frame 321 may be the same configuration as the shield frame 311 illustrated in FIGS. 1 through 4D.

The lower end portion of the shield frame 321 may be attached to the adhesive portion 323 by soldering to the second solder cream 323 constituting the adhesive portion 323 through reflow.

In addition, the electromagnetic wave shielding structure 320 includes the connection part 322 which connects the upper portion of the shield frame 321 and the first ground pattern 2221.

The connection part 312 may be made of a conductive material having a predetermined viscosity, and the connection part 312 may have the same configuration as the connection part 312 shown in FIGS. 1 through 4D.

Herein below, with reference to FIGS. 13A through 13D, the process of manufacturing the electromagnetic wave shielding structure 320 according to an embodiment will be described sequentially.

Figure 13A:
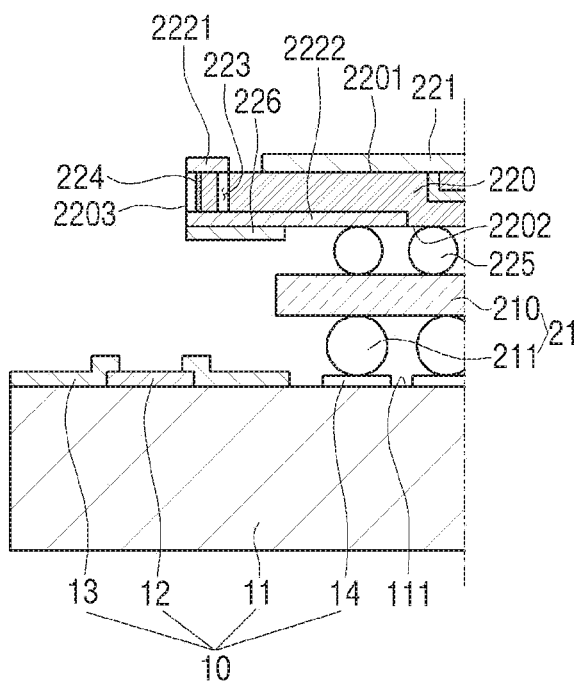
FIGS. 13A, 13B, 13C, and 13D are sectional views illustrating a manufacturing process of the electromagnetic wave shielding structure of FIG. 12 according to various embodiments of the disclosure.

Referring to FIG. 13A, the antenna module 20 is coupled to the printed circuit board 10.

The printed circuit board 10 and the antenna module 20 can be coupled as the plurality of solder balls 211 disposed at a lower portion of the radio frequency integrated circuit 21 and the plurality of first solder creams 14 of the printed circuit board 10 are soldered.

Figure 13B:
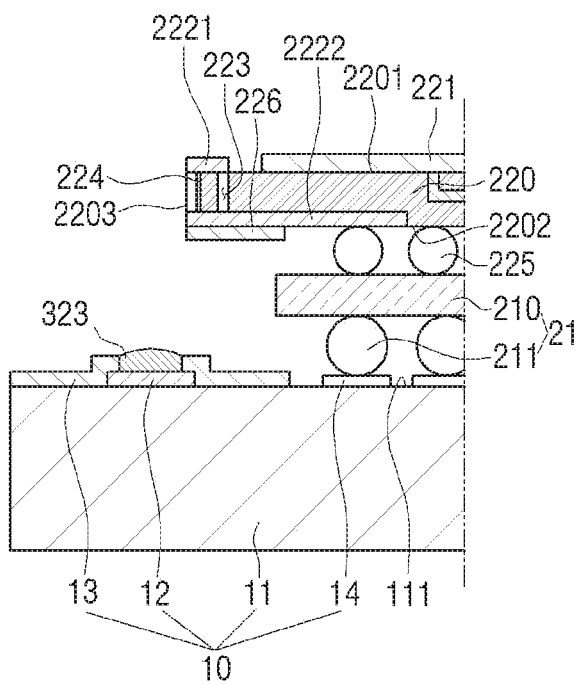

Referring to FIG. 13B, the adhesive portion 323 is formed by dispensing the second solder cream 323 on the ground pad 12 along with the ground pad 12.

The second solder cream 323 constituting the adhesive portion 323 can be dispensed onto the upper surface of the ground pad 12 through the nozzle 1216 moving along a predetermined path.

By applying the plurality of first solder creams 14 on the printed circuit board 10 through the nozzle 1216 of the material dispensing apparatus 100 and the second solder cream 323 on the ground pad 12, the antenna module 20 can be coupled to the printed circuit board 10.

Figure 13C:
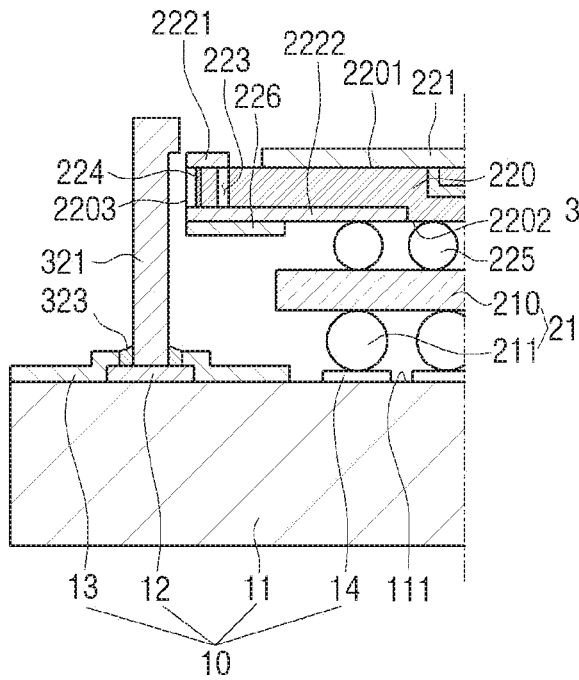

Referring to FIG. 13C, the shield frame 321 is attached to the printed circuit board 10.

After the lower end of the shield frame 321 is seated on the adhesive portion 323 and the lower end of the shield frame 321 is soldered to the adhesive portion 323 through the reflow, the shield frame 321 can be coupled to the printed circuit board 10.

Figure 13D:
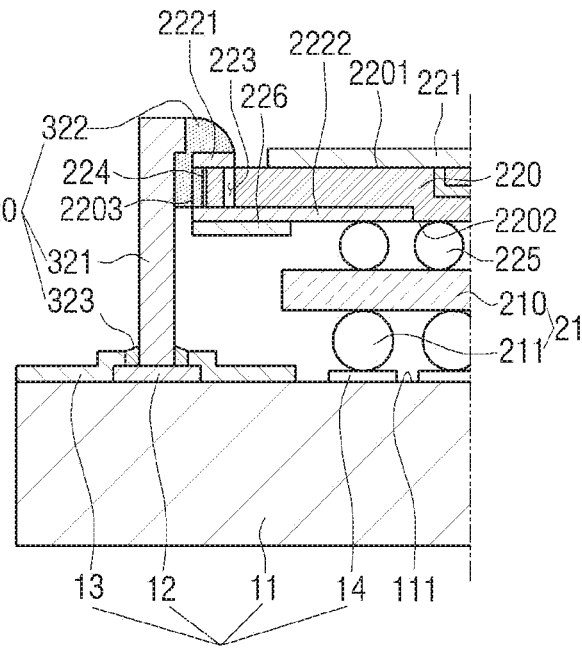

Referring to FIG. 13D, the connection part 322 is formed by dispensing a conductive material having a predetermined viscosity on the first ground pattern 2221.

The conductive material constituting the connection part 322 can be dispensed on the upper surface of the first ground pattern 2221 through the nozzle 1216 which moves along the predetermined path.

As described above, the material dispensing apparatus 1200 may include a plurality of nozzles 1216, and the adhesive portion 323 may be formed through a nozzle connected to the storage chamber in which the solder cream is stored. The connection part 322 can be configured through a separate nozzle connected to the storage chamber in which a conductive material is stored.

Figure 14:
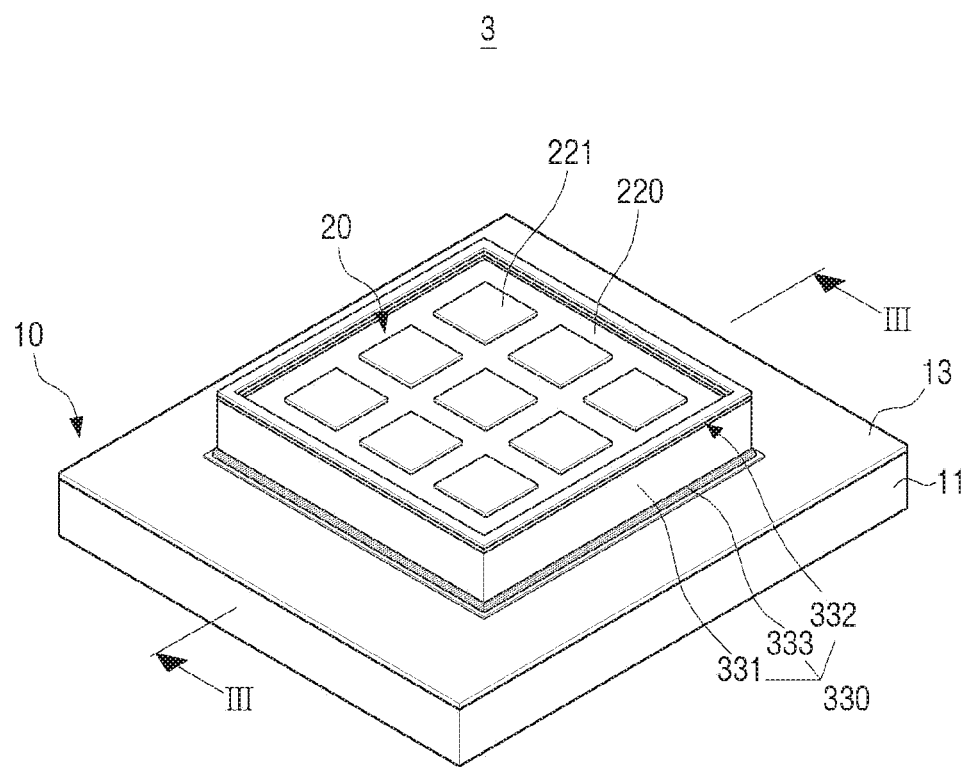
FIG. 14 is a perspective view illustrating the electromagnetic wave shielding structure of the electronic device according to an embodiment of the disclosure.

FIG. 14 is a perspective view illustrating the electromagnetic wave shielding structure 330 of the electronic device 3 according to an embodiment of the disclosure.

Figure 15:
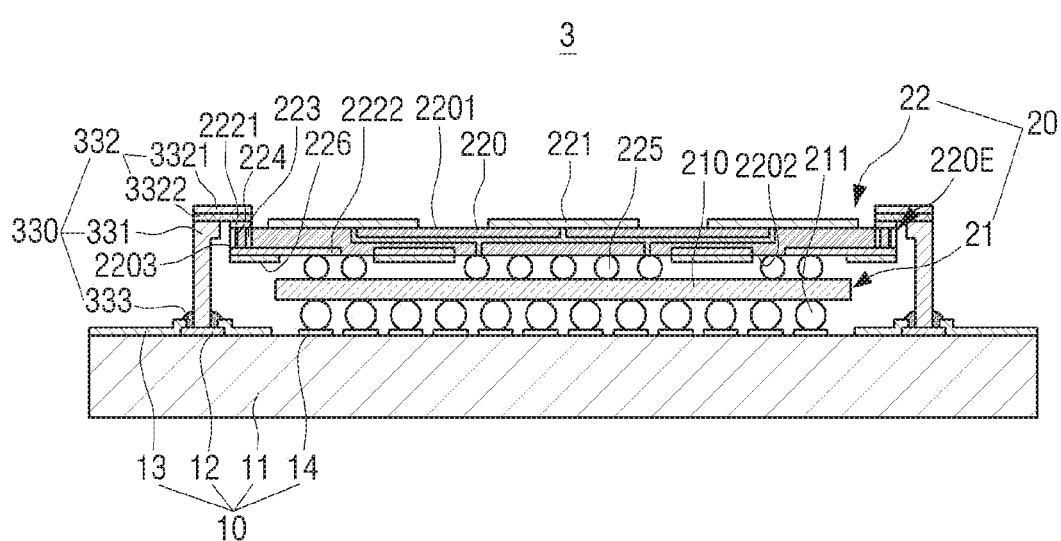
FIG. 15 is a sectional view of an electronic device which is cut along III-III line as illustrated in FIG. 14 according to an embodiment of the disclosure.

FIG. 15 is a sectional view of an electronic device 3 which is cut along III-III line as illustrated in FIG. 14 according to an embodiment of the disclosure.

Figure 16A:
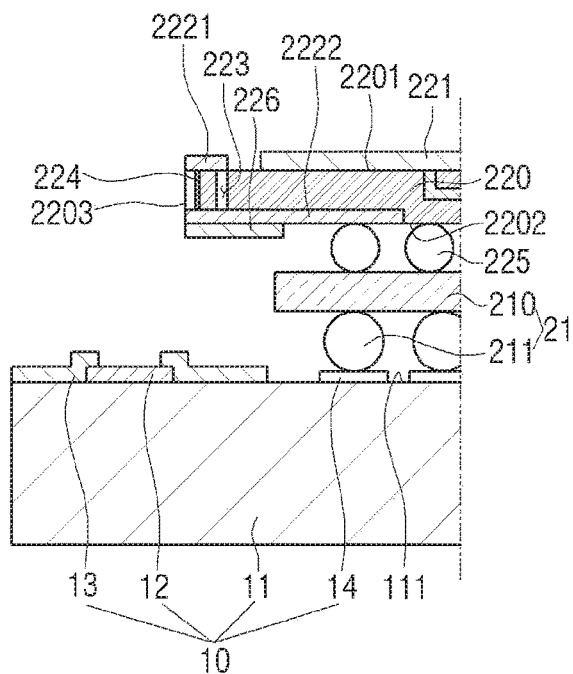
FIGS. 16A, 16B, 16C, and 16D are sectional views illustrating a manufacturing process of the electromagnetic wave shielding structure of FIG. 15 according to various embodiments of the disclosure.
Figure 16B:
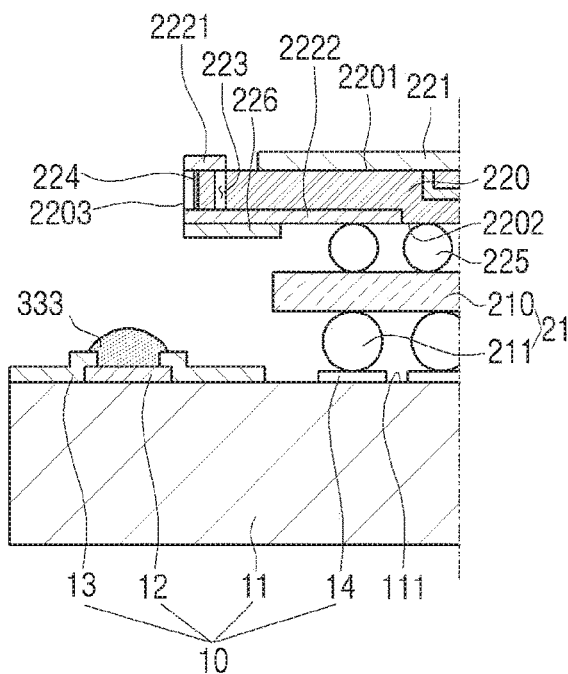
Figure 16C:
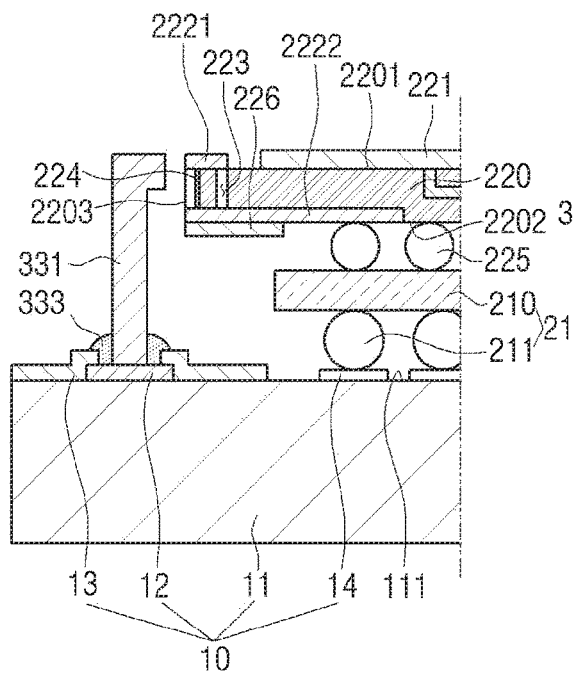
Figure 16D:
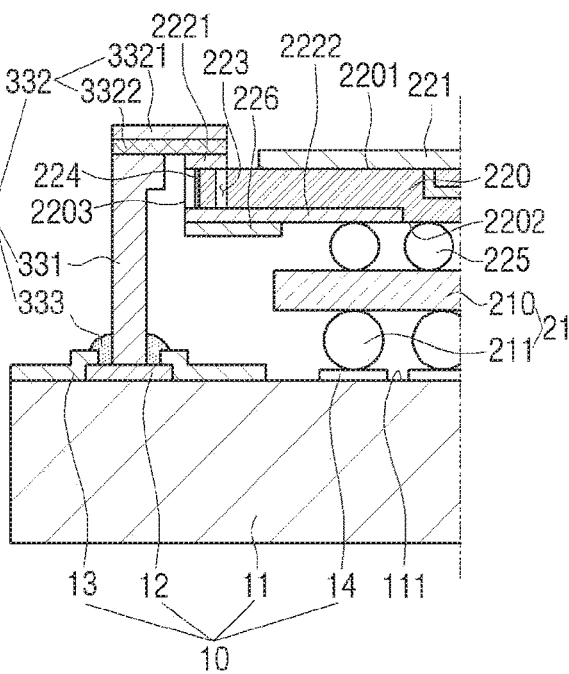

FIGS. 16A, 16B, and 16D are sectional views illustrating a manufacturing process of the electromagnetic wave shielding structure 330 of FIG. 15 according to various embodiments of the disclosure.

Herein below, with reference to FIGS. 14 to 16D, the electromagnetic wave shielding structure 330 according to still another embodiment will be described.

An electronic device 3 according to still another embodiment of the disclosure is substantially the same as the electronic device 1 according to the embodiment of the disclosure shown in FIGS. 1 to 4D, and an electromagnetic wave shielding structure 330 different from the electronic device 1 according to an embodiment of the disclosure will be described below.

The printed circuit board 10 and the antenna module 20 illustrated in FIGS. 14-16 may be the same as the printed circuit board 10 and the antenna module 20 illustrated in FIGS. 1 to 4D.

The electromagnetic wave shielding structure 330 includes the shield frame 331 surrounding the side surface 2203 of the antenna substrate 220, a connection part 332 connecting the upper end portion of the shield frame 331 and the first ground pattern 2221, and an adhesive portion 333 to which a lower end portion of the shield frame 331 is coupled.

The shield frame 331 and the adhesive portion 333 may be the same configurations as the shield frame 311 and the adhesive portion 313 as illustrated in FIGS. 1 to 4D.

The connection part 332 of the electromagnetic wave shielding structure 330 according to another embodiment of the disclosure may be composed of a conductive tape (332) connecting the upper end of the shield frame 331 and the first ground pattern 2221.

Therefore, the connection part 332 can be referred to as a conductive tape 332.

The conductive tape 332 includes a conductive shielding layer 3321 and a conductive adhesive layer 3322 bonded to the lower portion of the conductive shielding layer 3321.

The shield frame 331 and the side surface 2203 of the antenna substrate 220 can be disposed to be apart from each other.

As the conductive adhesive layer 3322 of the conductive tape 332 is attached to the upper end of the shield frame 331 and the first ground pattern 2221, the shield frame 331 and the first ground pattern 2221 can be connected.

The shield frame 331 and the antenna substrate 220 are shielded by the conductive tape 332, and the radio frequency integrated circuit 21 disposed between the antenna substrate 220 and the printed circuit board 10 may be shielded.

The manufacturing process of the electromagnetic wave shielding structure 330 as illustrated in FIGS. 16A, 16B, and 16C is the same as the manufacturing process of the electromagnetic wave shielding structure 310 of FIGS. 4A to 4C.

After the shield frame 331 is attached to the adhesive portion (or adhesive layer) 333, the upper end of the shield frame 331 and the first ground pattern 2221 are covered with the conductive tape 332 as illustrated in FIG. 16D, the upper end of the shield frame 331 is connected to the first ground pattern 2221.

As described above, the electromagnetic wave shielding structure 330 according to another embodiment of the disclosure connects the shield frame 331 and the first ground pattern 2221 through the attachment of the conductive tape 332, and the radio frequency integrated circuit 21 can be shielded in a simple manner.

Figure 17:
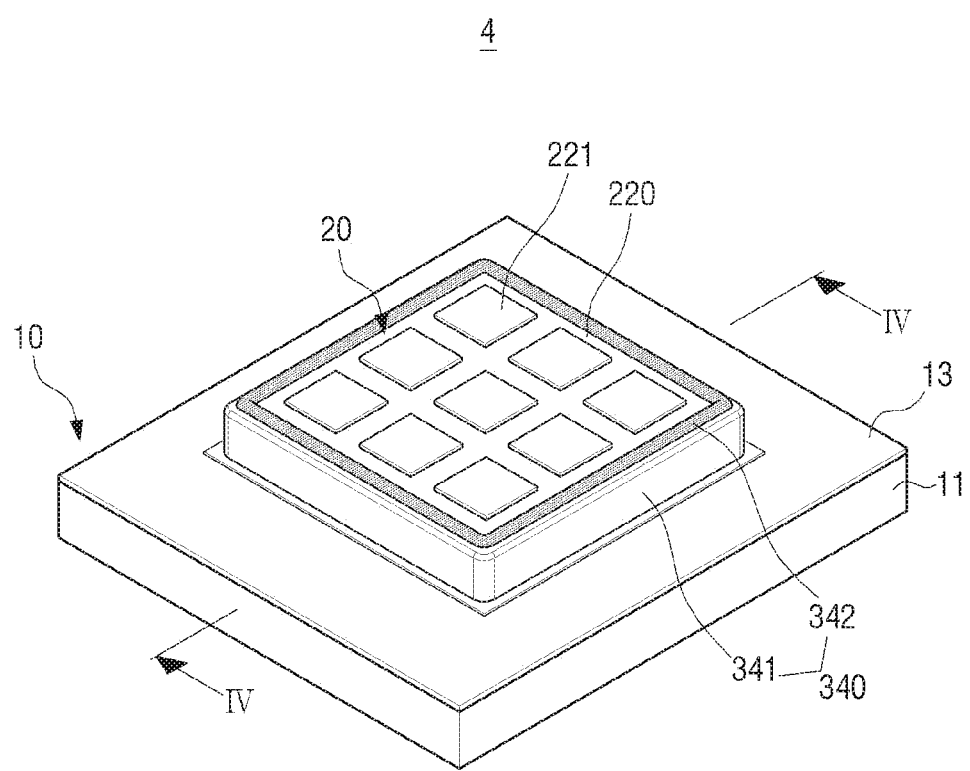
FIG. 17 is a perspective view illustrating the electromagnetic wave shielding structure of the electronic device according to an embodiment of the disclosure.

FIG. 17 is a perspective view illustrating the electromagnetic wave shielding structure 340 of the electronic device 4 according to an embodiment of the disclosure.

Figure 18:
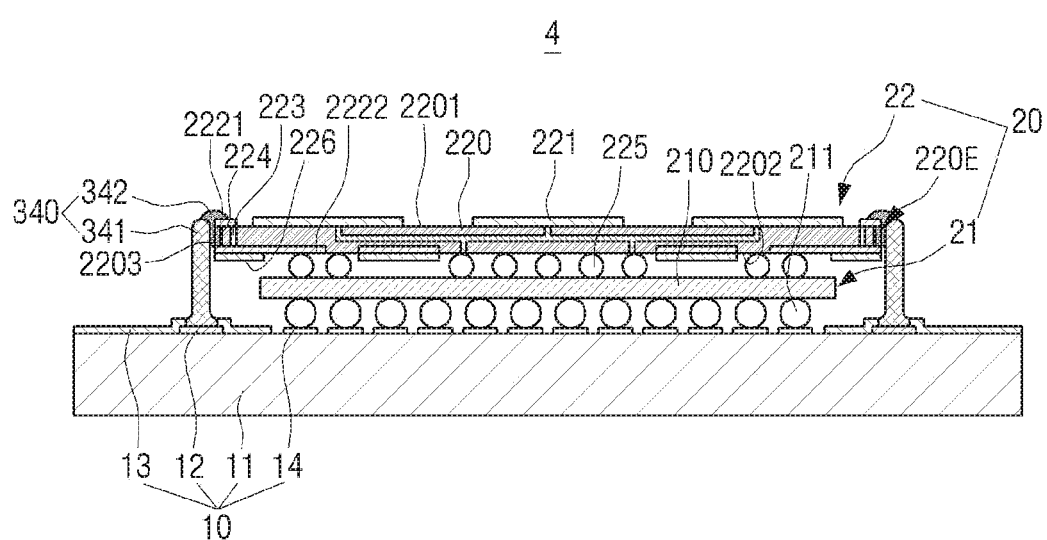
FIG. 18 is a sectional view of an electronic device which is cut along IV-IV line as illustrated in FIG. 17 according to an embodiment of the disclosure.

FIG. 18 is a sectional view of an electronic device 4 which is cut along IV-IV line as illustrated in FIG. 17 according to an embodiment of the disclosure.

Figure 19A:
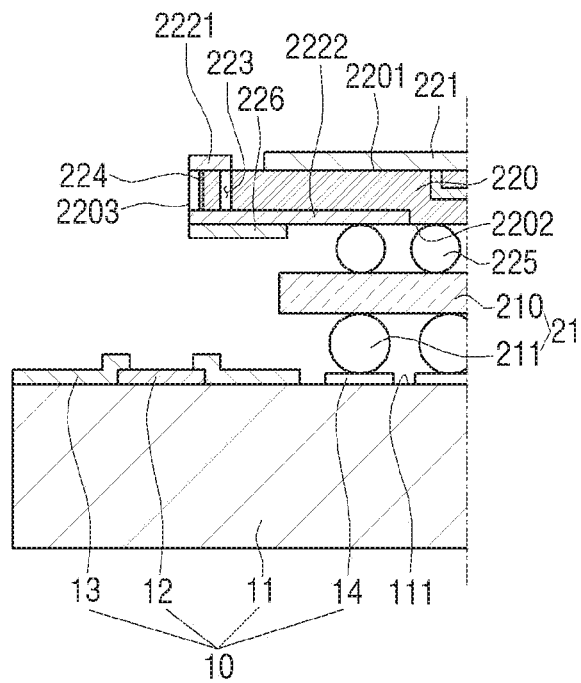
FIGS. 19A, 19B, and 19C are sectional views illustrating a manufacturing process of the electromagnetic wave shielding structure of FIG. 18 according to various embodiments of the disclosure.
Figure 19B:
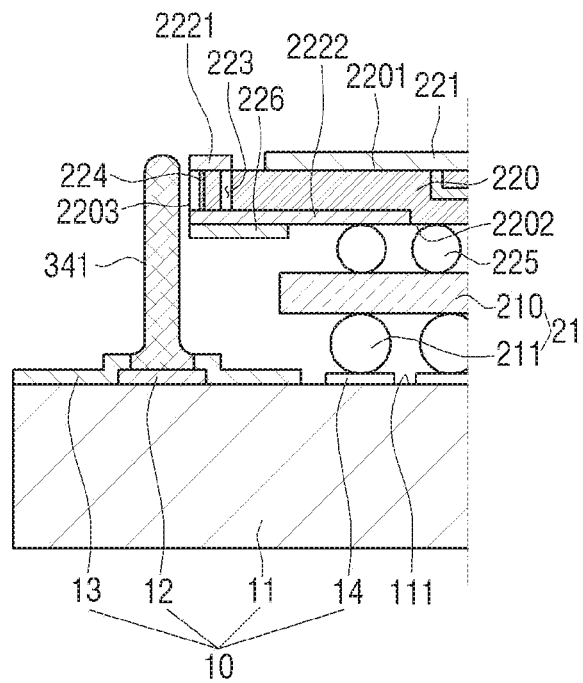
Figure 19C:
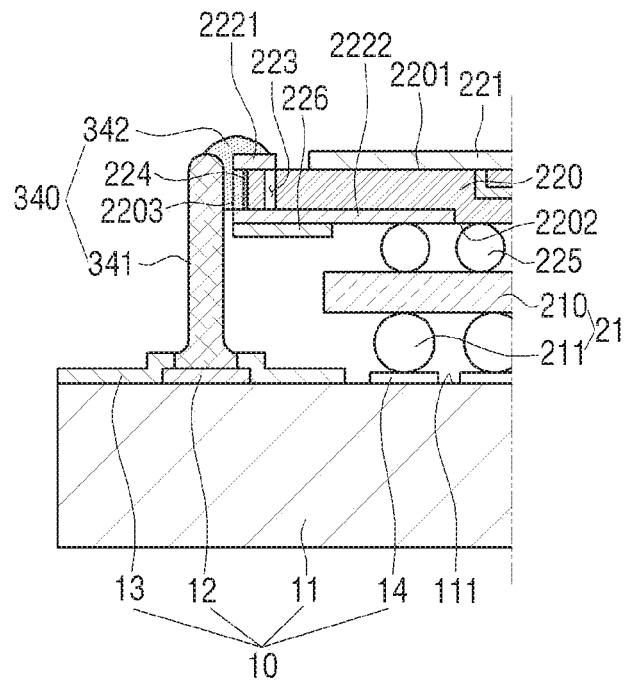

FIGS. 19A, 19B, and 19C are sectional views illustrating a manufacturing process of the electromagnetic wave shielding structure 340 of FIG. 18 according to various embodiments of the disclosure.

As illustrated in FIGS. 17 through 19C, an electromagnetic wave shielding structure 340 includes a shielding dam 341 and a connection part 342.

The shield frame 311 and the adhesive portion 313 as illustrated in FIGS. 1 to 4D can be replaced with the shielding dam 341 formed on the ground pad 12.

The shielding dam 341 can be made of a conductive material having predetermined viscosity that can shield electromagnetic wave.

The shielding dam 341 may be formed to have a height corresponding to the height of the antenna module 20 so as to surround the side surface of the antenna module 20. The upper end of the shielding dam 341 may be disposed to be adjacent to the edge portion 220E of the antenna substrate 220.

Therefore, it is desirable that the height of the shielding dam 341 is the same as the height of the antenna module 20.

The height of the shielding dam 341 can be corresponding to the distance from the upper surface of the printed circuit board 10 to the upper surface 2201 of the antenna substrate 220.

The shielding dam 341 may have a shape corresponding to the shape of the shield frame 311 shown in FIGS. 1 to 4D and may be a rectangular frame surrounding the side surface of the antenna module 20.

The shielding dam 341 can be formed as a conductive material having predetermined viscosity is dispensed to the ground pad 12.

As illustrated in FIGS. 17 to 19C, the shielding dam 341 must have a height corresponding to the height of the antenna module 20, so it is desirable that the conductive material constituting the shielding dam 341 has a viscosity which maintains a predetermined height without being flown while the material is being dispensed on the ground pad 12.

For example, it is desirable that viscosity of conductive material constituting the shielding dam 341 is 1,000 cps to 800,000 cps.

The conductive material constituting the shielding dam 341 may be the same as the conductive material constituting the connection part 342 and the conductive material constituting the shielding dam 341 may be a material having a viscosity greater than that of the conductive material constituting the connection part 342.

The conductive material constituting the shielding dam 341 may include a conductive filler and a binder resin.

If the viscosity of the conductive material constituting the shielding dam 341 is sufficiently high, after the shielding dam 341 is formed on the upper surface of the printed circuit board 10, when the printed circuit board 10 is reversed without hardening, the shielding dam 341 which was formed on the upper surface of the printed circuit board 10 ahead will not be flowing down and maintain a shape as it is. Therefore, entire work process can be proceeded rapidly.

The shielding dam 341 can be disposed to be apart from the side surface 2203 of the antenna substrate 220.

The electromagnetic wave shielding structure 340 includes the connection part 342 connecting the upper end of the shielding dam 341 and the first ground pattern 2221.

The connection part 342 may be composed of a conductive material having a predetermined viscosity, and the connection part 342 may be the same configuration as the connection part 312 as illustrated in FIGS. 1 to 4D.

Through this, the connection part 342 can fill the gap between the upper end of the shielding dam 341 and the side surface 2203 of the antenna substrate 220 and connect the shielding dam 341 and the plating part 224.

Accordingly, the electromagnetic wave shielding structure 340 may shield the radio frequency integrated circuit 21 disposed between the antenna substrate 220 and the printed circuit board 10 through the shielding dam 341 and the connection part 342.

Herein below, the process of manufacturing the electromagnetic wave shielding structure 340 will be described sequentially with reference to FIGS. 19A through 19C.

Referring to FIGS. 19A and 19B, after the antenna module 20 is coupled to the printed circuit board 10, by applying a conductive material having a predetermined viscosity along the ground pad 12, the shielding dam 341 can be formed.

The shielding dam 341 may be formed by dispensing the conductive material to a height equal to the height of the antenna module 20 through the nozzle 1218 (see FIG. 20) moving along the ground pad 12.

Referring to FIG. 19C, after the shielding dam 341 coupled to the ground pad 12 is formed, a conductive material having a predetermined viscosity is dispensed onto the first ground pattern 2221, thereby forming the connection part 342.

In the process of dispensing the conductive material to form the shielding dam 341 and the connection part 342, the shielding dam 341 and the connection part 342 can be formed by using a single nozzle, and a plurality of nozzles can form the shielding dam 341 and the connection part 342, respectively.

As described above, the electromagnetic wave shielding structure 340 according to another embodiment of the disclosure can be formed by dispensing a conductive material using a nozzle, and the electromagnetic wave shielding structure 340 can be formed through a simpler and faster process.

In addition, in the rework process as well, the shielding dam 341 composed of a conductive material can be easily separated from the printed circuit board 10.

Figure 20:
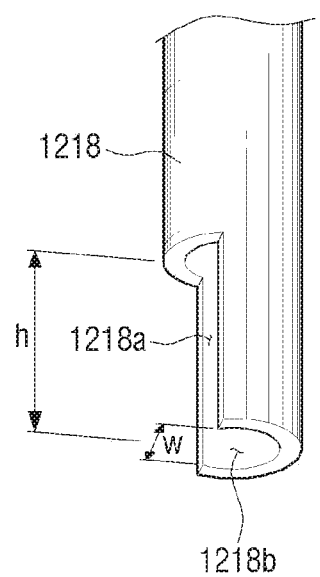
FIG. 20 is an enlarged view illustrating an end portion of a nozzle which is used in the process of manufacturing the electromagnetic wave shielding structure as illustrated in FIGS. 19A, 19B, and 19C, according to an embodiment of the disclosure.

FIG. 20 is an enlarged view illustrating an end portion of a nozzle 1218 which is used in the process of manufacturing the electromagnetic wave shielding structure 340 as illustrated in FIGS. 19A through 19C according to an embodiment of the disclosure.

The nozzle 1218 illustrated in FIG. 20 may dispense a conductive material forming the shielding dam 341 as illustrated in FIGS. 17 to 19C.

The nozzle 1218 moves along the ground pad 12 and can dispense the conductive material on the ground pad 12 to form the shielding dam 341.

The nozzle 1218 may include a side dispense outlet 1218a formed on a lower side surface and a bottom dispense outlet 1218b can be formed on a bottom surface of the lower end.

The nozzle 1218 dispenses the conductive material through the side dispense outlet 1218a and the bottom dispense outlet 1218b while moving in a direction opposite to the moving direction of the nozzle 1218 in a state in which the side dispense outlet 1218a is disposed.

The side dispense outlet 1218a can be a rectangular shape having a width (w) and height (h).

The width and height of the shielding dam 341 can correspond to the width (w) and height (h) of the side dispense outlet 1216a.

Therefore, it is desirable that the height h of the side dispense outlet 1218a corresponds to the height of the antenna module 20 and may correspond to the distance from the upper surface of the printed circuit board 10 to the upper surface 2201 of the antenna substrate 220.

In addition, the width (w) of the side dispense outlet 1218a can correspond to the width of the ground pad 12.

The structure of the aforementioned nozzle 1217 can change diversely according to a structure to be form through the dispensed material.

Figure 21:
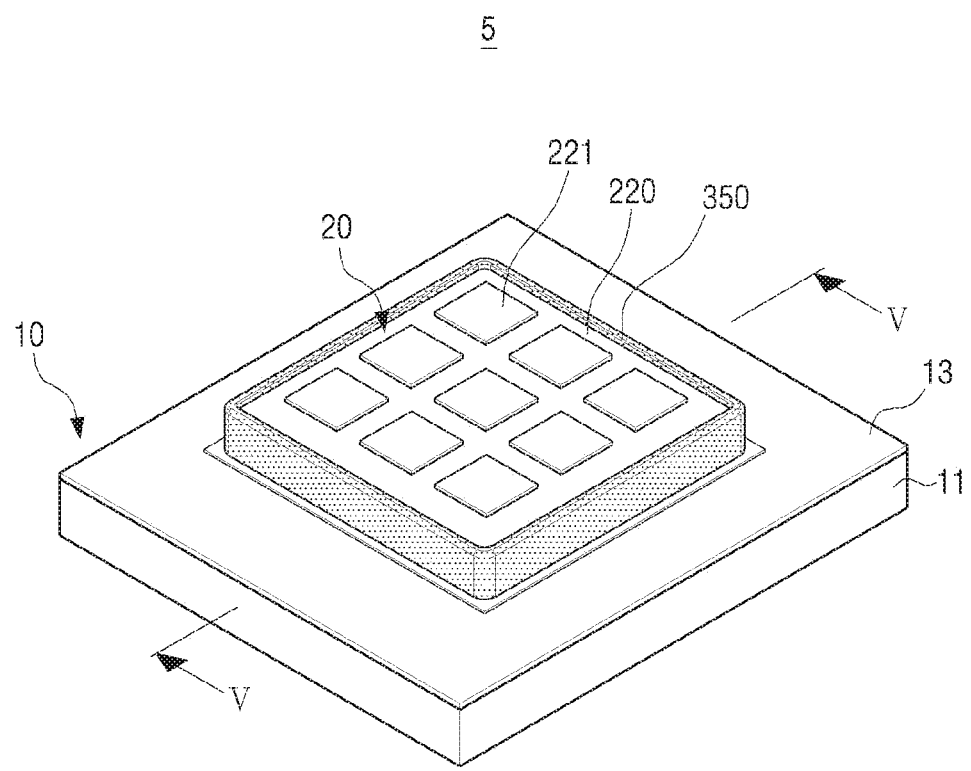
FIG. 21 is a perspective view illustrating the electromagnetic wave shielding structure of the electronic device according to an embodiment of the disclosure.

FIG. 21 is a perspective view illustrating the electromagnetic wave shielding structure 350 of the electronic device 5 according to an embodiment of the disclosure.

Figure 22:
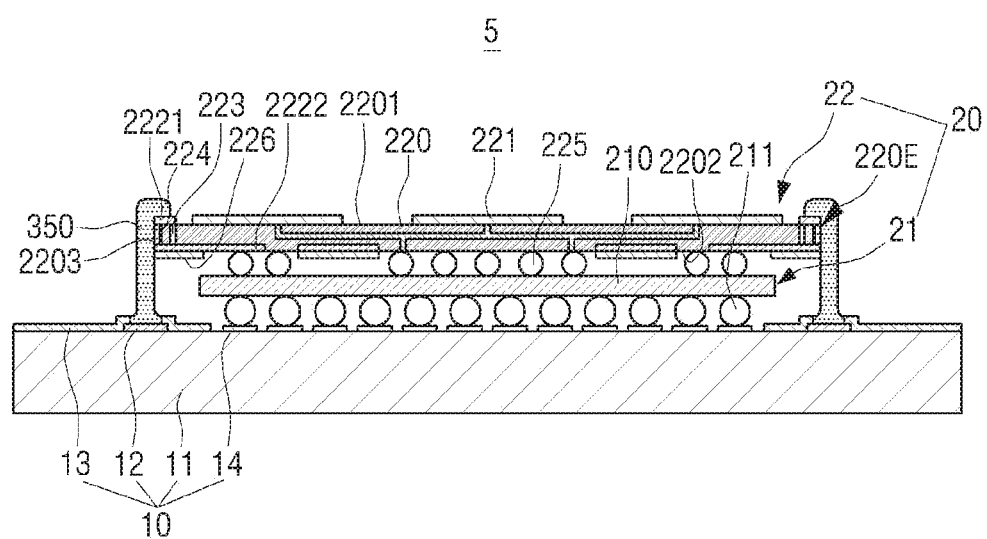
FIG. 22 is a sectional view of an electronic device which is cut along V-V line as illustrated in FIG. 21 according to an embodiment of the disclosure.

FIG. 22 is a sectional view of an electronic device 5 which is cut along V-V line as illustrated in FIG. 21 according to an embodiment of the disclosure.

Figure 23A:
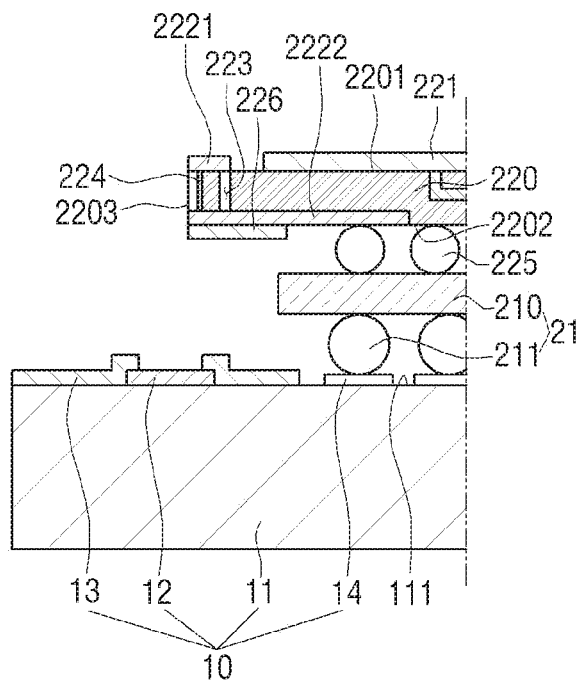
FIGS. 23A and 23B are sectional views illustrating a manufacturing process of the electromagnetic wave shielding structure of FIG. 22 according to various embodiments of the disclosure.
Figure 23B:
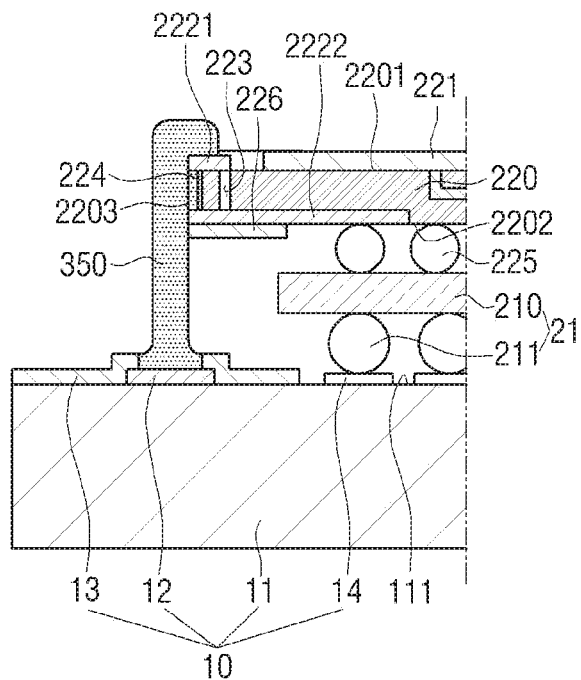

FIGS. 23A and 23B is a sectional view illustrating a manufacturing process of the electromagnetic wave shielding structure 350 of FIG. 22 according to various embodiments of the disclosure.

Referring to FIGS. 21 to 23B, the electromagnetic wave shielding structure 350 includes the shielding dam (350) composed of a conductive material that is dispensed on the ground pad 12 to surround the side portion 2203 of the antenna substrate 220, and covers the first ground pattern 2221.

The shield frame 311, the connection part 312 and the adhesive portion 313 shown in FIGS. 1 to 4D can be replaced with the shielding dam 350 formed on the ground pad 12, and the shielding dam 350 may be a structure in which the shielding dam 341 and the connection part 342 shown in FIGS. 17 to 19C are integrally formed.

The electromagnetic wave shielding structure 350 according to still another embodiment is configured as a single shielding dam 350, and the electromagnetic wave shielding structure 350 can be referred to as the shielding dam 350.

The shielding dam 350 may be made of a conductive material having a predetermined viscosity capable of shielding electromagnetic waves, and may be made of the same material as the shielding dam 341 shown in FIGS. 17 to 19C.

The shielding dam 350 may be in the shape of a wall surrounding the side surface of the antenna module 20 and the lower portion of the shielding dam 350 may be coupled to the ground pad 12, and the upper portion of the shielding dam 350 may cover the first ground pattern 2221.

Through this, the shielding dam 350 can shield the radio frequency integrated circuit 21 disposed between the antenna substrate 220 and the printed circuit board 10.

To do this, it is desirable that the height of the shielding dam 350 is greater than the height of the antenna module 20.

The shielding dam 350 can be connected to the plating part 224 by filling the concave groove 2203G of the antenna substrate 220.

The shielding dam 350 can be formed as the conductive material having a predetermined viscosity is dispensed on the ground pad 12.

Since the shielding dam 350 must have a height enough to cover the first ground pattern 2221, it is desirable that the conductive material constituting the shielding dam 350 does not flow down while being dispensed onto the ground pad 12 and have a viscosity capable of achieving a constant height.

For example, viscosity of a conductive material constituting the shielding dam 350 is preferably 1,000 cps to 800,000 cps.

Referring to FIGS. 23A and 23B, after the antenna module 20 is coupled to the printed circuit board 10, a conductive material having a predetermined viscosity is dispensed along the ground pad 12 and the shielding dam 350 can be formed.

The shielding dam 341 may be formed by dispensing a conductive material to a height at which the nozzle 1219 (see FIGS. 24A and 24B) moving along the ground pad 12 covers the first ground pattern 2221.

Figure 24A:
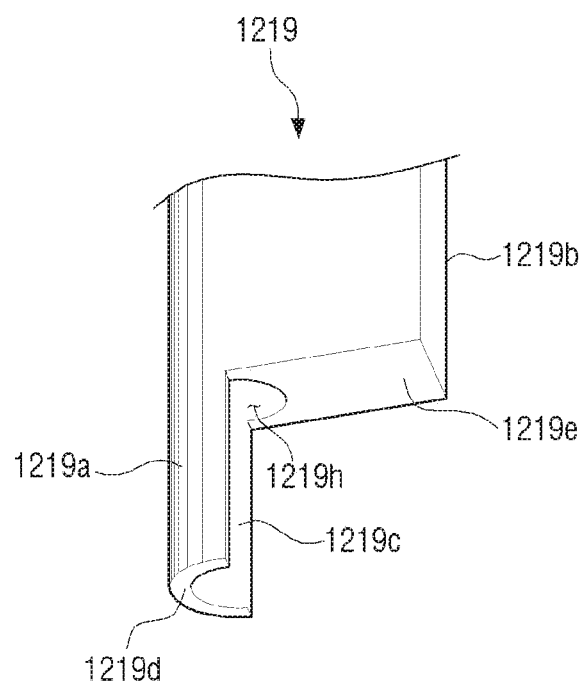
FIG. 24A is an enlarged view illustrating an end portion of a nozzle which is used in the process of manufacturing the electromagnetic wave shielding structure as illustrated in FIGS. 23A and 23B, according to an embodiment of the disclosure.

FIG. 24A is an enlarged view illustrating an end portion of a nozzle 1219 which is used in the process of manufacturing the electromagnetic wave shielding structure 350 as illustrated in FIGS. 23A and 23B according to an embodiment of the disclosure.

Figure 24B:
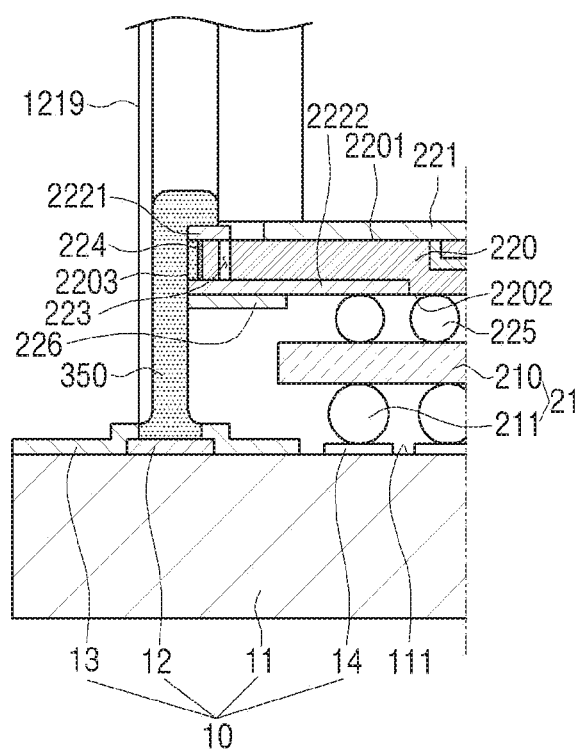
FIG. 24B is a sectional view illustrating a process of forming a shielding dam through the nozzle as illustrated in FIG. 24A according to an embodiment of the disclosure.

FIG. 24B is a sectional view illustrating a process of forming a shielding dam 350 through the nozzle 1219 as illustrated in FIG. 24A according to an embodiment of the disclosure.

Referring to FIGS. 24A and 24B, the nozzle 1219 forming the shielding dam 350 has a dispense outlet 1219h through which a conductive material is dispensed, and a side guide portion 1219a and an upper surface guide portion 1219b are extensively formed.

The side guide portion 1219a is formed to extend downward along the longitudinal direction of the nozzle 1219 from the lower end of the dispense outlet 1219h. The side guide portion 1219a guides the dispensing of the conductive material so that the conductive material dispensed from the dispense outlet 1219h can be dispensed to a height corresponding to the upper surface 2201 of the antenna substrate 220.

An inner circumference 1219c of the side guide portion 1219a can be formed to be a curve, but is not limited thereto and can be formed to be a flat surface.

The lower end 1219d of the side guide portion 1219a is disposed to be adjacent to the ground pad 12 in a process of dispensing the conductive material.

The lower end 1219d of the side guide portion 1219a is spaced apart from the upper surface of the ground pad 12 by a predetermined distance so that the nozzle 1219 does not interfere with the ground pad 12 when the nozzle 1219 moves along the movement path. To do this, when the nozzle 1219 is set at the dispense position, the height in the Z-axis direction is set in consideration of the gap between the lower end 1219d of the side guide portion 1219b and the upper surface of the ground pad 12.

The upper guide portion 1219b is extensively formed in a parallel direction from the dispense outlet 1219h.

The upper surface guide portion 1219b is disposed such that a lower surface 1219e of the upper surface guide portion 1219b faces the upper surface 2201 of the antenna substrate 220.

In addition, internal diameter of the side guide portion 1219a is smaller than internal diameter of the dispense outlet 1219h.

In the process that the nozzle 1219 dispenses a conductive material, a part of the 1219h is disposed to face an upper surface of the first ground pattern 2221.

Referring to FIG. 24B, the conductive material dispensed from the dispense outlet 1219h is dispensed downward along the side guide portion 1219a, so as to be dispensed up to the height corresponding to the height of the side guide portion 1219a from the ground pad 12.

Thereafter, the conductive material dispensed from the dispense outlet 1219h may be dispensed until at least a portion of the upper surface of the first ground pattern 2221 is covered.

In the process of covering the upper surface of the first ground pattern 2221 with the conductive material dispensed from the dispense outlet 1219h, even when the nozzle 1219 moves, the conductive material can be dispensed in a uniform shape to cover the upper surface of the first ground pattern 2221 by the upper portion guide portion 1219b.

As described above, the electromagnetic wave shielding structure 350 according to another embodiment of the disclosure has an advantage that it can be constituted only by a simple process of dispensing the conductive material onto the ground pad 12 through the nozzle 1219.

Figure 25:
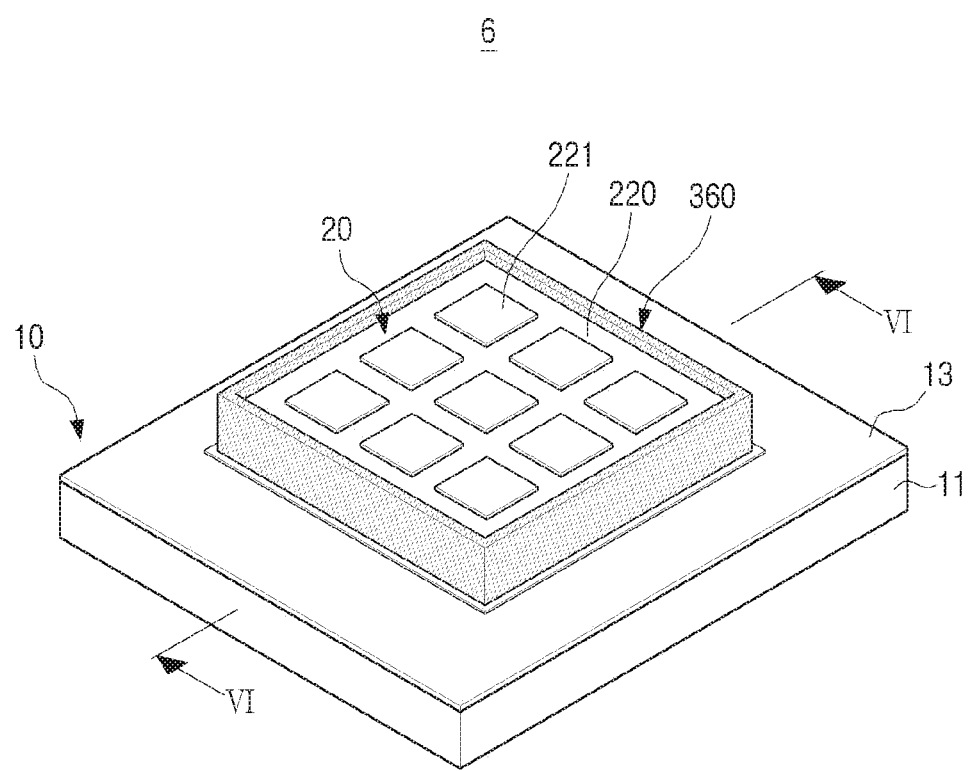
FIG. 25 is a perspective view illustrating the electromagnetic wave shielding structure of the electronic device according to an embodiment of the disclosure.

FIG. 25 is a perspective view illustrating the electromagnetic wave shielding structure 360 of the electronic device 6 according to an embodiment of the disclosure.

Figure 26:
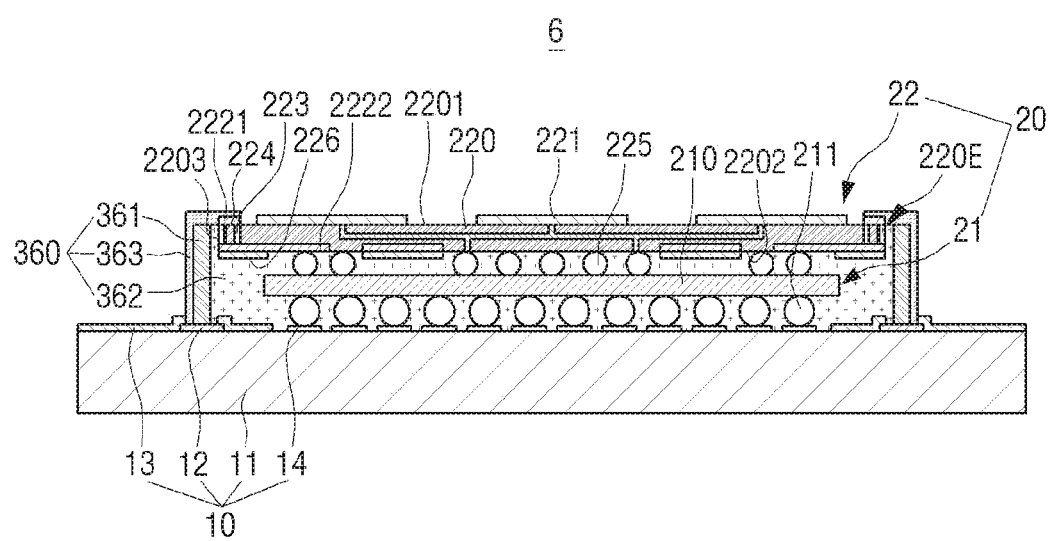
FIG. 26 is a sectional view of the electronic device which is cut along the VI-VI line of FIG. 25 according to an embodiment of the disclosure.

FIG. 26 is a sectional view of the electronic device 6 which is cut along the VI-VI line of FIG. 25 according to an embodiment of the disclosure.

FIGS. 27A, 27B, 27C, and 27D are sectional views illustrating a manufacturing process of the electromagnetic wave shielding structure 360 of FIG. 26 according to various embodiments of the disclosure.

An electronic apparatus 6 according to another embodiment of the disclosure is substantially the same as the electronic apparatus 1 according to the embodiment of the disclosure shown in FIGS. 1 to 4D, and an electromagnetic wave shielding structure 360 different from the electronic device 1 according to the embodiment of the disclosure will be described below.

Specifically, the electronic device 6 includes the printed circuit board 10, the antenna module 20 mounted on the printed circuit board 10, and the electromagnetic wave shielding structure 360 surrounding the side surfaces of the antenna module 20.

The printed circuit board 10 and the antenna module 20 as illustrated in FIGS. 25 to 27D may be the same as the printed circuit board 10 and the antenna module 20 as illustrated in FIGS. 1 through 4D.

The electromagnetic wave shielding structure 360 includes an insulating dam 361 formed of an insulating material which is dispensed on the ground pad 12 and surrounds the side surface of the antenna substrate 220, an insulating member 362 made of an insulating material filled inside the insulating dam 361, and a shielding film 363 made of a conductive material covering the outer surface of the insulating dam 361 and connecting the first ground pattern 2221 to the ground pad 12.

The insulating am 361 can be formed by a nozzle having the same shape as the nozzle 1218 (see FIG. 20) provided in the material dispensing apparatus 1200.

The nozzle 1218 can dispense the insulating material onto the ground pad 12. The insulating material dispensed from the nozzle 1218 may have a predetermined viscosity while having electric insulation. It would be sufficient that the viscosity of the insulating material constituting the insulating dam 361 is 20,000 cps to 5,000,000 cps so that the insulating material dispensed from the nozzle 1218 can maintain a predetermined dam shape after dispense.

It is desirable that the width of the insulating dam 361 is smaller than the width of the ground pad 12.

The insulating member 362 can be formed by dispensing the insulating material to the inside of the insulating dam 361 by a nozzle having the same shape as the nozzle 1217 (see FIG. 10B) provided in the material dispensing apparatus 1200. The insulating material constituting the insulating member 362 may be the same material as the insulating material constituting the insulating dam 361 described above.

However, since the insulating member 362 must be filled with the insulating material in the space surrounded by the insulating dam 361, it is preferable that the insulating member 362 has greater fluidity than the insulating material constituting the insulating dam 361. For this, it is desirable that the viscosity of the insulating material constituting the insulating member 362 is 100 cps to 30,000 cps.

The insulating material constituting the insulating dam 361 and the insulating member 362 may be a thixotropic material having fluidity or a phase change (thermoplastic, thermosetting) material.

The thixotropic material may include synthetic fine silica, bentonite, fine particle surface treated calcium carbonate, hydrogenated castor oil, metal stoneware compound, aluminum stearate, polyamide wax, and polymeric flaxseed oils. For example, the metal stoneware compound may include aluminum stearate.

The phase change material may include polyurethane, polyurea, polyvinyl chloride, polystyrene, acrylonitrile butadiene styrene (ABS) resin, polyamide, acrylic, epoxy, silicone, and polybutylene terephthalate (PBTP).

The shielding film 363 may cover an outer side of the insulating dam 361 and connect the first ground pattern 2221 with the ground pad 12.

Specifically, the upper end of the shielding film 363 covers the side surface 2203 of the printed circuit board 220 and the first ground pattern 2221, and the lower end of the shielding film 363 is in contact with the ground pad 12.

The shielding film 363 is sprayed in a spray state by the nozzle 1410 (see FIGS. 28 and 29) of a separate material spraying device (not shown), so that the entire outer surface of the insulating dam 361 is covered.

In addition, the shielding film 363 covers the ground pattern 12 so as to be grounded to the ground pad 12, and covers the first ground pattern 2221.

The electrically conductive material constituting the shielding film 363 may be made of an electroconductive material. Such an electrically conductive material may include an electroconductive filler and a binder resin.

As the electrically conductive filler, a metal such as Ag, Cu, Ni, Al, or Sn may be used, or conductive carbon such as carbon black, a carbon nanotube (CNT), a graphite, or the like may be used. Metal coated materials such as Ag/Cu, Ag/Glass fiber and Ni/Graphite may be used or conductive polymer materials such as polypyrrole and polyaniline may be used. In addition, the electrically conductive filler may be formed of any one of a flake type, a sphere type, a rod type, and a dendritic type or a mixture thereof.

As the binder resin, a silicone resin, an epoxy resin, a urethane resin, an alkyd resin, or the like can be used. The material constituting the shielding film 150 may further contain an additive (a thickener, an antioxidant, a polymer surfactant, etc.) and a solvent (water, an alcohol, etc.)

Hereinafter, referring to FIGS. 27A through 27D, the manufacturing process of the electromagnetic wave shielding structure 360 will be described sequentially.

Figure 27A:
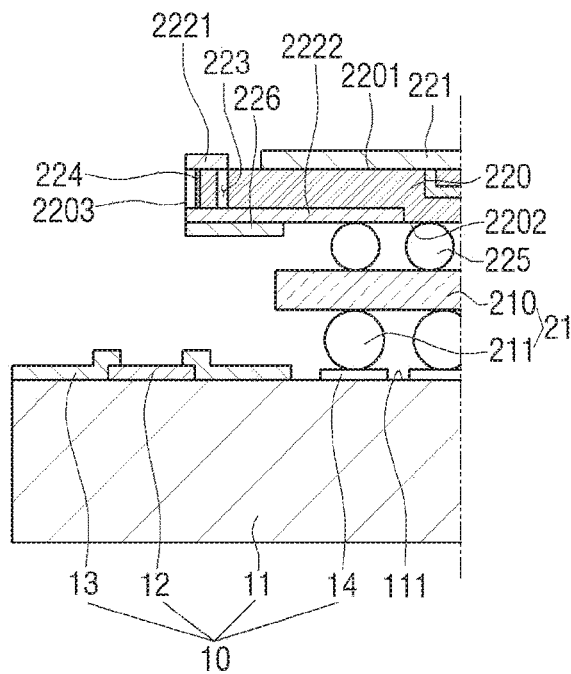
FIGS. 27A, 27B, 27C, and 27D are sectional views illustrating a manufacturing process of the electromagnetic wave shielding structure of FIG. 26 according to various embodiments of the disclosure.

As illustrated in FIG. 27A, the antenna module 20 is coupled to the printed circuit board 10.

Figure 27B:
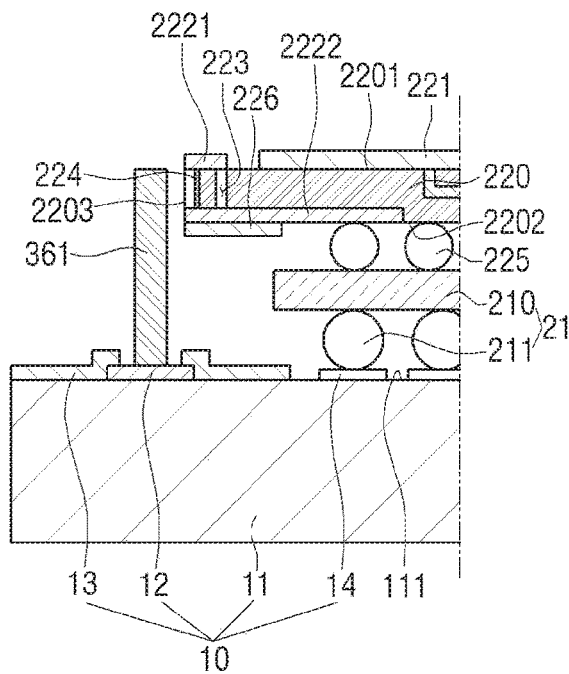

Thereafter, as shown in FIG. 27B, the insulating dam 361 is formed by dispensing an insulating material on the ground pad 12 along the ground pad 12. In this case, since the insulating material has a high viscosity of 20,000 cps to 5,000,000 cps, the insulating material dispensed from the nozzle 1217 maintains a predetermined dam shape. Further, the insulating dam 361 may be formed in the shape of a wall surrounding the side surface portion of the antenna module 20.

The insulating dam 361 may be formed to have a height corresponding to the height of the antenna module 20 so as to surround the side surface of the antenna module 20. The upper end of the insulating dam 361 may be disposed close to the edge portion 220E of the antenna substrate 220.

Therefore, it is desirable that the height of the insulating dam 361 is the same as the height of the antenna module 20.

Figure 27C:
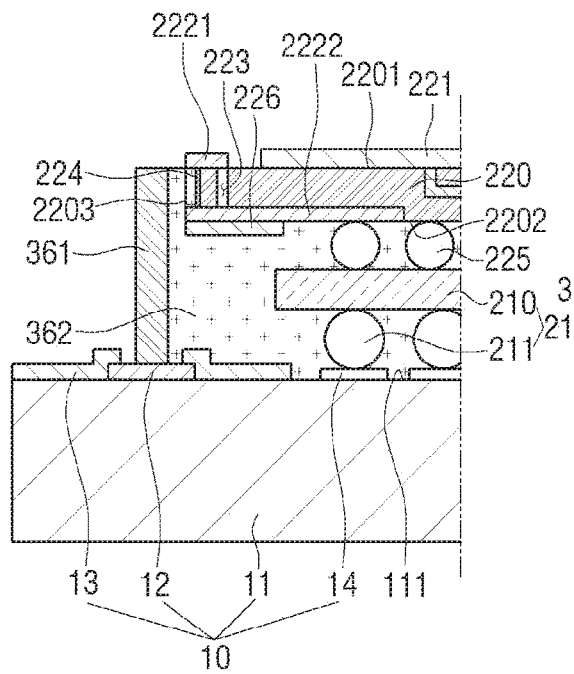

Thereafter, as shown in FIG. 27C, an insulating material is injected into the space surrounded by the insulating dam 361. The insulating material is filled in the space between the antenna substrate 220 and the printed circuit board 10 to form the insulating member 362.

Through this, the radio frequency integrated circuit 21 can be surrounded by the insulating member 362.

The insulating member 362 may be configured to fill the gap between the insulating dam 361 and the side surface 2203 of the antenna substrate 220 by adjusting the dispense amount of the insulating material to be dispensed.

Referring to FIG. 27C, the upper end of the insulating dam 361 and the upper surface 2201 of the printed circuit board 10 can be connected in a flat manner by the insulating member 362.

Specifically, the upper surface of the insulating dam 361 can be formed flat, and the upper surface of the insulating dam 361 and the upper surface of the insulating member 362 are located on the same plane, and the upper surface of the insulating dam 361 and the upper surface of the insulating member 362 may be connected without a step.

Figure 27D:
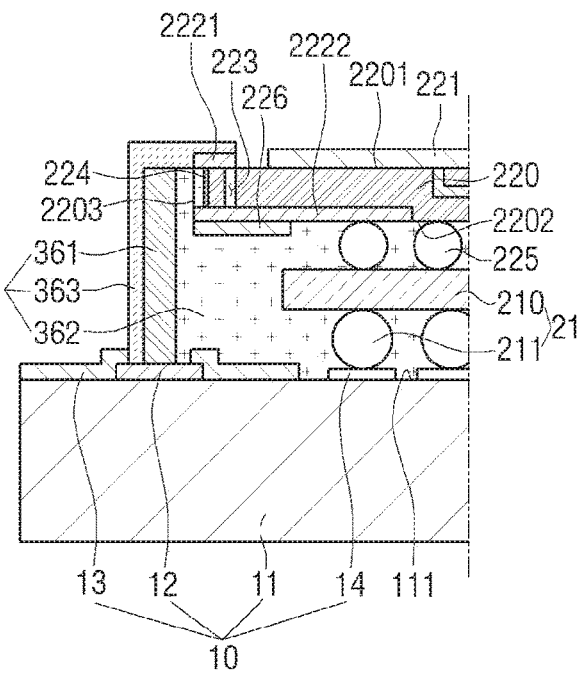

Thereafter, as illustrated in FIG. 27D, by coating the conductive material on the outside of the insulating dam 361, the shielding film 363 is formed.

The shielding film (or shielding cover) 363 can be formed by spraying the shielding material in a spray type.

In the process of forming the shielding film 363, it is desirable that the width of the insulating dam 361 is configured to be smaller than the width of the ground pad 12 so that the shielding film 363 can be connected to the ground pad 12.

Figure 28:
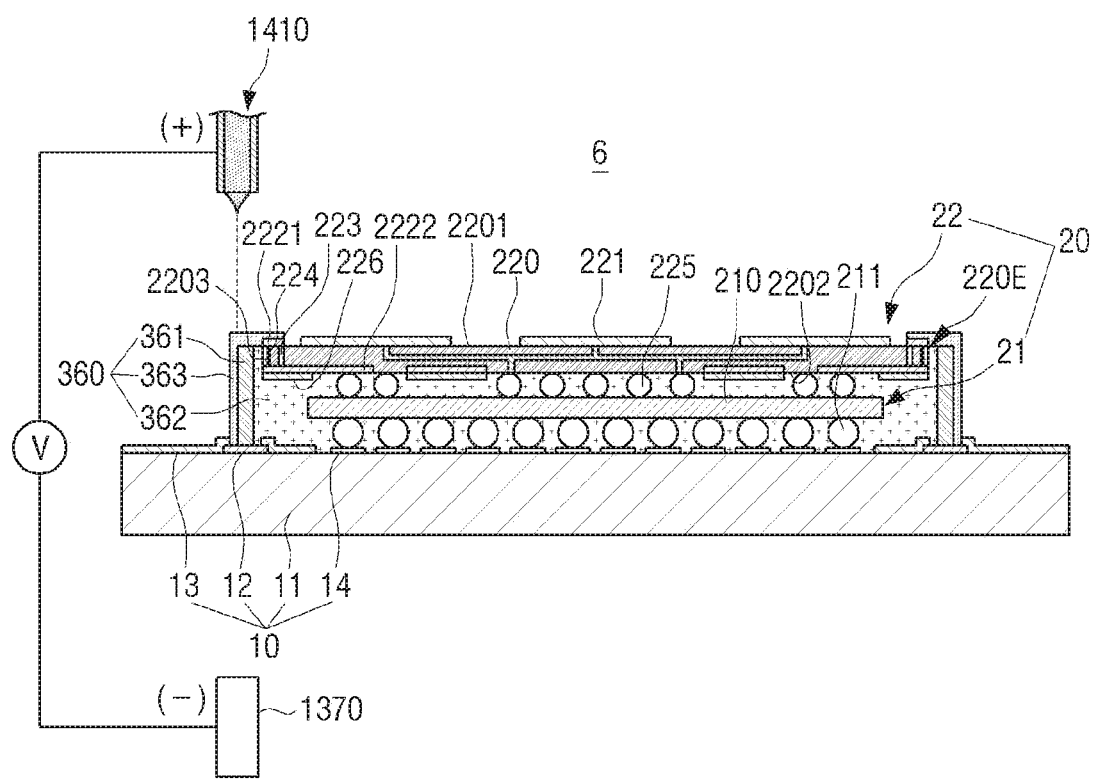
FIGS. 28 and 29 are views to respectively illustrate examples of forming a shielding film using the cone-jet mode and tilting-jet mode along the side of the insulating dam according to various embodiments of the disclosure.
Figure 29:
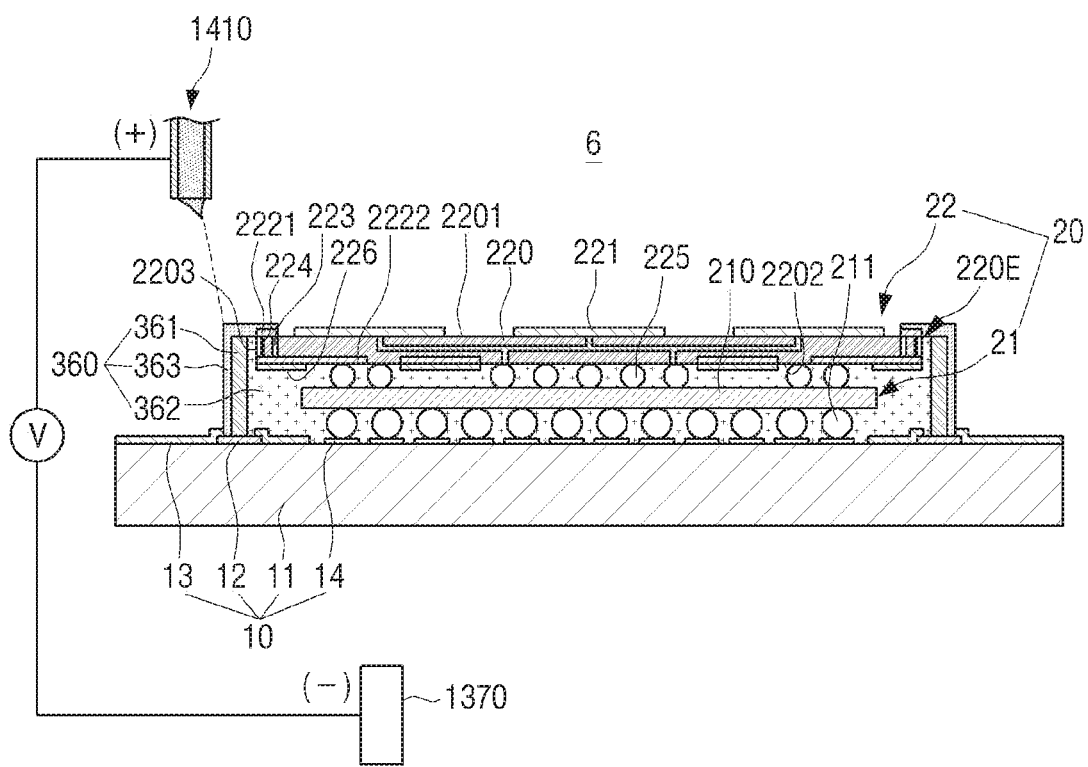

FIGS. 28 and 29 are views to respectively illustrate examples of forming a shielding film using the cone-jet mode and tilting-jet mode along the side of the insulating dam.

Referring to FIG. 28, the shielding film 363 may be formed of a shielding material made of a conductive material dispensed from a nozzle 1410 provided to an electrohydrodynamic (EHD) inkjet printing apparatus. The EHD inkjet printing apparatus applies a voltage to the nozzle 1410 and a pin-type electrode 1370 so that a shielding material having electrical conductivity is dispensed from the nozzle 1410 toward the printed circuit board 10 by a potential difference. In this case, a (+) pole is applied to the nozzle 1410 and a (−) pole is applied to the pin-type electrode 1370 located on the lower side of the printed circuit board 10.

In a cone-jet mode, the nozzle 1410 and the pin-type electrode 1370 are located on the same axis, and a droplet dispensed from the nozzle 1410 falls down in a direction substantially perpendicular to the upper surface of the insulating dam 361, and covers the upper surface of the insulating dam 361. When coating the side surface of the insulating dam 361 in the cone-jet mode, the droplet dispensed from the nozzle 1410 is positioned to fall on the edge of the insulating dam 361. The droplet dropped on the edge of the insulating dam 361 flows down along the side surface of the insulating dam 361 due to gravity and covers the side surface of the insulating dam 361. In this case, it is preferable to adjust the dispense amount of the shielding material so that the shielding material flowing along the side surface of the insulating dam 361 does not deviate from the ground pad 12.

Referring to FIG. 29, it is of course possible to form the shielding film 363 in a tilting jet mode. In the tilting-jet mode, the nozzle 1410 and the pin-type electrode 1370 are not arranged on the same axis so that the droplet dispensed from the nozzle 1410 falls toward the insulating dam 361 in a direction not perpendicular to the nozzle. More specifically, the nozzle 1410 is disposed at a position spaced apart from the upper side of the insulating dam 351 by a predetermined distance from the side surface of the insulating dam 361, and the pin-type electrode 1370 is disposed inside the side surface of the insulating dam 361 and is disposed at a position spaced apart by a predetermined distance. When a voltage is applied in such a state that the nozzle 1410 and the pin type electrode 1370 are positioned on different axes, the droplet dispensed from the nozzle 1410 is dispensed toward the side of the insulating dam 361, and can be applied to the side surface of the insulating dam 361.

In addition, the pin-type electrode 1370 has various shapes and positions and can adjust a dispense direction of the droplet from the nozzle 1410.

Figure 30:
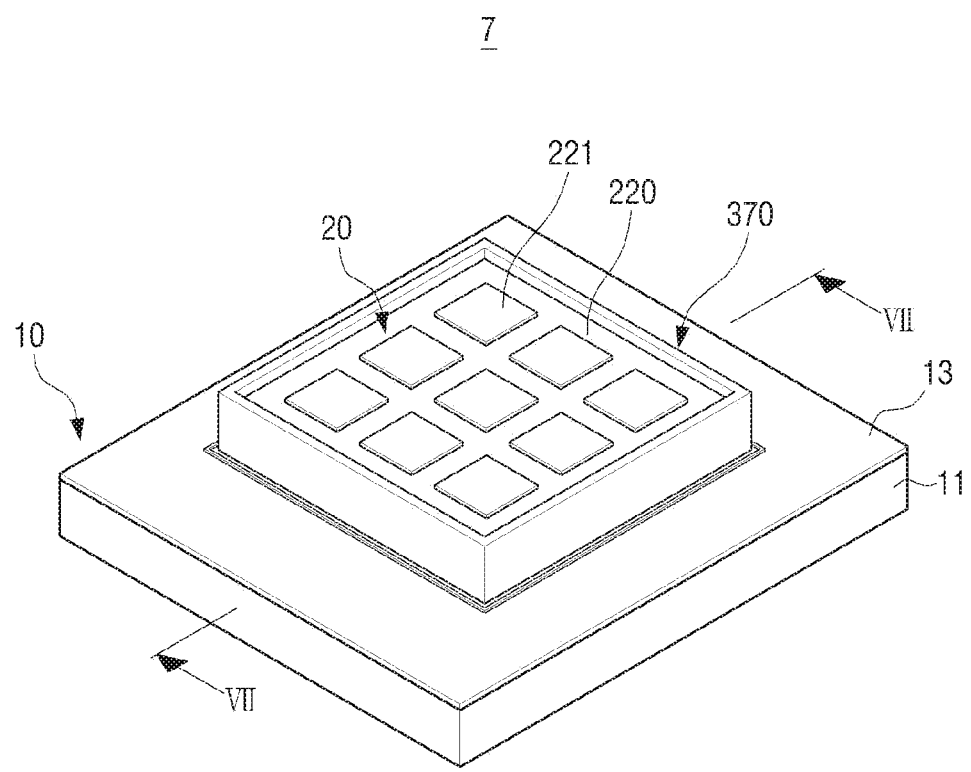
FIG. 30 is a perspective view illustrating the electromagnetic wave shielding structure of the electronic device according to an embodiment of the disclosure.

FIG. 30 is a perspective view illustrating the electromagnetic wave shielding structure 370 of the electronic device 7 according to an embodiment of the disclosure.

Figure 31:
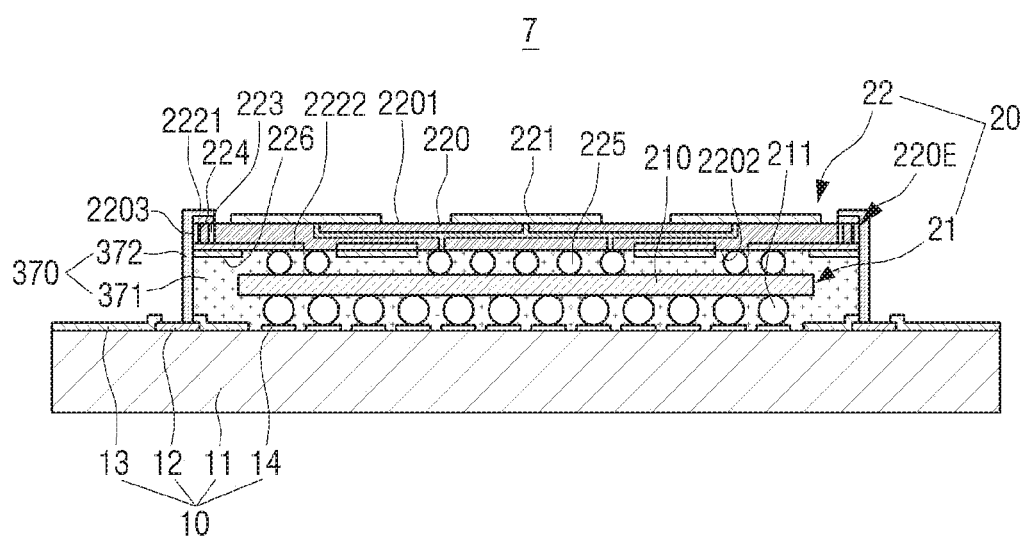
FIG. 31 is a sectional view of an electronic device which is cut along VII-VII line as illustrated in FIG. 30 according to an embodiment of the disclosure.

FIG. 31 is a sectional view of an electronic device 7 which is cut along VII-VII line as illustrated in FIG. 30 according to an embodiment of the disclosure.

FIGS. 32A, 32B, 32C, and 32D are sectional views illustrating a manufacturing process of the electromagnetic wave shielding structure 370 of FIG. 31 according to various embodiments of the disclosure.

The electronic device 7 according to another embodiment of the disclosure is similar in most respects to the electronic device 6 shown in FIGS. 25 to 27D, except that the electromagnetic wave shielding structure 370 has an insulating member and a shielding film 372. In this sense, there is a difference from the electromagnetic wave shielding structure 360 having the insulating dam 361, the insulating member 362 and the shielding film 363.

Hereinafter, the electromagnetic wave shielding structure 370 will be mainly described.

The electronic device 7 includes the printed circuit board 10, the antenna module 20 which is mounted on the printed circuit board 10, and the electromagnetic shielding structure which surrounds the side of the antenna module 20.

The electromagnetic wave shielding structure 370 includes an insulation member 371 which is composed of an insulating material filled between the printed circuit board 10 and the antenna substrate 220 and a shielding film 372 composed of a conductive material which covers the outside of the insulating member 371 and connects the first ground pattern 2221 and the ground pad 12.

The insulating member 371 can be injection-molded between the printed circuit board 10 and the antenna substrate 220, and can be injection-molded through a mold (M). The method of forming the insulating member 371 will be described later.

The insulating member 371 can be made as the same material as the insulating member constituting the insulating member 362 of FIGS. 25 to 27D.

The insulating member 371 can be formed by injecting the insulating member to the mold (M) disposed on the printed circuit board 10.

So that the insulating member 371 fills the space between the printed circuit board 10 and the antenna substrate 220, it is desirable that viscosity of the insulating material of the insulating member 371 is 100 cps to 30,000 cps.

The insulating material constituting the insulating member 371 may be a thixotropic material having fluidity or a phase change (thermoplastic, thermosetting) material.

The insulating member 371 fills the space between the printed circuit board 10 and the antenna substrate 220 and surrounds the radio frequency integrated circuit 21, and may insulate the surroundings of the radio frequency integrated circuit 21.

Figure 32A:
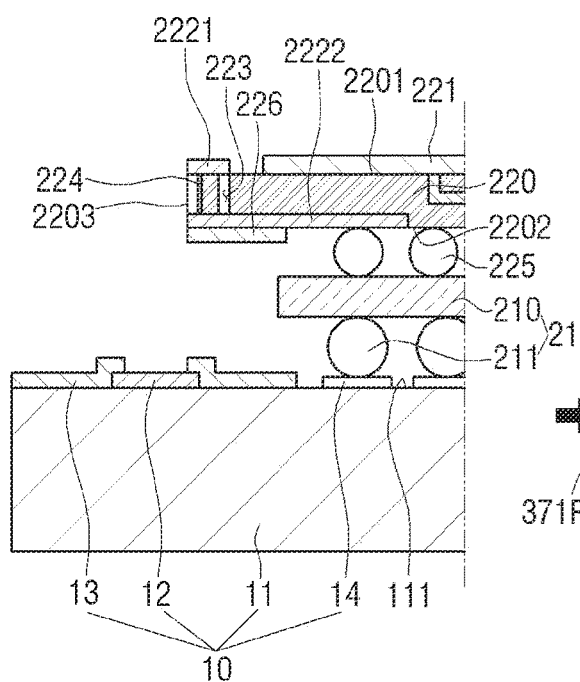
FIGS. 32A, 32B, 32C, and 32D are sectional views illustrating a manufacturing process of the electromagnetic wave shielding structure of FIG. 31 according to various embodiments of the disclosure.
Figure 32B:
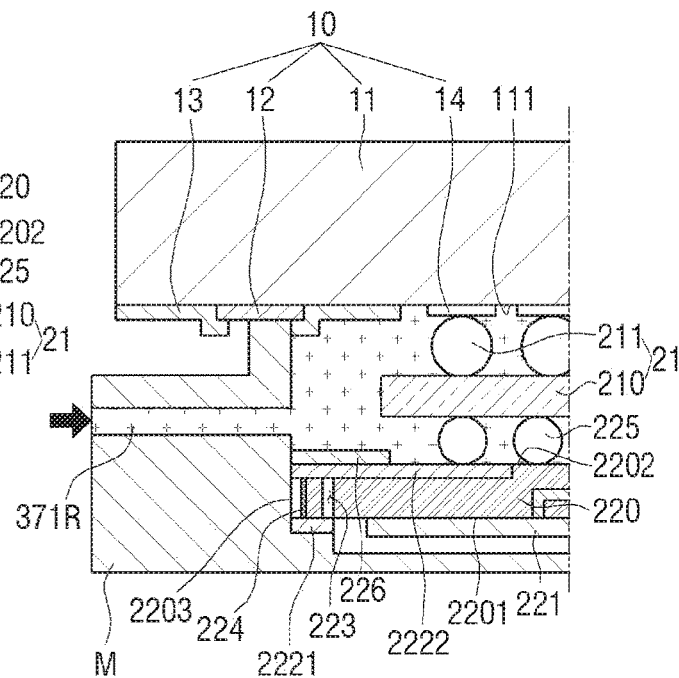
Figure 32C:
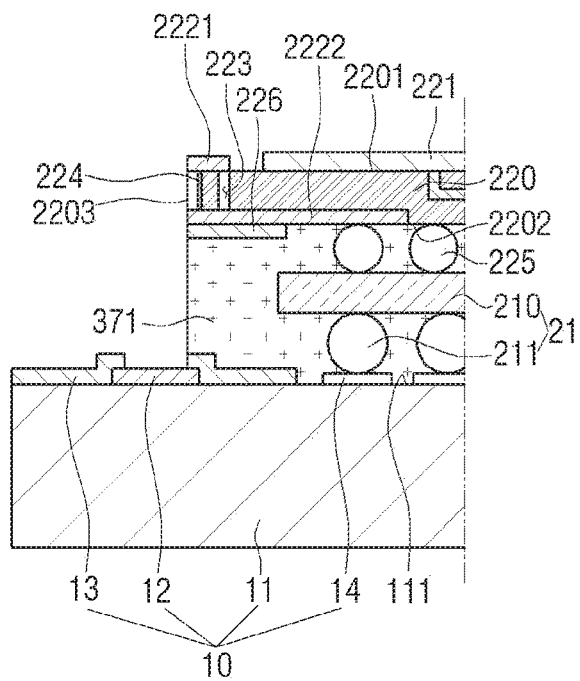

As illustrated in FIG. 32C, the side surface of the insulating member 371 is located on the same plane as the side surface 2203 of the antenna substrate 220, so that the side surface of the insulating member 371 and the side surface 2203 of the antenna substrate 220 can be connected without a step.

The shielding film 372 may cover the outside of the insulating member 371 and connect the first ground pattern 2221 and the ground pad 12.

To be specific, the upper end of the shielding film 372 covers the side surface 2203 of the printed circuit board 10 and the first ground pattern 2221, and the lower end of the shielding film 372 is in contact with the upper surface of the ground pad 12.

Through this, the shielding film 372 can electrically connect the first ground pattern 2221 and the ground pad 12 and shield the side surface portion of the antenna module 20 to shield the radio frequency integrated circuit 21.

The shielding film 372 covers the outside of the insulating member 371, the side surface 2203 of the antenna substrate 220 and the first ground pattern 2221, as the shielding material is sprayed in a spray status by the nozzle 1410 (see FIGS. 28 and 29) of a separate material spraying apparatus.

The shielding film 372 may be made of the same material as the shielding film 363 shown in FIGS. 25 to 27D, and the electrically conductive material constituting the shielding film 372 may include an electrically conductive filler and a binder resin.

Referring to FIGS. 32A through 32D, the manufacturing process of the electromagnetic wave shielding structure 370 will be sequentially described.

Referring to FIG. 32A, the antenna module 20 is coupled to the printed circuit board 10.

Referring to FIG. 32B, the mold (M) is disposed on the printed circuit board 10 to which the antenna module 20 is coupled.

The mold M may be detachably coupled to the printed circuit board 10 to enclose the antenna module 20, and as illustrated in FIG. 32B, in a state that the printed circuit board 10 to which the mold (M) is coupled is turned upside down, the insulating member 371R can be injected to the mold (M).

The inside of the mold M is formed as a space corresponding to the shape of the insulating member 371 and the insulating member (or insulating material) 371 is formed by injecting a fluid insulating material 371R into the inside of the mold (M).

When the molding of the insulating member 371 is completed by hardening the insulating material 371R after inserting the insulating material 371R into the mold (M), the mold (M) is removed as shown in FIG. 32C.

Through this, the insulating member 371 can cover the radio frequency integrated circuit 21 by filling the space between the printed circuit board 10 and the antenna substrate 220 to cover the radio frequency integrated circuit 21 and can insulate the surroundings of the radio frequency integrated circuit 21.

The insulating member 371 is injection-molded through the mold (M), and shapes of the insulating member 371 can be changed diversely.

Figure 32D:
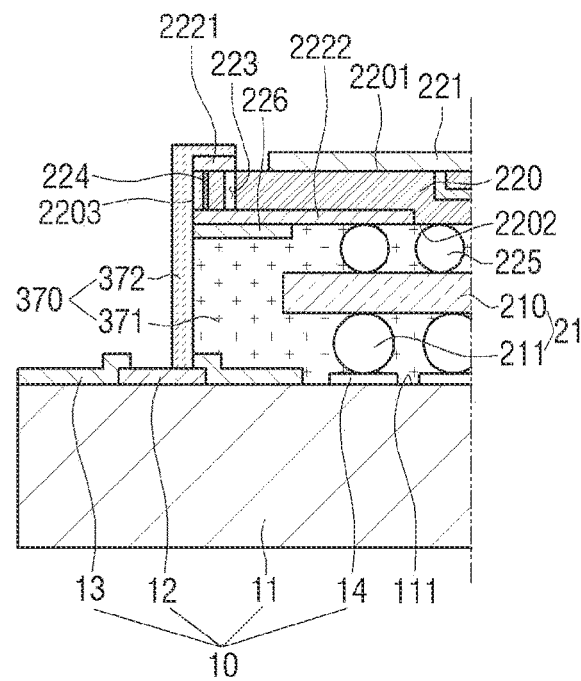

Referring to FIG. 32D, by coating the conductive material to cover the outside of the insulating member 371, the side surface 2203 of the antenna substrate 220, and the first ground pattern 2221, the shielding film 372 is formed.

The shielding film 372 which covers the outer surface of the insulating member 371 can be grounded by being connected to the ground pad 12.

As described above, the shielding film 372 can be formed by spraying the shielding material in a spray form, and the shielding film 372 can be formed in a similar manner as the cone-jet mode and the tilting-jet mode shown in FIGS. 28 and 29.

Figure 33:
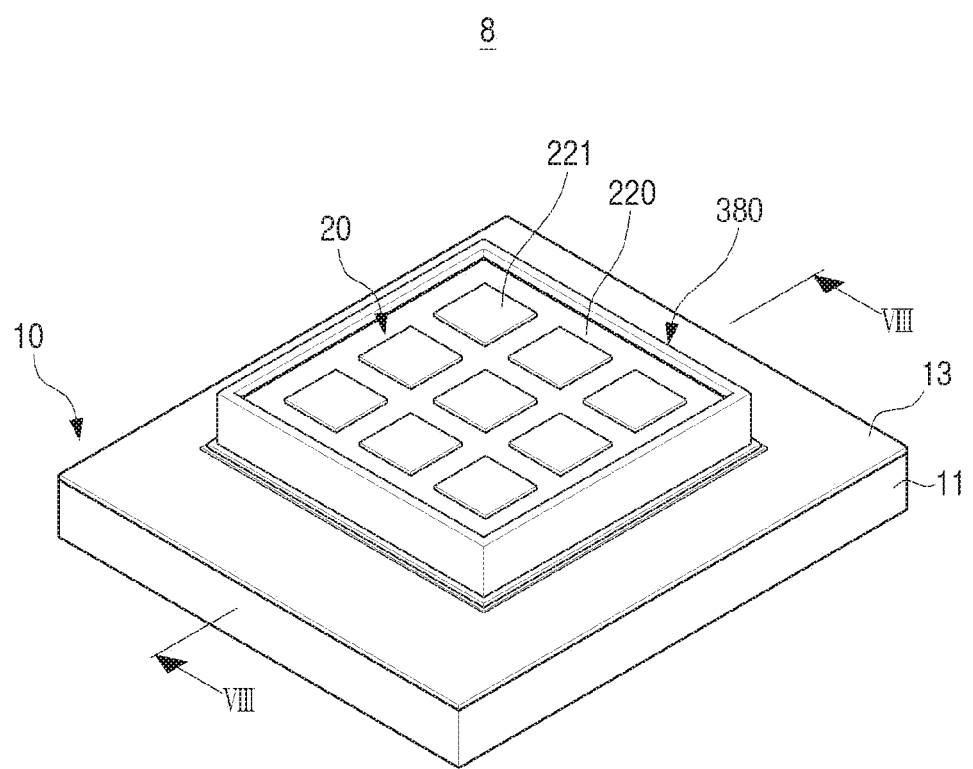
FIG. 33 is a perspective view illustrating the electromagnetic wave shielding structure of the electronic device according to an embodiment of the disclosure.

FIG. 33 is a perspective view illustrating the electromagnetic wave shielding structure 380 of the electronic device 8 according to an embodiment of the disclosure.

Figure 34:
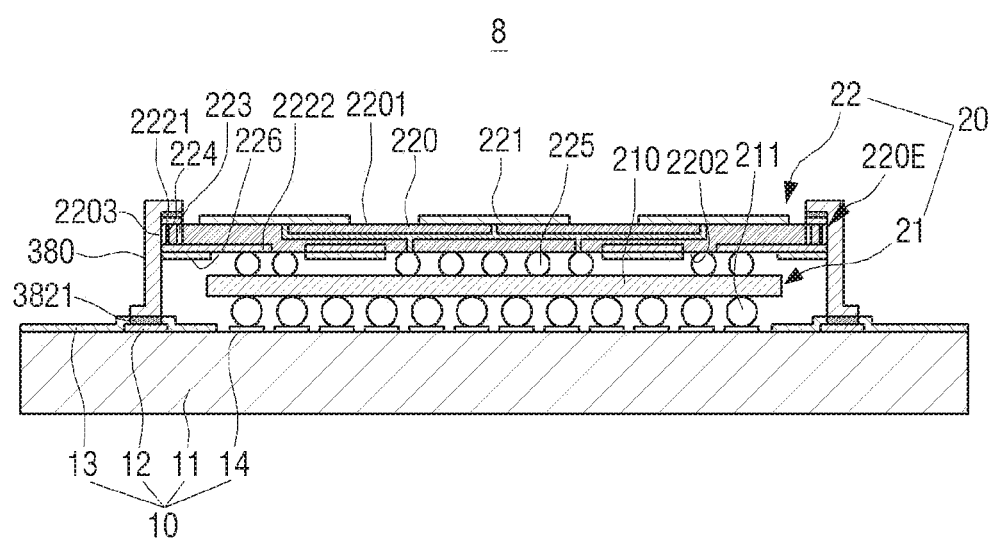
FIG. 34 is a sectional view of an electronic device which is cut along VIII-VIII line as illustrated in FIG. 33 according to an embodiment of the disclosure.

FIG. 34 is a sectional view of an electronic device 8 which is cut along VIII-VIII line as illustrated in FIG. 33 according to an embodiment of the disclosure.

Figure 35A:
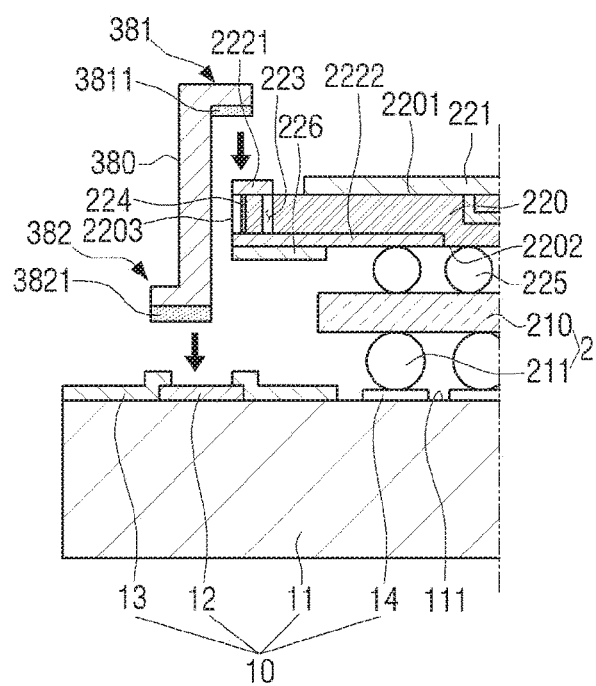
FIGS. 35A and 35B are sectional views illustrating a manufacturing process of the electromagnetic wave shielding structure of FIG. 34 according to an embodiment of the disclosure.
Figure 35B:
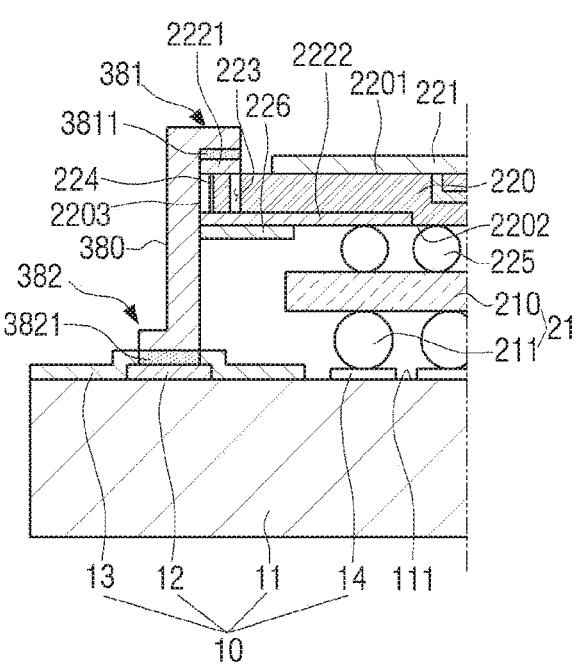

FIGS. 35A and 35B are sectional views illustrating a manufacturing process of the electromagnetic wave shielding structure 380 of FIG. 34 according to an embodiment of the disclosure.

Hereinafter, with reference to FIGS. 33 to 35B, the electromagnetic wave shielding structure 380 according to still another embodiment will be described.

An electronic apparatus 8 according to still another embodiment of the disclosure is substantially the same as the electronic apparatus 1 according to the embodiment of the disclosure shown in FIGS. 1 through 4D, and an electromagnetic wave shielding structure 380 different from the electronic device 1 according to the embodiment of the disclosure will be described below.

The printed circuit board 10 and the antenna module 20 illustrated in FIGS. 33 to 35B may be the same as the printed circuit board 10 and the antenna module 20 as illustrated in FIGS. 1 to 4D.

The electromagnetic wave shielding structure 380 includes a conductive film (380) which surrounds a side portion of the antenna module 20.

Since the electromagnetic wave shielding structure 380 according to still another embodiment of the disclosure is composed of a single conductive film 380, the electromagnetic wave shielding structure 380 can be referred to as the conductive film 380.

The conductive film 380 may be made of an electrically conductive material, and may be formed of an electrically conductive filler and a binder resin. In addition, the conductive film 380 may be made of the same material as the shielding films 363 and 372 described above.

The conductive film 380 may surround the side surface (or surface portion) 2203 of the antenna substrate 220.

The conductive film 380 may be in the shape of a wall coupled to the printed circuit board 10 and surrounding the side surface of the antenna module 20 and the conductive film 380 may be in contact with the side surface 2203 of the antenna substrate 220.

An upper end 381 of the conductive film 380 may cover the first ground pattern 2221 and a lower end 382 of the conductive film 380 may be coupled to the ground pad 12.

Specifically, the upper end 381 of the conductive film 380 may be bent and attached to the upper surface of the first ground pattern 2221.

The conductive adhesive layer 3811 may be coupled to the lower surface of the upper end 381 of the conductive film 380 and the upper end 381 of the conductive film 380 may be attached to the upper surface of the first ground pattern 2221 through the conductive adhesive layer 3811.

The lower end 382 of the conductive film 380 may be bent and attached to the ground pad 12.

A conductive adhesive layer 3821 may be coupled to a lower surface of the lower end 382 of the conductive film 380 and the lower end 382 of the conductive film 380 may be connected to the upper surface of the ground pad 12 through the conductive adhesive layer 3821.

Through this, the conductive film 380 may shield the radio frequency integrated circuit 21 disposed between the antenna substrate 220 and the printed circuit board 10.

The upper end 381 and the lower end 382 of the conductive film 380 are bent so that the contact area with the first ground pattern 2221 and the ground pad 12 can be increased.

The conductive film 380 may be changed to various shapes by connecting the first ground pattern 2221 and the ground pad 12 in addition to the above structure so as to cover the antenna substrate 220 and the printed circuit board 10.

Referring to FIGS. 35A and 35B, the electromagnetic wave shielding structure 380 according to still another embodiment of the disclosure may shield the antenna substrate 220 and the printed circuit board 10 with a simple process to attach the conductive film 380 to the printed circuit board 10 to which the antenna module 20 is coupled.

Through the conductive adhesive layers 3811 and 3821 which are respectively coupled to the bent upper end 381 and the bent lower end 382 of the conductive film 380, there is an advantage that the upper end 381 and the lower end 382 of the conductive film 380 can be easily attached to the first ground pattern 2221 and the ground pad 12.

Figure 36:
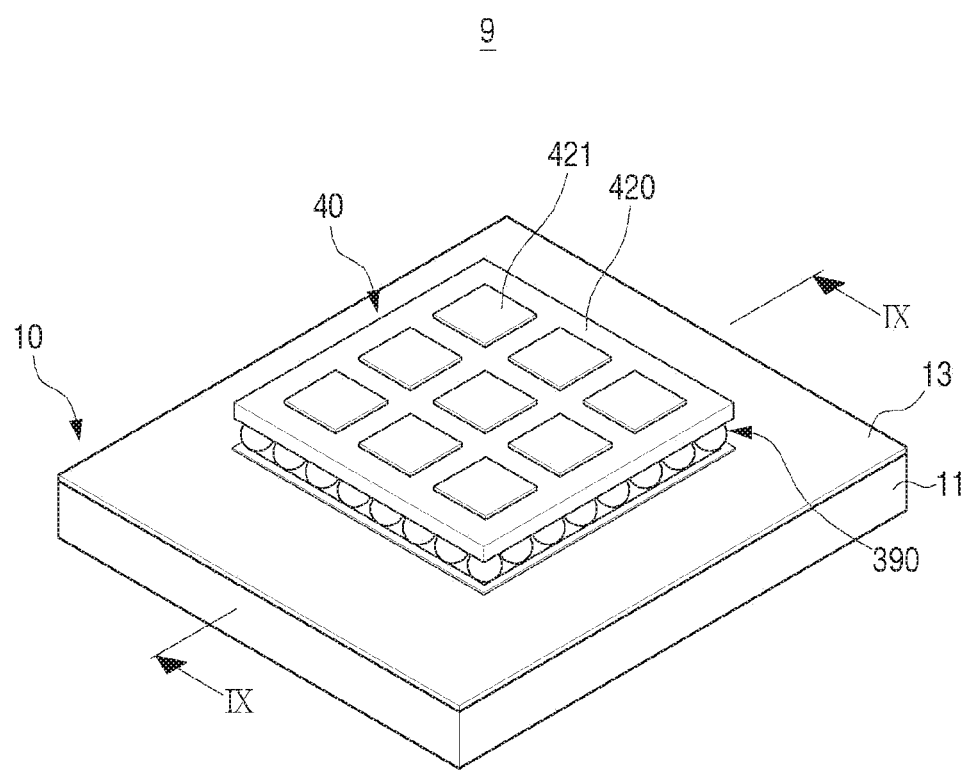
FIG. 36 is a perspective view illustrating the electromagnetic wave shielding structure of the electronic device according to an embodiment of the disclosure.

FIG. 36 is a perspective view illustrating the electromagnetic wave shielding structure 390 of the electronic device 9 according to an embodiment of the disclosure.

Figure 37:
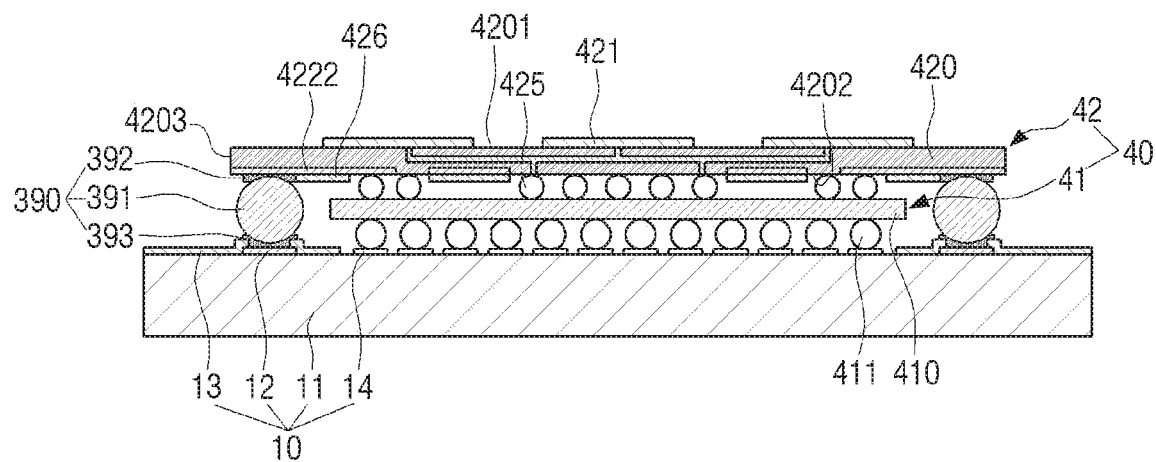
FIG. 37 is a sectional view of an electronic device which is cut along IX-IX line as illustrated in FIG. 36 according to an embodiment of the disclosure.

FIG. 37 is a sectional view of an electronic device 9 which is cut along IX-IX line as illustrated in FIG. 36 according to an embodiment of the disclosure.

FIGS. 38A and 38B are sectional views illustrating a manufacturing process of the electromagnetic wave shielding structure 390 of FIG. 37 according to an embodiment of the disclosure.

Hereinafter, with reference to FIGS. 36 to 38B, the electromagnetic wave shielding structure 390 according to still another embodiment will be described.

The electronic device 9 includes the printed circuit board 10, an antenna module 40 mounted on the printed circuit board 10, and an electromagnetic wave shielding structure 390 for shielding the side portions of the antenna module 40.

On one side of the printed circuit board 10, the antenna module 40 is mounted, and as illustrated in FIGS. 36 and 37, the antenna module 40 may be mounted on the upper surface of the printed circuit board 10.

The antenna module 40 includes the radio frequency integrated circuit 41 and the array antenna 42.

The structures of the radio frequency integrated circuit 41 and the array antenna 42 are similar to those of the radio frequency integrated circuit 21 and the array antenna 22 shown in FIGS. 1 to 4D, and duplicate description will be omitted.

The radio frequency integrated circuit 41 includes a radio frequency integrated circuit board 410 and the radio frequency integrated circuit board 410 can be coupled to the printed circuit board 10 through a plurality of solder balls 411.

The antenna module 40 can be coupled to the printed circuit board 10 by soldering the plurality of solder balls 411 coupled to the lower portion to the plurality of first solder creams 14 disposed on an upper surface of the printed circuit board 10.

The array antenna 42 includes an antenna substrate 420 and a plurality of radiators 421.

The plurality of radiators 421 are disposed on an upper surface 4201 of the antenna substrate 420, and the plurality of radiators 421 are disposed on the upper surface 4201 of the antenna substrate 420.

The antenna substrate 420 can be coupled to an upper portion of the radio frequency integrated circuit board 410 as the plurality of bumps 425 disposed at a lower part are coupled to an upper surface of the radio frequency integrated circuit board 410.

Through this, a distance between the antenna substrate 420 and the radio frequency integrated circuit board 410 can be minimized.

The array antenna 42 includes a ground pattern 4222 which is disposed on a lower portion 4202 of the antenna substrate 420 along the circumference of the antenna substrate 420.

The ground pattern 4222 can be the same as the second ground pattern 2222 as illustrated in FIG. 2.

The ground pattern 4222 may be in the form of a closed loop covering the lower surface 4202 of the antenna substrate 420 along the edge portion of the antenna substrate 420. The ground pattern 4222 may be disposed along the outermost side of the lower surface 4202 of the antenna substrate 420 and may have a rectangular ring shape corresponding to the shape of the antenna substrate 420.

The ground pattern 4222 can be made of conductive metal.

In the lower surface 4202 of the antenna substrate 420, a mask 426 covering a part of the ground pattern 4222 can be disposed.

The printed circuit board 10 includes a main body 11 of the printed circuit board, a ground pad 12 disposed on the upper surface in which the radio frequency integrated circuit is mounted, a mask 13 which is disposed on the upper surface 111 of the main body 11 and covers the boundary of the ground pad 12, and a plurality of first solder creams 14 corresponding to the plurality of solder balls 211 coupled to a lower portion of the radio frequency integrated circuit board 210.

The printed circuit board 10 is the same as the printed circuit board 10 illustrated in FIGS. 1 to 4D and thus overlapped description will be omitted.

The electromagnetic wave shielding structure 390 includes a shielding dam (390) for connecting the array antenna 42 and the printed circuit board 10 so as to surround the radio frequency integrated circuit 41.

The electromagnetic wave shielding structure 390 can be referred to as a shielding dam 390.

The shielding dam 390 is disposed between the antenna substrate 420 and the printed circuit board 10 to surround the radio frequency integrated circuit 41.

In addition, the shielding dam 390 is disposed on the lower surface 4202 of the antenna substrate 420 along the circumference of the antenna substrate 420 and is connected to the ground pattern 4222.

The shielding dam 390 can shield the radio frequency integrated circuit 41 disposed inside the shielding dam 390 by connecting the ground pattern 4222 and the ground pad 12.

Referring to FIGS. 37 to 38B, the shielding dam 390 includes a plurality of shielding balls 391 and a first and second connection parts 392 and 393 for respectively connecting the plurality of shielding balls 391 to the ground pattern 4222 and the ground pad 12.

The plurality of shielding balls 391 may be arranged along the ground pattern 4222 under the antenna substrate 420 and may be coupled to the ground pattern 4222 through the first connection part 392.

The plurality of shielding balls 391 can be made of a plurality of solder balls.

The first connection part may be solder cream applied to the ground pattern 4222.

A mask 426 can prevent the solder cream applied over the ground pattern 4222 from being deviated from a position where the solder cream is applied.

As illustrated in FIGS. 38A and 38B, the upper portion of the plurality of shielding ball 391 can be coupled to the first connection part 392 through soldering.

In addition, the second connection part 393 can be solder cream applied to the ground pad 12.

Therefore, the lower portion of the plurality of shielding balls 391 can be coupled to the second connection part 393 through soldering.

The plurality of shielding balls 391 can be disposed between the ground pattern 4222 and the ground pad 12, and can be respectively coupled to the ground pattern 4222 and the ground pad 12. It is possible to shield between the antenna substrate 420 and the printed circuit board 10.

The radio frequency integrated circuit 41 disposed between the antenna substrate 420 and the printed circuit board 10 can be shielded by being surrounded by the plurality of shielding balls 391.

The diameter of the plurality of shielding balls 391 preferably corresponds to the distance between the lower surface 4202 of the antenna substrate 420 and the printed circuit board 10.

However, the electromagnetic wave shielding structure 390 may include only a plurality of shielding balls 391 without the first and second connection parts 392 and 393, and the first and second connection parts 392 and 393 can be changed to various materials such as conductive adhesive, in addition to the solder cream.

Referring to FIG. 38A, while the plurality of shielding balls 391 are coupled to the first connection part 392, the antenna module 40 can be coupled to the printed circuit board 10.

Referring to FIG. 38B, in a state in which the antenna module 40 is seated on the printed circuit board 10, the plurality of shielding balls 391 and the second connection part 393 can be coupled through reflow.

The manufacturing process of the electromagnetic wave shielding structure 390 shown in FIGS. 38A and 38B are merely exemplary, and the plurality of shielding balls 391 can be soldered to both the first connection part 392 and the second connection part 393 at the same time. For example, the plurality of solder balls 411 of the radio frequency integrated circuit 41 may be seated on the first solder cream 14 of the printed circuit board 10 and the plurality of shielding balls 391 may be placed between the first connection part 392 and the second connection part 393, and then the plurality of solder balls 411 and the plurality of shielding balls 391 can be soldered at the same time through reflow.

The electronic devices 1 to 9 according to the various embodiments of the disclosure described above can reduce signal loss by placing the radio frequency integrated circuits 21 and 41 to be adjacent to a lower side of the array antennas 22 and 42, and by shielding the space between the antenna substrate 220 and 420, and the printed circuit board 10 through the electromagnetic wave shielding structure 310 to 390, the radio frequency integrated circuit 21 and 41 disposed between the antenna substrate 220 and 420, and the printed circuit board 10 can be shielded.

Therefore, it can be effectively prevented that an external electromagnetic wave is introduced into the radio frequency integrated circuits 21 and 41 or an electromagnetic wave of the radio frequency integrated circuits 21 and 41 is interfered with the array antennas 22 and 42 and other external components.

The various embodiments have been described individually, but it is not necessary that each embodiment is implemented as a sole embodiment, but configurations and operations of each embodiment can be implemented in combination with at least one other embodiments.

While the disclosure has been shown described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a printed circuit board;
an antenna module including:
a radio frequency integrated circuit mounted on the printed circuit board, and
an array antenna coupled to an upper portion of the radio frequency integrated circuit; and
an electromagnetic wave shielding structure surrounding a side portion of the antenna module and being in a closed loop shape so to cover a ground pattern of the antenna module.

2. The electronic device of claim 1, wherein the electromagnetic wave shielding structure is attached to the printed circuit board to surround a space between the array antenna and the printed circuit board, and covers an edge portion of the array antenna.

3. The electronic device of claim 2, wherein the array antenna comprises:
an antenna substrate coupled to an upper portion of the radio frequency integrated circuit;
a plurality of radiators disposed on an upper surface of the antenna substrate; and
a first ground pattern disposed on the upper surface of the antenna substrate along a circumference of the antenna substrate,
wherein an upper end of the electromagnetic wave shielding structure covers the first ground pattern.

4. The electronic device of claim 3,
wherein the printed circuit board comprises a ground pad disposed on a side of the printed circuit board,
wherein the radio frequency integrated circuit is mounted on the side of the printed circuit board, and
wherein a lower end of the electromagnetic wave shielding structure is attached to the ground pad.

5. The electronic device of claim 4,
wherein the first ground pattern comprises a closed loop shape in which the plurality of radiators is disposed therein,
wherein the ground pad comprises a closed loop shape in which the radio frequency integrated circuit is disposed therein, and
wherein the upper end and the lower end of the electromagnetic wave shielding structure comprise shapes respectively corresponding to a shape of the first ground pattern and a shape of the ground pad.

6. The electronic device of claim 5,
wherein the array antenna comprises a second ground pattern disposed at a lower surface of the antenna portion along a circumference of the antenna substrate,
wherein the antenna substrate comprises at least one of a plurality of via holes connecting the first ground pattern and the second ground pattern, or a plating part which is disposed at a side of the antenna substrate, and
wherein the antenna substrate connects the first ground pattern and the second ground pattern.

7. The electronic device of claim 6, wherein the electromagnetic wave shielding structure comprises:
a shield frame surrounding the side of the antenna substrate;
an adhesive portion coupled to the ground pad for grounding and to which a lower end of the shield frame is attached; and
a connection part connecting an upper end of the shield frame and the first ground pattern.

8. The electronic device of claim 7, wherein the connection part comprises a conductive material having a predetermined viscosity to cover the first ground pattern.

9. The electronic device of claim 8,
wherein the shield frame is remotely disposed from the side of the antenna substrate, and
wherein the connection part connects the shield frame and the plating part.

10. The electronic device of claim 7, wherein the adhesive portion comprises a conductive material having a predetermined viscosity or viscosity of solder cream.

11. The electronic device of claim 7, wherein the shield frame comprises a conductive metal.

12. The electronic device of claim 7,
wherein the shield frame comprises a conductive metal, and
wherein the connection part comprises a conductive tape which connects the shield frame and the first ground pattern.

13. The electronic device of claim 6,
wherein the electromagnetic wave shielding structure comprises:
a shielding dam disposed on the ground pad, the shielding dam surrounding the side of the antenna substrate, and
a connection part which connects an upper end of the shielding dam and the first ground pattern, and
wherein the shielding dam and the connection part comprise a conductive material having a predetermined viscosity.

14. The electronic device of claim 6,
wherein the electromagnetic wave shielding structure comprises a shielding dam disposed on the ground pad, the shielding dam surrounding the side of the antenna substrate, and
wherein the electromagnetic wave shielding structure covers the first ground pattern.

15. The electronic device of claim 6, wherein the electromagnetic wave shielding structure comprises:
an insulating dam disposed on the ground pad, the insulating dam surrounding the side of the antenna substrate;
an insulating member filled inside the insulating dam; and
a shielding film composed of a conductive material that covers an outside of the insulating dam, the shielding film connecting the first ground pattern with the ground pad.

16. The electronic device of claim 6,
wherein the electromagnetic wave shielding structure comprises:
an insulating member filled between the printed circuit board and the antenna substrate, and
a shielding film composed of a conductive material that covers an outside of the insulating member and connects the first ground pattern with the ground pad, and
wherein the insulating member is injection-molded.

17. The electronic device of claim 6,
wherein the electromagnetic wave shielding structure comprises a conductive film which surrounds the side of the antenna substrate,
wherein an upper end of the conductive film is bent and attached to the first ground pattern, and
wherein a lower end of the conductive film is bent and attached to the ground pad.

18. The electronic device of claim 1, wherein the electromagnetic wave shielding structure comprises a shielding dam which connects the array antenna and the printed circuit board to surround the radio frequency integrated circuit.

19. The electronic device of claim 18,
wherein the array antenna comprises:
an antenna substrate coupled to an upper portion of the radio frequency integrated circuit,
a plurality of radiators disposed on an upper surface of the antenna substrate, and
a ground pattern disposed on a lower surface of the antenna substrate along an edge portion of the antenna substrate,
wherein the printed circuit board comprises a ground pad disposed on a side of the printed circuit board,
wherein the radio frequency integrated circuit is mounted on the side of the printed circuit board, and
wherein the shielding dam comprises a plurality of shielding balls that connect the ground pattern with the ground pad.

20. An electronic device comprising:
a printed circuit board;
an antenna module including:
a radio frequency integrated circuit mounted on the printed circuit board, and
an array antenna coupled to the radio frequency integrated circuit; and
an electromagnetic wave shielding structure attached to the printed circuit board, the electromagnetic wave shielding structure surrounding an edge portion of the array antenna,
wherein the array antenna comprises:
an antenna substrate coupled to an upper portion of the radio frequency integrated circuit,
a plurality of radiators disposed on an upper surface of the antenna substrate, and
a first ground pattern and a second ground pattern disposed on each of an upper surface and a lower surface of the antenna substrate along a circumference of the antenna substrate, and
wherein the antenna substrate comprises at least one of:
a plurality of via holes that connect the first ground pattern and the second ground pattern, or
a plating part disposed on a side of the antenna substrate, the plating part connecting the first ground pattern with the second ground pattern.

* * * * *